(12) United States Patent
Asai et al.

(10) Patent No.: US 6,807,725 B2
(45) Date of Patent: Oct. 26, 2004

(54) SYSTEM FOR MOUNTING OF ELECTRIC COMPONENTS

(75) Inventors: Koichi Asai, Nagoya (JP); Shinsuke Suhara, Kariya (JP)

(73) Assignee: Fuji Machine Mfg. Co., Ltd., Chiryu (JP)

( * ) Notice: Subject to any disclaimer, the term of this patent is extended or adjusted under 35 U.S.C. 154(b) by 0 days.

(21) Appl. No.: 09/971,682

(22) Filed: Oct. 9, 2001

(65) Prior Publication Data

US 2002/0014003 A1 Feb. 7, 2002

Related U.S. Application Data

(62) Division of application No. 09/311,303, filed on May 14, 1999, now Pat. No. 6,317,972.

(30) Foreign Application Priority Data

May 19, 1998 (JP) .......................................... 10-136962

(51) Int. Cl.[7] .............................................. H05K 3/30
(52) U.S. Cl. ............................ 29/740; 29/739; 29/720; 29/832; 29/834
(58) Field of Search ......................... 29/740, 739, 741, 29/720, 832, 834

(56) References Cited

U.S. PATENT DOCUMENTS

| | | | |
|---|---|---|---|
| 4,677,473 A | * | 6/1987 | Okamoto et al. ........... 348/126 |
| 4,734,745 A | | 3/1988 | Ohta ............................ 355/45 |
| 4,912,843 A | | 4/1990 | Dederer ........................ 29/846 |
| 4,941,256 A | | 7/1990 | Capson et al. |
| 4,978,224 A | | 12/1990 | Kishimoto et al. |
| 4,980,971 A | * | 1/1991 | Bartschat et al. ............. 29/833 |
| 5,064,283 A | | 11/1991 | Tober ........................... 356/73 |
| 5,471,407 A | | 11/1995 | Akasaka et al. ............ 364/559 |
| 5,754,677 A | | 5/1998 | Kawada ....................... 382/141 |
| 5,878,484 A | | 3/1999 | Araya et al. |
| 5,894,659 A | | 4/1999 | Kwok et al. .................. 29/827 |
| 6,018,865 A | * | 2/2000 | Michael ........................ 29/740 |

FOREIGN PATENT DOCUMENTS

| | | |
|---|---|---|
| JP | A-62-298750 | 12/1987 |
| JP | A-7-183697 | 7/1995 |

* cited by examiner

*Primary Examiner*—Richard Chang
(74) *Attorney, Agent, or Firm*—Oliff & Berridge, PLC

(57) ABSTRACT

A system of mounting a plurality of electric components on a circuit substrate and thereby producing an electric circuit including a system for performing the following steps of taking, immediately before each of the electric components is mounted on the circuit substrate, a first image of a first portion of the circuit substrate on which the each electric component is to be mounted and a second portion of the circuit substrate that is adjacent to the first portion, mounting the each electric component on the circuit substrate, taking, immediately after the each electric component is mounted on the circuit substrate, a second image of the mounted electric component, and inspecting, by comparing the first and second images with each other, a state in which the each electric component is mounted on the circuit substrate.

9 Claims, 26 Drawing Sheets

0°~150°

150°~240°
IMAGE TAKING
ANGLE: 160°

240°~280°

280°~360°
IMAGE TAKING
ANGLE: 350°

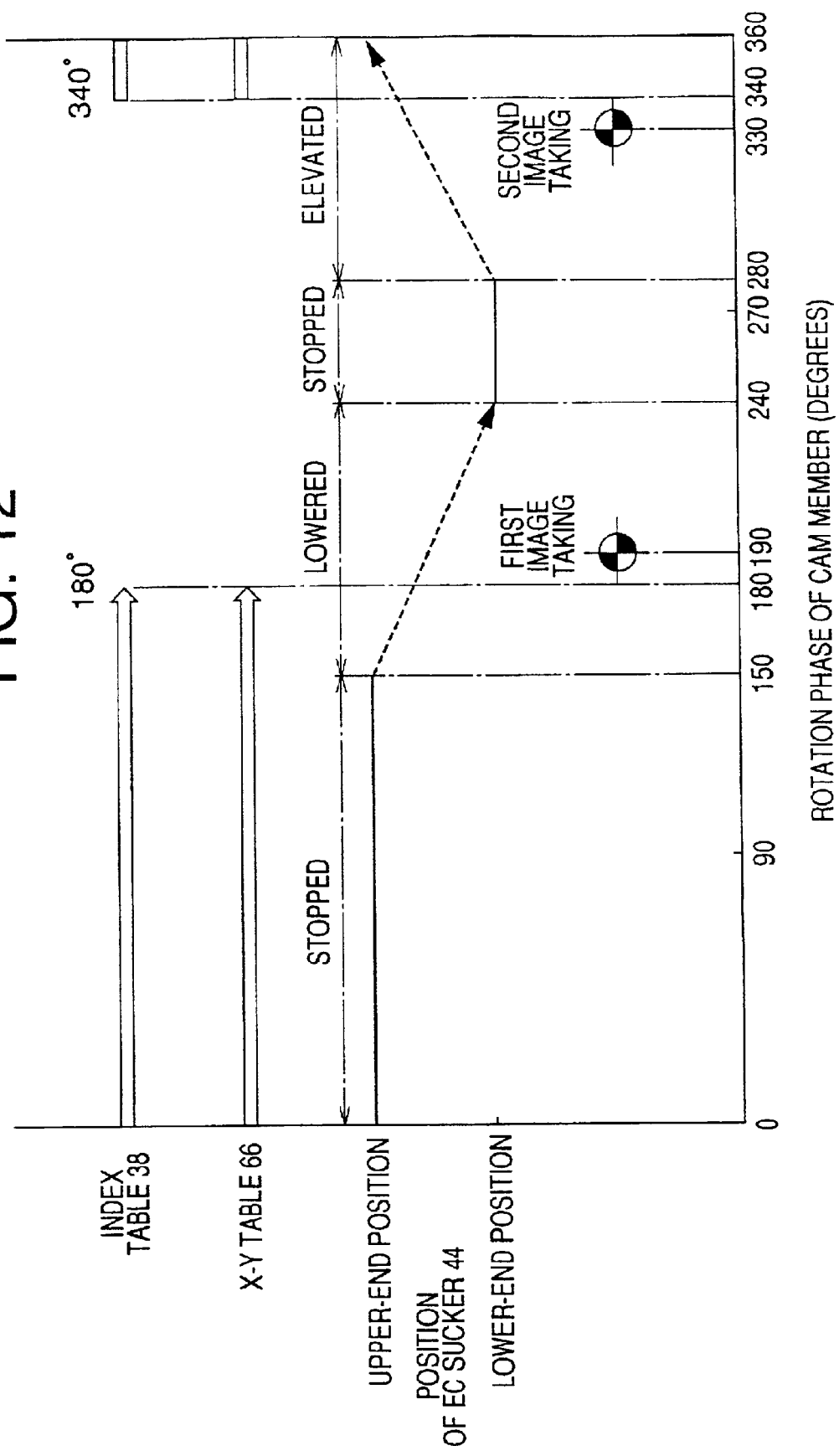

SYSTEM FOR MOUNTING OF ELECTRIC COMPONENTS

This is a division of application Ser. No. 09/311,303 filed May 14, 1999 now U.S. Pat. No. 6,317,972.

BACKGROUND OF THE INVENTION

1. Field of the Invention

The present invention relates to a method and a system for mounting electric components on a circuit substrate, and particularly to the improvements of the art of inspecting the state in which each electric component is mounted on the circuit substrate.

2. Related Art Statement

It has been practiced to inspect, when a plurality of electric components ("ECs") are mounted on a circuit substrate for producing an electric circuit, the state in which the ECs are mounted on the circuit substrate, for example, judge whether the ECs have been safely mounted on the circuit substrate, or whether the ECs have been mounted at appropriate positions or with appropriate attitudes on the circuit substrate.

ECs of a type which have no lead wires are temporarily attached to a circuit substrate with an adhesive or a solder paste, and then are finally fixed to the circuit substrate by hardening the adhesive or melting the solder paste. An EC mounting device mounts each EC on the adhesive or the solder paste applied in advance to each EC-mount portion of the circuit substrate. After all ECs are mounted on the circuit substrate, those ECs are finally fixed to the circuit substrate. An inspection is performed after the ECs are temporarily attached to the circuit substrate and/or after the ECs are finally fixed to the circuit substrate.

ECs of a type which have lead wires are temporarily attached to a circuit substrate by first inserting the lead wires through the holes formed in the circuit substrate and subsequently folding the lead wires onto the back surface of the circuit substrate, and then are finally fixed to the circuit substrate by soldering.

In either case, if an inspection is performed in the state in which the ECs are temporarily attached to the circuit substrate, the ECs can be finally fixed to the circuit substrate after an operator has solved the problems found by the inspection. Thus, the percentage of defective electric circuits can be reduced. Alternatively, the circuit substrate with which the problems are found can be discarded. In the latter case, the final fixing of the ECs to the circuit substrate can be omitted. Moreover, in the case where the problem that an EC is mounted with positional errors on a printed circuit board ("PCB") in a temporary-attaching step can be distinguished from the problem that an EC is mounted with positional errors on a PCB in a final-fixing step, appropriate countermeasures can be taken to deal with those problems, respectively.

In the above-indicated background, U.S. patent application Ser. No. 09/015,521 assigned to the Assignee of the present application discloses a system which inspects, each time one EC is mounted on a circuit substrate, the state in which the one EC is mounted on the circuit substrate. More specifically described, immediately after each EC is mounted on the circuit substrate, the disclosed system takes the image of each EC and its vicinity, compares the taken image with a reference image pre-stored in a memory of the system, and judges whether each EC has been accurately mounted on the circuit substrate. Thus, the disclosed system does not need an inspecting device which is needed in the case where an inspection is performed after all ECs are temporarily attached to a circuit substrate, and which is provided at a position between an EC mounting device which temporarily attaches the ECs to the circuit substrate, and a final-fixing device such as an adhesive hardening furnace. Thus, the disclosed system can inspect the state in which each EC is mounted on the substrate, without increasing the total length of an electric-circuit assembly line or the production cost thereof.

SUMMARY OF THE INVENTION

It is therefore an object of the present invention to provide an electric-component mounting method and an electric-component mounting system which can inspect the state in which each electric component is mounted on a circuit substrate, with a higher reliability than that of the above-indicated prior system, or can employ a memory having a smaller capacity than that of the above-indicated prior system because of no need to store image data representing the reference image in the memory.

The present invention provides an electric-component mounting method and an electric-component mounting system which have one or more of the technical features that are described below in respective paragraphs given parenthesized sequential numbers (1) to (12). Any technical feature which includes another technical feature shall do so by referring, at the beginning, to the parenthesized sequential number given to that technical feature. Thus, two or more of the following technical features may be combined, if appropriate. Each technical feature may be accompanied by a supplemental explanation, as needed. However, the following technical features and the appropriate combinations thereof are just examples to which the present invention is by no means limited.

(1) According to a first feature of the present invention, there is provided a method of mounting a plurality of electric components on a circuit substrate and thereby producing an electric circuit, comprising the steps of taking, immediately before each of the electric components is mounted on the circuit substrate, a first image of a first portion of the circuit substrate on which the each electric component is to be mounted and a second portion of the circuit substrate that is adjacent to the first portion, mounting the each electric component on the circuit substrate, taking, immediately after the each electric component is mounted on the circuit substrate, a second image of the mounted electric component and the second portion adjacent to the mounted electric component, and inspecting, by comparing the first and second images with each other, a state in which the each electric component is mounted on the circuit substrate. The timing of "immediately before each of the electric components is mounted on the circuit substrate" means a timing after the preceding electric component ("EC") has been mounted on the circuit substrate and before the each EC is mounted on the circuit substrate, or means, in the case where the circuit substrate is moved so as to be positioned relative to an EC mounting head (more strictly, an EC mounting position), a timing after the substrate has been positioned relative to the EC mounting head, for mounting of the each EC, and before the each EC is mounted on the circuit substrate. The timing of "immediately after the each electric component is mounted on the circuit substrate" means a timing after the each EC has been mounted on the circuit substrate and before the following EC is mounted on the circuit substrate, or means, in the case where the circuit substrate is moved so as to be positioned relative to the EC mounting head, a timing after the each EC has been mounted on the circuit substrate and before the substrate is moved so as to be positioned relative to the EC mounting head, for mounting the following EC. However, those timings do not mean a very short time before or after the mounting of each EC. In the case where an EC is mounted on a circuit substrate, a first image taken before the mounting of the EC and a second image taken after the mounting of the EC differ from each other. That is, the mounting of each EC influences the taken images. Comparing the two images with each other can lead to judging whether each EC has been safely mounted on the circuit substrate, or whether each EC has been accurately mounted on the first portion (i.e., EC-mount portion) of the circuit substrate. It is also possible to calculate positive and/or negative amounts of x-direction and y-direction positional errors of each EC mounted on the circuit substrate, and/or a positive or negative angular amount of rotation-position error of the mounted EC about an axis line passing through the center of the EC. One or more of those judging and calculating operations is or are one or more examples of the EC-mounting inspecting operation in which the first and second images are compared with each other. The present EC mounting method can enjoy a first advantage that the EC-mounting inspecting operation can be performed with improved reliability and/or a second advantage that a memory having a smaller capacity can be employed. The circuit substrate may have printed characters or lines, and/or may have one or more ECs which has or have already been mounted thereon. Although the images of the printed matters or the mounted ECs may be taken, both the first and second images taken before and after the mounting of each EC commonly include those background images. That is, the background images do not influence the comparison of the first and second images, and accordingly are not erroneously processed as the image of the EC in question. Thus, the present method can perform the EC-mounting inspecting operation with high reliability. In the case where an inspection is performed by comparing an image taken immediately after each EC is mounted on a circuit substrate, with a reference image stored in a memory, it is usual for the reference image to include an image of an EC but not to include any background images such as images of printed characters or lines. In this case, therefore, the background images make the taken image different from the reference image, thereby introducing an error into the inspection. In contrast, in the present method, two images are taken before and after the mounting of each EC and are compared with each other. Therefore, the present method can accurately recognize each EC and can perform a reliable inspection. In order to avoid an erroneous inspection, it is possible to employ a modified reference image including one or more background images such as images of printed characters or lines. However, it is cumbersome to prepare the modified reference image. The present method can improve the accuracy or reliability of inspection, while avoiding this problem. In addition, since the present method inspects the state in which each EC is mounted on the circuit substrate, by comparing the two images taken before and after the mounting of each EC with each other, the present method does not need pre-store, in a memory, a plurality of sets of image data representing different reference images corresponding to different sorts of ECs, in contrast to the case where an image taken after each of different sorts of ECs is mounted on the circuit substrate is compared with a corresponding one of different reference images pre-stored in a memory. Thus, the present method can employ a memory having a smaller capacity, which contributes to reducing the cost of production of an EC mounting system which performs the present method.

(2) According to a second feature of the present invention that includes the first feature (1), the step of taking the first image comprises taking the first image, using an image taking device, at a position relative to the circuit substrate, and the step of taking the second image comprises taking the second image using the image taking device at the position relative to the circuit substrate. In the case where an EC mounting head mounts each EC on the circuit substrate at a predetermined position and the circuit substrate is moved so as to be positioned relative to the EC mounting head, the image taking device can be provided at a position where the image taking device cannot be interfered with by the EC mounting head. In this case, it is not needed to move the image taking device relative to the circuit substrate. In the case where the circuit substrate is provided at a fixed position and an EC mounting head is moved so as to be positioned relative to the circuit substrate, it is preferred to employ a common moving device which moves both the image taking device and the EC mounting head. In the present method, the single image taking device suffices, which leads to reducing the cost of the inspection as compared with the case where two images are taken by different image taking devices before and after the mounting of each EC, respectively. In addition, since the two images before and after the mounting of each EC are taken from the same point of view, the two images are identical with each other except the absence or presence of each EC. Thus, the present method can perform an accurate inspection.

(3) According to a third feature of the present invention that includes the first or second feature (1) or (2), the step of mounting the each electric component comprising rotating a component holder which is rotatable about an axis line and which holds the each electric component, stopping the component holder at a predetermined component mounting position, moving the first portion of the circuit substrate to a position corresponding to the component mounting position, and mounting the each electric component on the first portion positioned at the component mounting position, and the steps of taking the first and second images comprise taking the first and second images in a state in which the first portion is positioned at the component mounting position. An image taking device may be used in such a manner that in the state in which an EC mounting head including the component ("EC") holder is stopped at the predetermined component ("EC") mounting position, the image taking device is moved to a position away from the EC mounting position and, after the EC mounting head is moved from the EC mounting position, the image taking device is moved to the EC mounting position. In this case, the image taking device can take each of the first and second images at a position right above the first portion of the circuit substrate. Alternatively, an image taking device may be provided at a position where the image taking device cannot be interfered with by an EC mounting head, as described above. In the latter case, it is not needed to move the image taking device. Thus, the image taking device can enjoy a simple construction. In addition, since no time is needed to move the image taking device, the present method can enjoy improved EC mounting efficiency.

(4) According to a fourth feature of the present invention that includes any one of the first to third features (1) to (3), the step of taking the first image comprises taking, using an image taking device having a predetermined field of view, the first image at a timing before a component holder which holds the each electric component enters a predetermined image-process area included in the field of view of the image taking device, and the step of taking the second image comprises taking, using the image taking device, the second image at a timing after the component holder mounts the each electric component on the circuit substrate and exits from the image-process area. The image taking device may take an image at a position right above the first portion (i.e., EC-mount portion) of the circuit substrate, or in a direction inclined with respect to a straight line perpendicular to the circuit substrate. In the latter case, the image taking device may take an image in the state in which the component ("EC") holder is positioned at the position right above the EC-mount portion of the circuit substrate. When the EC holder which holds the EC is moved toward and away from the circuit substrate, the EC holder enters, and exits from, the image-process area included in the image-take area (i.e., field of view) of the image taking device. The image taking device takes an image currently present in its image-take area. The image-take area depends on the shapes and dimensions of an optical system and an image sensor or sensors of the image taking device. For example, in the case where an optical system defines a circular field of view and image sensors define a square field of view smaller than the circular field of view, the optical system and the image sensors define a square image-take area. In the case where the entire image (i.e., the entire image data) taken through the image-take area is processed, the image-take area is equal to the image-process area. On the other hand, in the case where only an image taken through a predetermined portion of the image-take area is processed, the predetermined portion is defined as the image-process area. If the image taking device takes the two images in the state in which the EC holder is positioned outside the image-process area, each of the two images does not include the image of the EC holder. Thus, the image of the EC holder is prevented from being erroneously processed as the image of each EC. Therefore, the present method can perform a reliable inspection. The size of the image-process area may be changed depending upon the size of ECs, or may be constant independent of the size of ECs. In the former case, the image taking device may take images at respective predetermined timings at which the image of the EC holder is not present in any sizes of image-process areas, or alternatively at respective timings that are changed depending upon the size of the current image-process area. In the present method, the image taking device takes the two images in the state in which the EC holder is not present in the image-process area. Thus, the present method can perform the inspection which is not adversely influenced by the image of the EC holder. In the particular case where the image taking device takes the two images at respective timings that are determined depending upon the size of the current image-process area, the present method can perform a reliable inspection without lowering the EC mounting efficiency.

(5) According to a fifth feature of the present invention that includes any one of the first to third features (1) to (3), the step of taking the first image comprises taking the first image at a timing at which the taken first image includes a third image of a component holder which holds the each electric component, and the step of taking the second image comprises taking the second image at a timing at which the taken second image includes a fourth image of the component holder which has mounted the each electric component on the circuit substrate, the fourth image included in the second image being substantially identical with the third image included in the first image. According to the present method, the image of the component ("EC") holder included in the first image taken before the mounting of each EC is substantially identical with the image of the EC holder included in the second image taken after the mounting of each EC. Therefore, the image of the EC holder is not erroneously processed as the image of each EC. Thus, the present method can perform an accurate inspection by comparing the first and second images with each other. The problem of whether respective images of the EC holder included in two two images are substantially identical with each other occurs only to the image-process area included in the image-take area (i.e., field of view) of the image taking device. However, if identical images of the EC holder are present in the image-take area at respective timings before and after the mounting of each EC, it is natural that identical images of the EC holder should be present in the image-process area at the two timings. The fifth feature (5) may be combined with the third feature (3), such that a portion of the movement of the EC holder toward or away from the circuit substrate and a portion of the movement of the substrate are concurrently performed. The first and second images are taken in the state in which the circuit substrate remains stopped. However, since each of the first and second images is permitted to include the image of the EC holder, the first image can be taken at a later timing before the mounting of each EC, and the second image can be taken at an earlier timing after the mounting of each EC, as compared with the case where the first and second images are not permitted to include the image of the EC holder. Thus, the movement of the circuit substrate can be stopped at a later timing, and can be started at an earlier timing, so that a portion of the movement of the EC holder and a portion of the movement of the substrate can be concurrently performed. Thus, for example, the circuit substrate can be moved for a longer time, can be moved at a lower velocity, acceleration, and deceleration, and can be started and stopped with less vibration. The ECs mounted on the circuit substrate are prevented from being moved out of position on the circuit substrate or falling off the substrate, and the vibration of the EC mounting system as a whole is effectively prevented. In the case where it is not needed to lower the velocity, acceleration, or deceleration of movement of the substrate, it is possible to shorten the cycle time of mounting of ECs (i.e., time needed for each EC to be mounted on the circuit substrate after the preceding EC is mounted on the circuit substrate) and thereby improve the efficiency of mounting of ECs. These advantages can be obtained not only when the fifth feature (5) is combined with the third feature (3) but also when the fifth feature (5) is applied to the case where the circuit substrate is moved along a first axis and the EC holder is moved along a second axis perpendicular to the first axis on a two-dimensional plane. The fifth feature (5) may be applied to the case where the circuit substrate is positioned and held at a fixed position, the EC holder is moved to any desired position along the plane of the substrate so as to mount each EC on the circuit substrate, and an image taking device is moved with the the EC holder. In this case, the image taking device takes images after the EC holder is moved to an EC mounting position and the image taking device is stopped. Since the first and second images taken by the image taking device are permitted to include the image of the EC holder, the first image can be taken at a later timing, and the second image can be taken at an earlier timing, as compared with the case where the first and second images are not permitted to include the image of the EC holder. Thus, the movement of the EC holder can be stopped at a later timing and can be started at an earlier timing, so that the EC holder can be moved for a longer time, or the cycle time of mounting of ECs can be shortened. In the case where the route along which the EC holder is moved toward the EC mounting position is different from the route along which the EC holder is moved away from that position, the EC holder is required to reach the EC mounting position and stop at that position, before the image taking device takes images. On the other hand, in the case where the EC holder is moved, after the mounting of each EC, in the opposite direction along the same route as that along which the EC holder holder is moved before the mounting of each EC, it is not essentially required that the EC holder be stopped at the EC mounting position before the image taking device takes images.

(6) According to a sixth feature of the present invention that includes any one of the first to fifth features (1) to (5), the step of inspecting the state comprises judging whether the each electric component has been mounted on the circuit substrate. When each EC is safely mounted on the circuit substrate, the second image taken after the mounting of each EC includes the image of the EC that is not included in the first image taken before the mounting of the EC. Thus, whether each EC has been mounted on the substrate can be judged by comparing the first and second images with each other. Whether each EC has been safely mounted on the circuit substrate may be inspected based on the shadow of the EC that is formed by a lighting device, as will be explained in the detailed description of the preferred embodiments, or may be inspected based on the image of the EC itself. In the former case, a reliable inspection can be performed even though the color of the EC may be very similar to that of the circuit substrate and the image of the EC may not be distinguished from that of the circuit substrate. The images may be chromatic or monochromatic.

(7) According to a seventh feature of the present invention that includes any one of the first to sixth features (1) to (6), the step of inspecting the state comprises judging whether the each electric component has been accurately mounted on the first portion of the circuit substrate. Whether each EC has been accurately mounted on the first portion of the circuit substrate may be judged by comparing the position of an electrically conductive pad which is provided on the circuit substrate and is to be electrically connected to the EC, and the position of the EC mounted on the circuit substrate.

One or more of the first to seventh features (1) to (7) of the EC mounting method may be combined with one or more of the eighth to twelfth features (8) to (12) of the EC mounting system that will be described below.

(8) According to an eighth feature of the present invention, there is provided an electric-component mounting system comprising a circuit-substrate supporting device which supports a circuit substrate; an electric-component mounting device which mounts a plurality of electric components on the circuit substrate supported by the circuit-substrate supporting device; an image taking device which takes, immediately before each of the electric components is mounted on the circuit substrate, a first image of a first portion of the circuit substrate on which the each electric component is to be mounted and a second portion of the circuit substrate that is adjacent to the first portion, the image taking device taking, immediately after the each electric component is mounted on the circuit substrate, a second image of the mounted electric component and the second portion adjacent to the mounted electric component; and an inspecting device which inspects, by comparing the first and second images with each other, a state in which the each electric component is mounted on the circuit substrate. The EC mounting device may comprise at least one EC holder which holds an EC. The EC holder may be one which is provided at a fixed position, or one which is moved, and is positioned at a predetermined position, by an EC-holder moving device. The EC-holder moving device moves the EC holder in at least one direction intersecting an axial direction parallel to an axis line of the EC holder, and positions the EC holder at the predetermined position. The EC-holder moving device may be one which includes a plurality of rotary members which are rotatable about a common axis line, independent of each other, and additionally includes a rotary-motion applying device which applies, to each of the rotary members, a rotary motion such that the each rotary member is fully rotated about the common axis, is stopped at least one time during its full rotation, and keeps a predetermined time difference from its preceding rotary member. Alternatively, the EC-holder moving device may be one which includes an intermittent-rotation body which is intermittently rotatable about an axis line and has a plurality of EC holders at respective equal distances from the axis line, and additionally includes a rotating device which intermittently rotates the intermittent-rotation body at an intermittent-rotation angular pitch equal to a spacing angular pitch at which the EC holders are equiangularly spaced from each other about the axis line. Otherwise, the EC-holder moving device may be one which includes a rotatable body which is rotatable about an axis line and has a plurality of EC holders on a circle whose center rides on the axis line, and additionally includes a rotating device which rotates the rotatable body by any desired angle in any desired direction. Moreover, the EC-holder moving device may be one which includes a movable member which has at least one EC holder, and additionally includes a movable-member moving device which moves the movable member in a direction perpendicular to an axis line of the EC holder. The movable-member moving device may be one which moves the movable member along a straight line, or along each of two straight lines perpendicular to each other on a two-dimensional plane. The above-described EC-holder moving device which includes the rotary members and the rotary-motion applying device, or the above-described EC-holder moving device which includes the intermittent-rotation body or the rotatable body and the rotating device may be provided on a movable member, and the movable member may be moved by a movable-member moving device. In the last case, the movable member and the movable-member moving device cooperate with the rotary members and the rotary-motion applying device, or the intermittent-rotation body or the rotatable body and the rotating device, to provide an EC-holder moving device. The circuit-substrate supporting device may have a construction corresponding to that of the EC mounting device. For example, the supporting device may be one which positions and holds the circuit substrate and moves the circuit substrate in two directions perpendicular to each other on a two-dimensional plane (e.g., a horizontal plane), one which moves the circuit substrate along a straight line, or one which positions and holds the circuit substrate at a fixed position. The EC mounting system according to the eighth feature (8) enjoys the same advantages as those of the EC mounting method according to the first feature (1).

(9) According to a ninth feature of the present invention that includes the eighth feature (8), the mounting system further comprises a lighting device which emits a light toward the circuit substrate in a first direction inclined with respect to a straight line perpendicular to a surface of the circuit substrate, and the image taking device is oriented toward the circuit substrate such that the image taking device takes the first and second images in a second direction inclined with respect to the straight line. The lighting device may be a slit-light emitting device which emits a flat, slit light, a columnar-light emitting device which emits a columnar light, or a radial-light emitting device which includes a point light source and emits a radial light. It is preferred that the slit-light emitting device or the columnar-light emitting device emit parallel light fluxes all of which are parallel to the optical axis thereof. For example, a columnar parallel light may be provided by a device including a semiconductor laser device and a beam expander, and a slit light may be provided by the columnar parallel light which passes through a slit. The radial-light emitting device may be obtained at the lowest cost. Excellent images can be obtained using a parallel light, and the thus obtained images can be easily processed. According to the ninth feature (9), the image taking device can take the image of each EC and its vicinity in the state in which an EC holder faces the first portion (i.e., EC-mount portion) of the circuit substrate. That is, the EC holder may not be moved away from the position opposed to the EC-mount portion, when the image-taking device takes an image. Thus, the present system can efficiently take the first and second images and inspect the state in which each EC is mounted on the substrate. In the case where each EC is lighted using a columnar light or a radial light whose cross section is much greater than the dimensions of the EC, the EC can be more reliably lighted than lighted using a slit light, even if respective upper surfaces of ECs mounted on the circuit substrate may have different heights because of different heights of the ECs or the warpage of the circuit substrate. In addition, the columnar light or the radial light is less likely to be completely interrupted by the ECs which have already been mounted on the circuit substrate, and the image of at least a portion of each EC can be taken and the state in which the EC is mounted on the circuit substrate can be inspected. According to the eighth feature (8), it is not essential to employ a lighting device. However, according to the ninth feature (9) wherein a lighting device is employed, clear images can be easily taken. In addition, in the case where the lighting device emits a light toward the circuit substrate in a direction inclined with respect to a straight line perpendicular to the circuit substrate, the shadow of each EC is surely formed on the circuit substrate. Thus, the present system can easily inspect the state in which each EC is mounted on the circuit substrate.

(10) According to a tenth feature of the present invention that includes the eighth or ninth feature (8) or (9), the electric-component mounting device comprises a plurality of component holders which hold respective electric components and which are rotated about a common axis line while being sequentially stopped at a predetermined component mounting position, the circuit-substrate supporting device comprises a circuit-substrate positioning device which positions the first portion of the circuit substrate at a position corresponding to the component mounting position, and the image taking device comprises a stationary image taking device which is provided in vicinity of the component mounting position.

(11) According to an eleventh feature of the present invention that includes any one of the eighth to tenth features (8) to (10), the inspecting device comprises means for judging whether the each electric component has been mounted on the circuit substrate.

(12) According to a twelfth feature of the present invention that includes any one of the eighth to eleventh features (8) to (11), the inspecting device comprises means for judging whether the each electric component has been accurately mounted on the first portion of the circuit substrate.

BRIEF DESCRIPTION OF THE DRAWINGS

The above and optional objects, features, and advantages of the present invention will be better understood by reading the following detailed description of the preferred embodiments of the invention when considered in conjunction with the accompanying drawings, in which:

FIG. 12 is a timing chart corresponding to FIG. 6, indicating respective timings at which a CCD camera of an inspecting device of another EC mounting system as a second embodiment of the present invention takes images;

DETAILED DESCRIPTION OF THE PREFERRED EMBODIMENTS

Referring to FIGS. 1 to 11, there will be described an electric-component ("EC") mounting system 10 to which the present invention is applied.

Figure 1:
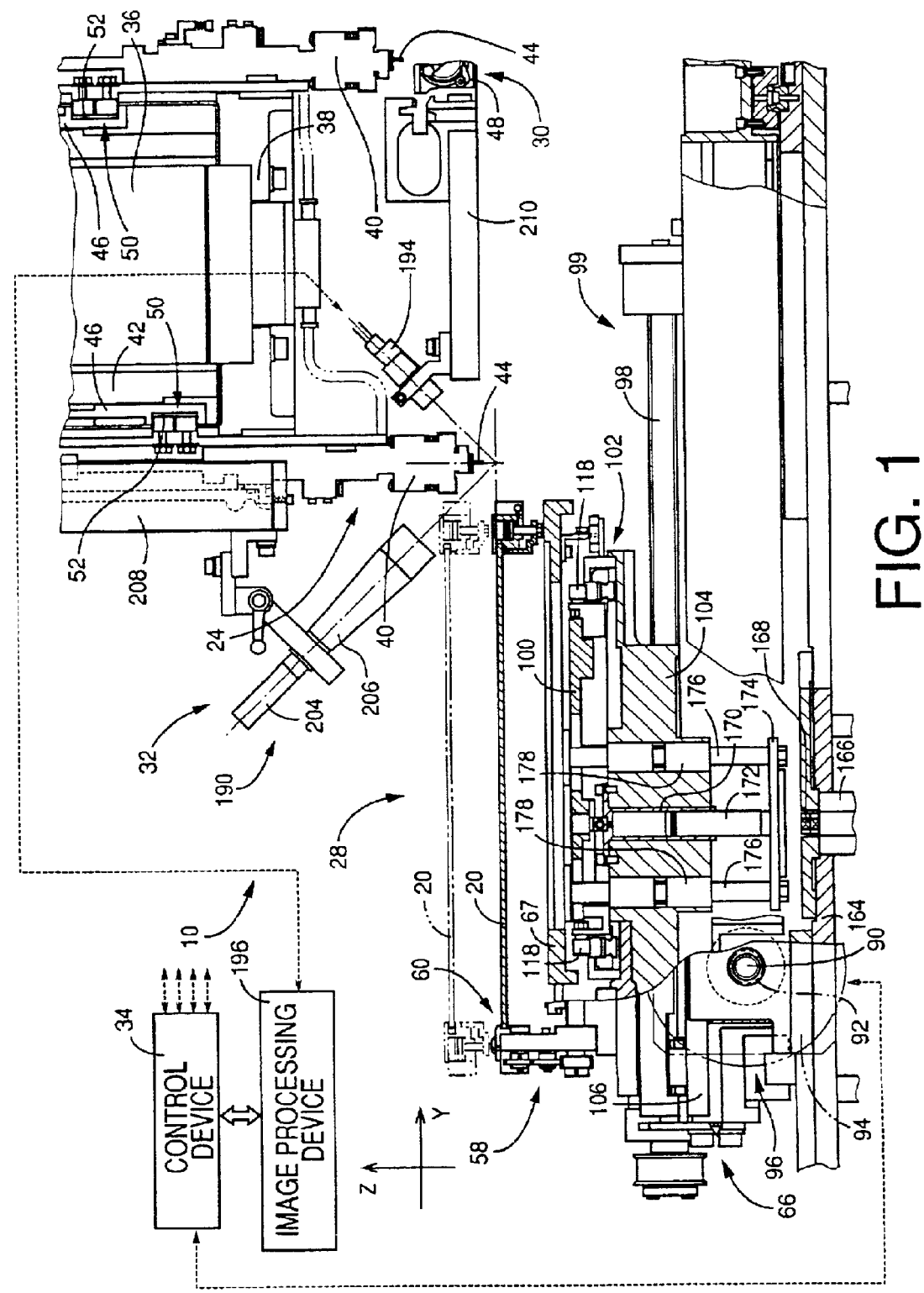
FIG. 1 is a partly cross-sectioned, front elevation view of an electric-component ("EC") mounting system including an EC-mounting inspecting device to which the present invention is applied.

FIG. 1 is a partly cross-sectioned, front elevation view of an essential portion of the EC mounting system 10. The EC mounting system 10 includes an EC mounting device 24 which mounts ECs 22 (FIG. 5A) on a printed circuit board ("PCB") 20 as a circuit substrate; a PCB supporting device 28 which supports and moves the PCB 20; an EC supplying device 30 which supplies the ECs 22 to the EC mounting device 24; an EC-mounting inspecting device 32 which inspects the state in which each EC 22 is mounted on the PCB 20; and a control device 34 which controls the EC mounting device 24, the PCB supporting device 28, the EC supplying device 30, and the EC-mounting inspecting device 32.

The EC mounting device 24 is of a so-called 'index' type. The EC mounting device 24 will be described below, briefly, as needed to help understand the present invention. The EC mounting device 24 includes a stationary cylindrical member 36 whose central axis line extends in a vertical direction (i.e., Z direction) in FIG. 1; an index table 38 which is provided below the cylindrical member 36 such that the index table 38 is rotatable about the central axis line of the cylindrical member 36; twenty EC mounting units 40 (only two units 40 are shown in FIG. 1) which are provided on an outer cylindrical surface of the index table 38 such that the twenty units 40 are equidistant from one another on the outer surface of the index table 38 and such that each one of the twenty units 40 is movable independent of the other units 40 in the Z direction; a cylindrical cam 42 which moves, i.e., elevates and lowers the twenty EC mounting units 40 in the Z direction as the index table 38 is rotated; and two elevating and lowering members 46 one of which lowers and elevates, in the Z direction, one EC mounting unit 40 being positioned at an EC sucking position where an EC sucker (i.e., an EC holder) 44 of the one unit 40 sucks and holds an EC 22 and the other of which lowers and elevates, in the Z direction and independent of the one unit 40, another EC mounting unit 40 being positioned at an EC mounting position where the EC 22 sucked and held by the EC sucker 44 of the another unit 40 is mounted on the PCB 20. The EC supplying device 30 includes a plurality of EC supplying units 48 each of which supplies ECs 22 one by one to the EC sucking position shown on the right-hand side of the index table 38 in FIG. 1. The EC sucking position can be said as an EC taking position where each EC mounting unit 40 takes an EC 22 from the EC supplying device 30. The EC mounting position is shown on the left-hand side of the index table 38 in FIG. 1. The EC sucker 44 of each EC mounting unit 40 sucks and holds an EC 22 by applying a vacuum, i.e., a negative pressure thereto.

The plurality of EC supplying units 48 of the EC supplying device 30 are attached to a movable table as a unit-support member such that respective EC-supply portions of the supplying units 48 are arranged along a straight line parallel to an X direction in which a PCB conveying device (described later) of the PCB supporting device 28 conveys each PCB 20. When the movable table is moved in the X direction by a table moving device (not shown), the respective EC-supply portions of the supplying units 48 are sequentially positioned at the EC sucking position, below the EC sucker 44 of one EC mounting unit 40 being positioned at the EC sucking position. The EC sucking position can also be said as an EC supplying position where each EC supplying unit 48 supplies ECs 22 one by one.

An outer cylindrical surface of the cylindrical cam 42 has a cam groove (not shown), and each of the EC mounting units 40 includes a cam follower 50 which is engaged with the cam groove of the cylindrical cam 42. The engagement of the cam follower 50 of each unit 40 with the cam groove of the cam 42 defines the position of the each unit in the Z direction. The twenty EC mounting units 40 are rotation-symmetric with one another with respect to the central axis line of the cylindrical member 36. The index table 38 is intermittently rotated at an intermittent-rotation angular pitch of 18 degrees about the axis line of the cylindrical member 36 by a cam mechanism (not shown) which is independent of the cylindrical cam 42 and the cam followers 50. The angular pitch of 18 degrees is obtained by dividing 360 degrees by the total number, 20, of the EC mounting units 40. As the index table 38 is intermittently rotated, each of the twenty units 40 is moved over each angular pitch, and then stopped, and this moving and stopping are repeated. Thus, each unit 40 is sequentially stopped at twenty stop positions including the EC sucking position and the EC mounting position. Since, however, the cylindrical cam 42 is not rotated, the cam follower 50 of each unit 40 is rolled over in the cam groove of the cylindrical cam 42. Since the cam groove includes a portion whose position in the Z direction continuously changes, the Z-direction position of each unit 40 is continuously changed when the cam follower 50 of the each unit 40 is rolled over in that portion of the cam groove. By employing a cylindrical cam 42 whose cam groove has a desired shape or pattern, it is possible to freely determine, in advance, the locus of Z-direction movement of the lower end of the EC sucker 44 of each unit 40. In the present embodiment, the cam groove of the cylindrical cam 42 is so formed that each of the EC mounting units 40 takes respective Z-direction positions, shown in FIG. 1, at the EC sucking position and the EC mounting position, respectively. In FIG. 1, the two elevating and lowering members 46 take their upper-end positions.

The two elevating and lowering members 46 have respective auxiliary cam grooves 52 which cooperate with the main cam groove of the cylindrical cam 42 to provide a generally annular cam groove. The two members 46 are lowered and elevated in the Z direction by two elevating and lowering devices (not shown), respectively, independent of each other. Each of the two elevating and lowering devices lowers and elevates a corresponding one of the two members 46 in a state in which the auxiliary cam groove 52 of the one member 46 is engaged with the cam follower 50 of one EC mounting unit 40 being positioned at a corresponding one of the EC sucking position and the EC mounting position. The timing at which each member 46 lowers and elevates one unit 40 will be described later.

As shown in FIGS. 1 to 4, the PCB supporting device 28 includes a PCB conveying device 58 which conveys PCBs 20; a PCB holding device 60 which positions and holds each PCB 20 which has been conveyed by the PCB conveying device 58; an elevating and lowering device 62 which elevates and lowers, in the Z direction, the PCB conveying device 58 and the PCB holding device 60 between a PCB receiving and handing-over height position indicated at two-dot chain line in FIG. 1 and an EC mounting height position indicated at solid line; a height-position adjusting device 64 which adjusts the EC mounting height position of the PCB holding device 60 (and the PCB conveying device 58); and an X-Y table 66 which supports the PCB holding device 60 via the height-position adjusting device 64 and moves the PCB holding device 60 to any desired position on a horizontal plane.

The PCB conveying device 58 conveys each PCB 20 in the X direction perpendicular to the plane of the drawing sheet of FIG. 1, and the PCB holding device 60 positions and holds the PCB 20 which has been conveyed to a predetermined position by the PCB conveying device 58. With the PCB conveying device 58 being elevated to the PCB receiving and handing-over height position by the elevating and lowering device 62, the PCB conveying device 58 conveys one PCB 20 on which the ECs 22 have been mounted, and hands over the PCB 20 to a PCB carry-out device (not shown), and then receives another PCB 20 on which ECs 22 are to be mounted, from a PCB carry-in device (not shown) and conveys the PCB 20 to the predetermined position.

With the PCB holding device 60 and the PCB conveying device 58 being lowered to the EC mounting height position by the elevating and lowering device 62, the height-position adjusting device 64 adjusts the respective height positions of the PCB holding device 60 and the PCB conveying device 58, thereby adjusting the height position of the PCB 20 held by the PCB holding device 60, depending upon the height (i.e., the Z-direction dimension) of the ECs 22 to be mounted on the PCB 20.

The X-Y table 66 moves the PCB holding device 60 and the PCB conveying device 58 being held at the EC mounting height position, to any desired position on a horizontal plane, so that an EC-mount portion of the PCB 20 where an EC 22 is to be mounted is moved and positioned right below the EC sucker 44 of one EC mounting unit 40 being positioned at the EC mounting position. The X-Y table 66 includes an X table 106 and a Y table 104. The X table 106 is moved in the X direction by a X-table moving device 96 including a feed screw 90, a nut 92, and an X-table moving servomotor 96, and the Y table 104 is moved in a Y direction perpendicular to the X direction on a horizontal plane, by a Y-table moving device 99 including a feed screw 98 and a nut and a Y-table moving servomotor (both not shown).

The PCB supporting device 28 will be described in more detail below.

Figure 2:
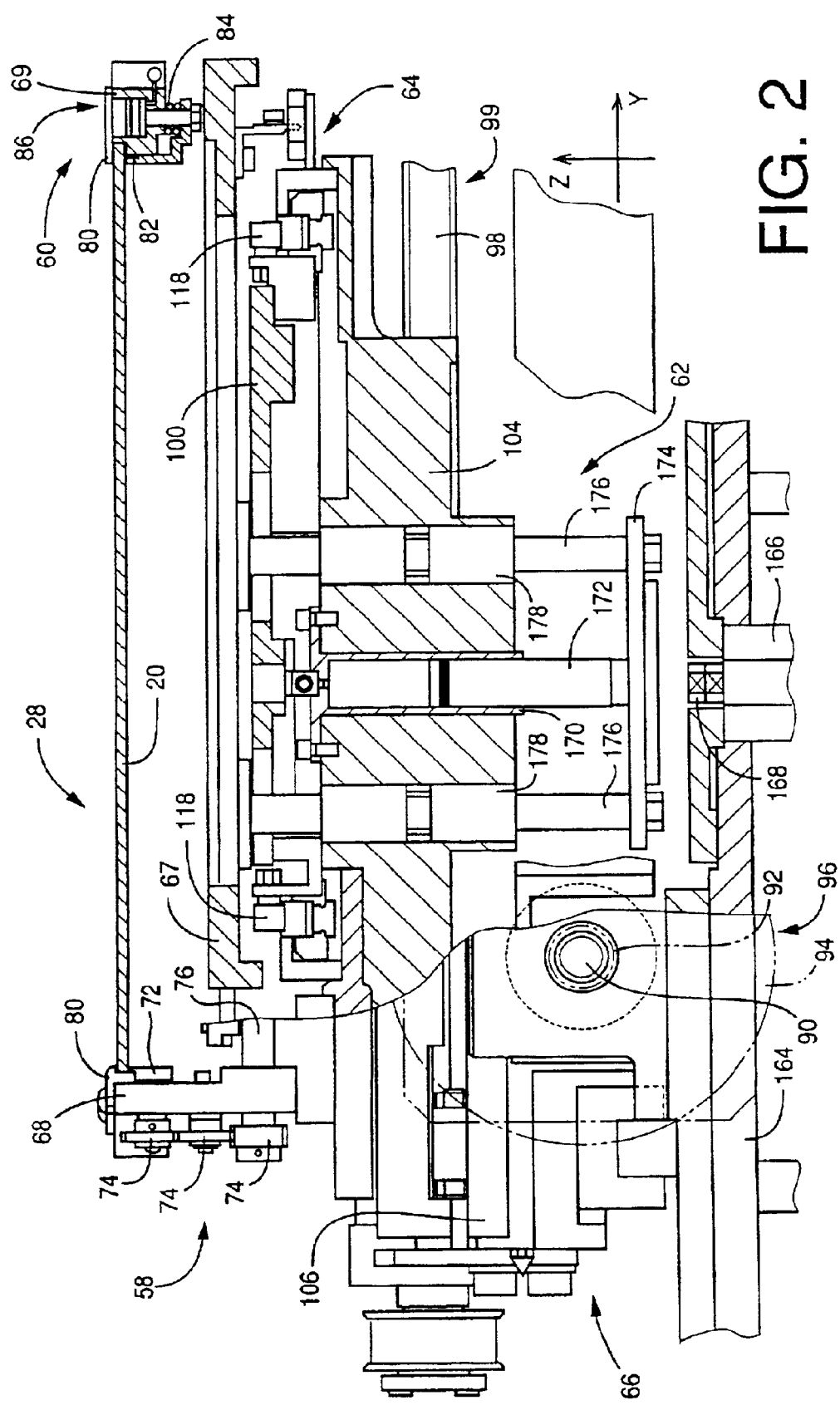
FIG. 2 is a partly cross-sectioned, front elevation view of a printed-circuit-board ("PCB") supporting device of the EC mounting system of FIG. 1.

FIG. 2 is an enlarged, front elevation view of the PCB supporting device 28 shown in FIG. 1. The PCB conveying device 58 includes a main frame 67 which has a central opening and extends in a horizontal plane; and a pair of side frames 68, 69 which are supported by the main frame 67. The main frame 67 is elevated and lowered by the elevating and lowering device 62 and, at the EC mounting height position, the height position of the main frame 62 is adjusted by the height-position adjusting device 64, so that the two side frames 68, 69 are elevated and lowered and the height position thereof is adjusted. The PCB conveying device 58 further includes a pair of conveying belts 72 (only one belt 72 is shown in FIG. 2) which are supported by the two side frames 68, 69, respectively, and which extend parallel to each other; and a rotation transmitting device including a plurality of gears 74 and a rotatable axis member 76 which cooperate with each other to operate or move the pair of belts 72. The pair of belts 72 support opposite end portions of each PCB 20. When the axis member 76 is rotated by an electric motor (not shown), the two belts 72 are moved at the same speed, so that the PCB 20 is stably conveyed at that speed.

The PCB holding device 60 includes two fixed clamping members 80 which are fixed to the two side frames 68, 69, respectively; and two movable clamping members 82 (only one member 82 fixed to the side frame 69 is shown in FIG.

2) which cooperate with the corresponding fixed clamping members 80 to clamp the opposite end portions of each PCB 20. The movable clamping members 82 are biased by respective springs 84 as biasing members, so that they are held at their inoperative positions below the belts 72 away from the fixed clamping members 80. When two air-operated cylinder devices 86 are operated, the two movable clamping members 82 are moved toward the corresponding fixed clamping members 82 against the biasing forces of the springs 84, so that the movable and fixed clamping members 82, 80 cooperate with each other to clamp each PCB 20.

Figure 3:
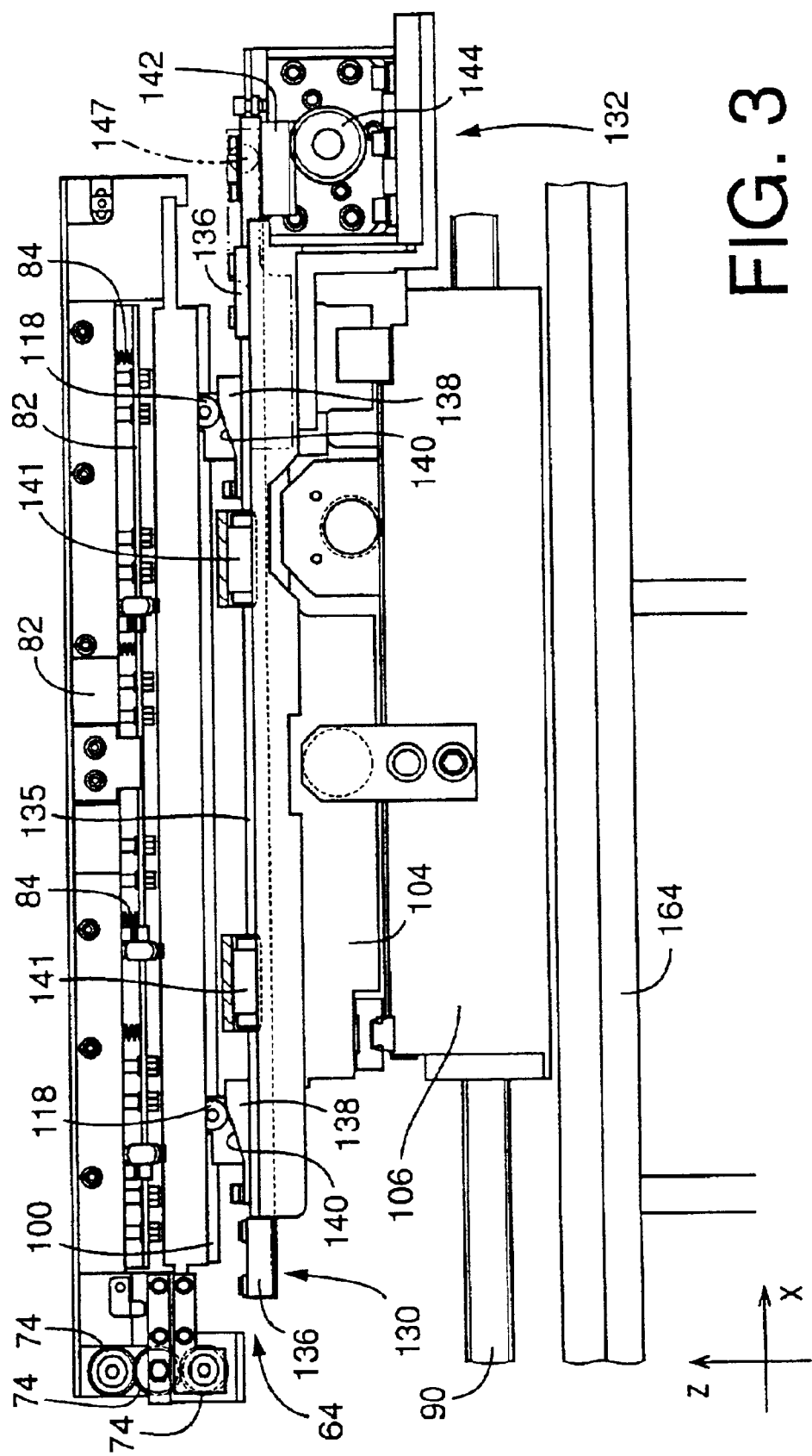
FIG. 3 is a side elevation view of the PCB supporting device of FIG. 2.
Figure 4:
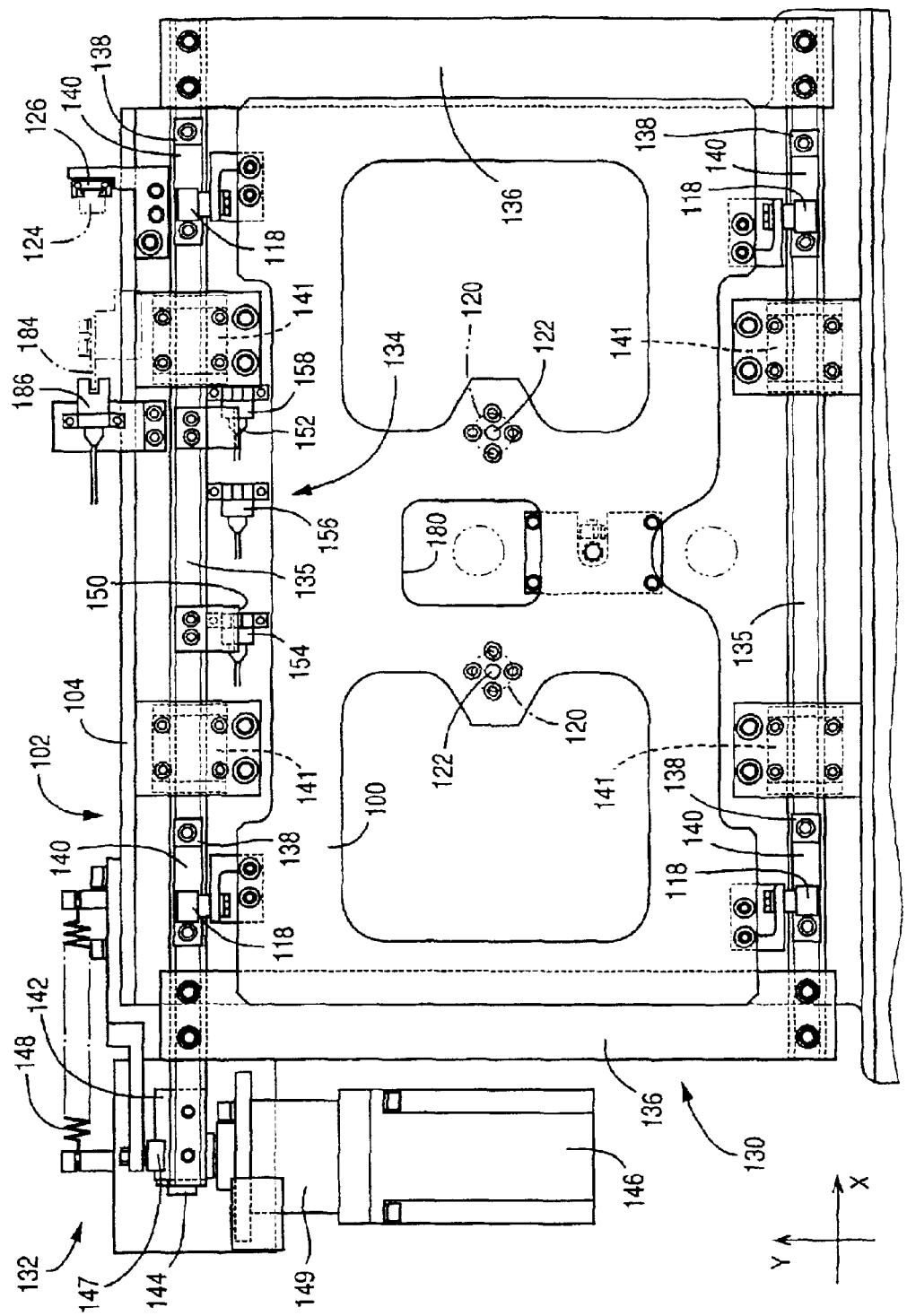
FIG. 4 is a plan view of the PCB supporting device of FIG. 2.

As shown in FIGS. 3 and 4, the height-position adjusting device 64 includes a Z table 100 which supports, under the lower surface of the main frame 67, the main frame 67 of the PCB moving device 58 being held at the EC mounting height position; and a Z-direction moving device 102 which moves the Z table 100 in the Z direction. As is apparent from FIG. 4, the Z table 100 is equipped with four rollers 118 at four places on its side surfaces, respectively, such that the rollers 118 are rotatable about their axis lines parallel to a horizontal plane. When the four rollers 118 are moved in the Z direction by the Z-direction moving device 102, the Z table 100 is moved in the Z direction. The Z table 100 is equipped with two positioning bushings 120 in which two positioning shafts 122 each fixed to the Y table 104 are fitted, respectively, so that the Z table 100 and the Y table 104 are inhibited from being moved relative to each other in the X direction and the Y direction. The main frame 67 is equipped with a horizontality control mechanism (not shown), and the main frame 67 is supported by the Z table 100 via the horizontality control mechanism, so that an upper surface of the main frame 67, i.e., an upper surface of the PCB 20 can maintain an accurately horizontal attitude. As shown in FIG. 4, the main frame 67 is equipped with a rail 124, and the Y table 104 is equipped with a linear guide 126 (however, the members 124, 126 are not shown in the other figures), so that the main frame 67 and the Y table 104 can be smoothly moved relative to each other and can be effectively prevented from being moved out of position relative to each other in the X and Y directions.

The Z-table moving device 102 includes a wedge block frame 130; a wedge-block-frame moving device 132 which moves, on the Y table 104, the wedge block frame 130 relative to the Y table 104 in the X direction; and a relative-position detector 134 which detects the position of the wedge block frame 130 relative to the Y table 104 in the X direction.

The wedge block frame 130 is a rectangular frame which is provided by two rails 135 and two connection members 136 which connect the two rails 135 to each other such that the two rails 135 extend parallel to each other in the X direction. Two identical wedge blocks 138 are provided at two places on each of the two rails 135. Thus, the wedge block frame 130 is equipped with four wedge blocks 138 in total. Each of the four wedge blocks 138 has an inclined surface 140, and a vector representative of a normal line of the inclined surface 140 does not have any Y-direction component and has only Z-direction and X-direction components. The respective inclined surfaces 140 of the four wedge blocks 138 are engageable with the four rollers 118 of the Z table 100, respectively. The wedge block frame 130 is moved, on the Y table 104, by the wedge-block-frame moving device 132 (described later) relative to the Y table 104 in the X direction, so that the wedge blocks 138 provided on the frame 130 are also moved relative to the Y table 104 in the X direction. However, the Z table 100 having the rollers 118 with which the wedge blocks 138 are engageable are inhibited from being moved relative to the Y table 104 in the X and Y directions, as described above. Therefore, when the wedge block frame 130 is moved relative to the Y table 104 in the X direction, the Z table 100 is moved relative to the Y table 104 in the Z direction only, while the rollers 118 roll on the inclined surfaces 140 of the wedge blocks 138.

The wedge-block-frame moving device 132 includes four linear guides 141 which are fixed to the Y table 104, two of which cooperate with each other to hold a corresponding one of the two rails 135 such that the one rail 135 is movable relative thereto in the X direction, and the other two of which cooperate with each other to hold the other rail 135 in the same manner; a rack 142 which is attached to an end portion of one of the two rails 135; a pinion 144 which is meshed with the rack 142; an electric motor 146 which rotates the pinion 144; a hold-down roller 147 which holds down the rack 142 on the pinion 144 for preventing the rack 142 and the pinion 144 from being separated from each other in a direction perpendicular to both a longitudinal direction of the rack 142 and a direction parallel to an axis line of rotation of the pinion 144; and a spring 148 which prevents backlash which may occur to the meshing of the rack 142 and the pinion 144. Each of the two rails 135 is hung by corresponding two of the four linear guides 141, so that the each rail 135 can be smoothly moved relative to the Y table 104. When the pinion 144 engaged with the rack 142 is rotated by the electric motor 146, the wedge block frame 130 is moved relative to the Y table 104 in the X direction. A reduction gear unit 149 is disposed between the drive motor 146 and the pinion 144. The drive motor 146 is controlled by the control device 34. One end of the spring 148 is connected to the rack 142, and the other end of the spring 148 is connected to the Y table 104, so that the spring 148 biases the rack 142 rightward in FIG. 4.

The Z-table moving device 102 includes the relative-position detector 134, as described above. The relative-position detector 134 includes two detection plates 150, 152 which are attached to the rail 135 to which the rack 142 is attached; and three photointerruptors 154, 156, 158 which are attached to the Y table 104. In the state shown in FIG. 4, the first photointerruptor 154 is detecting the first detection plate 150, and the second and third interrupters 156, 158 are not detecting any detection plates 150, 152. Respective outputs of the three interrupters 154, 156, 158 are supplied to the control device 34. The distance between the second and third interrupters 156, 158 defines the range in which the wedge block frame 130 and the Y table 104 are moved relative to each other in the X direction. More specifically described, when the control device 34 recognizes that the third interrupter 158 has detected the second plate 152, the control device 34 controls the electric motor 146 so that the wedge block frame 130 is not moved any more rightward in FIG. 4 and, when the control device 34 recognizes that the second interrupter 156 has detected the second plate 152, it controls the motor 146 so that the frame 130 is not moved any more leftward in FIG. 4. At the former timing, the distance between the Z table 100 and the Y table 104 is maximum and accordingly the main frame 67 takes its highest (i.e., upper end) position in the z direction and, at the latter timing, the distance is minimum and the main frame 67 takes its lowest (i.e., lower end) position.

The relative position of the first plate 150 and the first interrupter 154 defines the origin of relative position of the wedge block frame 130 and the Y table 104 in the X direction. More specifically described, the control device 34 defines, as the origin, the position of one of opposite ends of the first plate 150 which are opposite to each other in the X direction. In the present embodiment, the right-hand end of the first plate 150 defines the origin. In the state shown in FIG. 4, the wedge block frame 130 is positioned slightly rightward from the origin relative to the Y table 104.

The present PCB supporting device 28 additionally includes two relative-position detectors each identical with the relative-position detector 134, one for detecting the relative position of the Y table 104 and the X table 106 in the Y direction and the other for detecting the relative position of the X table 106 and the EC mounting device 24 in the X direction.

The elevating and lowering device 62 includes, as shown in FIGS. 1 and 2, a pressurized-air-operated cylinder device ("air cylinder") 166 which is provided on a base 164 and which includes a piston rod 168; an air cylinder 170 which is fixed to the Y table 104 and which includes a plunger 172; two guide shafts 176 whose upper ends are fixed to the main frame 67 and whose lower ends are connected to the plunger 172 via a connection member 174; and two guide bushings 178 in which the two guide shafts 176 are axially movably fitted, respectively, and which are fixed to the Y table 104. The air cylinder 170, the guide shafts 176, and the guide bushings 178 extend in the Z direction.

In the state in which the pressure chamber of the air cylinder 166 is communicated with the atmosphere, the piston rod 168 of the cylinder 166 is advanced upward by a biasing spring (not shown) to be projected out of the housing of the cylinder 166. The advanced piston rod 168 butts against the connection member 174 and additionally thrusts up the connection member 174, the guide shafts 176, and the main frame 67. Thus, the PCB 20 can be moved up to the PCB receiving and handing-over height position indicated at two-dot chain line in FIG. 1. On the other hand, when a pressurized air is supplied to the respective pressure chambers of the air cylinder 166 and the air cylinder 170, the plunger 172, the guide shafts 176, and the main frame 67 are moved downward, so that the main frame 67 rests on the Z table 100 and the PCB 20 is lowered to the EC mounting height position indicated at solid line in FIG. 1. In the latter state, the pressure chamber of the air cylinder 170 maintains the pressurized air, so that the main frame 67 is held in pressed contact with the Z table 100 and the four rollers 118 of the Z table 100 are pressed on the respective inclined surfaces 140 of the four wedge blocks 138 of the wedge block frame 130. When a photointerruptor 186 (FIG. 4) provided on the Y table 104 detects a detection plate 184 provided on the main frame 67, the control device 34 recognizes, based on a detection signal supplied from the interrupter 186, that the PCB 20 has been moved to the EC mounting height position.

As shown in FIG. 1, the EC-mounting inspecting device 32 includes a stationary columnar-parallel-light ("CPL") emitting device 190 as a lighting device; a CCD (charge-coupled device) camera 194 as an image taking device; and an image processing device 196.

The CPL emitting device 190 includes a semiconductor laser device 204; and a beam expander 206 which enlarges the diameter of the laser beam emitted by the laser device 204, and converts the enlarged laser beam into parallel rays having a generally circular cross section. As shown in FIG. 1, there is provided a stationary support member 208, in the vicinity of the EC mounting position, such that the support member 208 does not interfere with the index table 38 or the EC mounting units 40. The CPL emitting device 190 is supported by the support member 208, in the vicinity of the EC mounting position, such that the CPL emitting device 190 is fixed at a position outside the locus of revolution of the EC mounting units 40 about the central axis line of the index table 38.

The CCD camera 194 is supported by a stationary frame member 210, in the vicinity of the EC mounting position, such that the CCD camera 194 is fixed at a position inside the locus of revolution of the EC mounting units 40, i.e., position nearer to the central axis line of the index table 38. The CCD camera 194 includes a number of small charge-coupled devices each as a sort of solid-state image sensor, and a lens system including an image forming lens. The number of charge-coupled devices are arranged in a two-dimensional matrix, and each device functions as a light receiving element which receives or detects a light and generates an electric signal indicative of the detected light. Thus, the two-dimensional matrix of charge-coupled devices defines an image-take surface 216 of the CCD camera 194. Accordingly, an image taken by the camera 194 consists of a number of picture elements corresponding to the number of charge-coupled devices, respectively, and a batch of image data representing the taken image consists of a number of picture-element data representing respective colors of the number of picture elements.

Figure 5A:
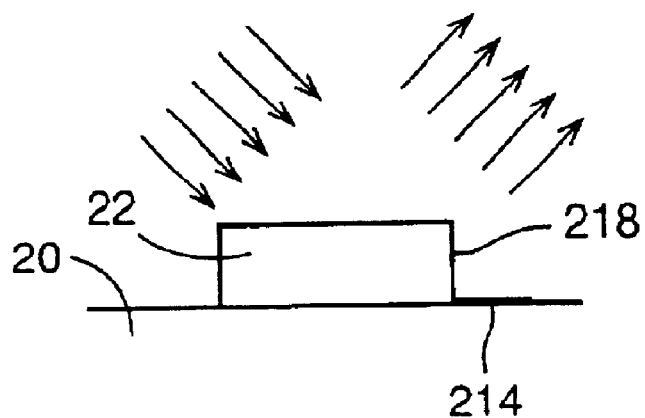
FIG. 5A is a view for illustrating a geometrical relationship between a columnar parallel light ("CPL") emitted by a CPL emitting device as an element of the inspecting device of FIG. 1, and the CPLs reflected by an EC and a PCB.
Figure 5B:
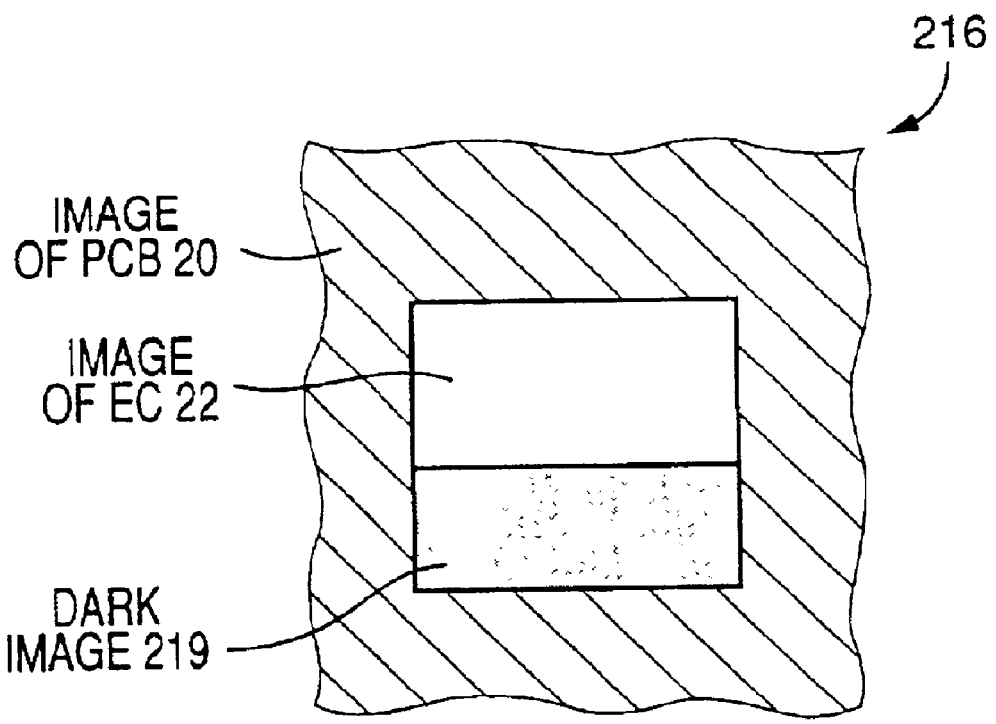
FIG. 5B is a view for illustrating an image formed by the reflected CPL on an image-take surface of a charge-coupled-device ("CCD") camera as another element of the inspecting device of FIG. 1.

In the present embodiment, the CPL emitter 190 and the CCD camera 194 are provided such that respective optical axes of the two devices 190, 194 are perpendicular to each other and each optical axis is inclined by 45 degrees with respect to a straight line perpendicular to an upper surface of the PCB 20. More specifically described, the CPL emitter 190 emits the CPL toward each EC-mount portion of the PCB 20 that is positioned below the EC sucker 44 of one EC mounting unit 40 that is currently positioned at the EC mounting position. The CCD camera 194 is provided such that an image of the EC-mount portion and its vicinity is formed in a central area of the image-take surface 216 of the CCD camera 194. FIGS. 5A and 5B show an EC 22 having a rectangular parallelopiped shape, for easier understanding purposes only. It is assumed here that an EC 22 is mounted on each EC-mount portion of the PCB 20 such that two side surfaces of the EC 22 that are perpendicular to each other are parallel to the X and Y axes (i.e., the X and Y directions), respectively, of an X-Y orthogonal coordinate plane parallel to the plane (or the upper surface) of the PCB 20. Each of the respective optical axes of the CPL emitter 190 and the CCD camera 194 is parallel to the Y direction, i.e., perpendicular to the X direction as seen in the Z direction.

The CPL emitted by the CPL emitter 190 is reflected by the EC 22 and the PCB 20. Hereinafter, the CPL reflected from the EC 22 will be referred to as the "EC-reflected light", and the CPL reflected from the PCB 20 as the "PCB-reflected light". As described above, the CPL emitter 190 and the CCD camera 194 are provided such that the respective optical axes thereof are perpendicular to each other and each optical axis is inclined by 45 degrees with respect to the straight line perpendicular to the upper surface of the PCB 20, and such that the respective optical axes thereof are parallel to the Y direction. Therefore, as shown in FIGS. 5A and 5B, in the case where an image of the EC 22 mounted on the PCB 20 is taken, a shadow 214 of the EC 22 is formed, on the PCB 20, on one of opposite sides of the EC 22 in the Y direction, and a dark image of the shadow 214 is formed on the image-take surface 216 of the CCD camera 194. The CPL emitted by the CPL emitter 190 is not incident to one 218 of opposite side surfaces of the EC 22 that is opposite to the emitter 190, and a dark image of the side surface 218 is formed on the image-take surface 216 of the CCD camera 194. The respective dark images of the shadow 214 and the side surface 218 are contiguous with each other and cooperate with each other to provide a continuous dark image 219 on the image-take surface 216.

Figure 9:
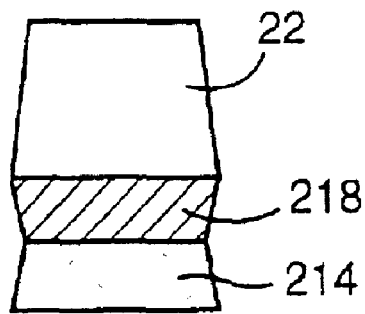
FIG. 9 is a view of an image formed on the image-take surface of the CCD camera.

The optical system of the CCD camera 194 is constructed not to take an image of an object like a projection drawing, but to taken an image of an object, as shown in FIG. 9, such that the more distant an object is from the camera 194 the smaller image of the object is taken, i.e., the more distant portion of an object is from the camera 194 the smaller image of that portion is taken. However, it is assumed here that the variation of dimensions of an object because of distance can be neglected, that is, that there is substantially no variation of dimensions of an object because of distance on the field of view, i.e., the image-take surface 216, of the CCD camera 194.

Figure 10:
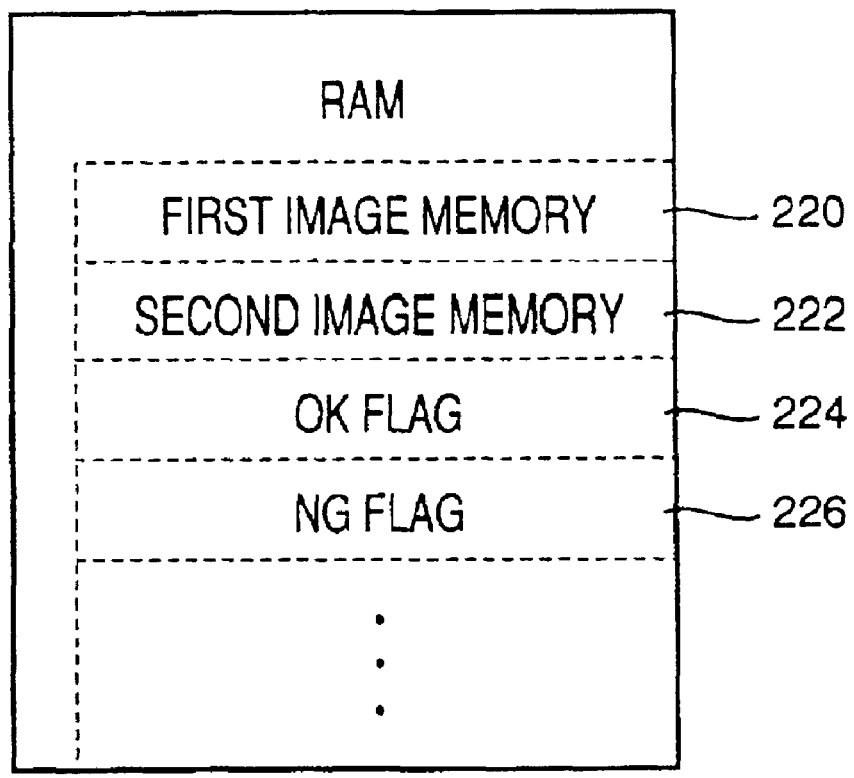
FIG. 10 is an illustrative view of a random access memory ("RAM") of a computer as an essential element of an image processing device as another element of the inspecting device of FIG. 1.

The image processing device 196 is essentially provided by a computer including a processing unit ("PU"), a random access memory ("RAM"), a read only memory ("ROM"), and a bus for connecting the PU, the RAM, and the ROM to one another. The processing device 196 is connected to the control device 34, and the control device 34 operates based on the results obtained from the image-processing operation of the processing device 196. As shown in FIG. 10, the RAM of the image processing device 196 includes a working memory and additionally includes a first image memory 220, a second image memory 222, an OK flag 224, and an NG flag 226. The ROM of the image processing device 196 stores an EC-mounting inspecting routine represented by the flow chart of FIG. 11.

Hereinafter, there will be described the operation of the EC mounting system 10 constructed as described above.

When the EC mounting system 10 mounts ECs 22 on a PCB 20, the index table 38 is intermittently rotated and the twenty EC mounting units 40 are sequentially moved to the EC sucking position and the EC mounting position. Each EC mounting unit 40 sucks, at the EC sucking position, an EC 22 from one EC supplying unit 48 and mounts, at the EC mounting position, the EC 22 on a PCB 20. The PCB 20 is moved in the X and Y directions by the X-Y table 66 so that each EC-mount portion of the PCB 20 is positioned at a position corresponding to the EC mounting position.

Each time one EC 22 is mounted on the PCB 20, the EC-mounting inspecting device 32 inspects the state in which the one EC 22 is mounted on the PCB 20. Hereinafter, there will be described the EC-mounting inspecting operation of the inspecting device 32.

Figure 6:
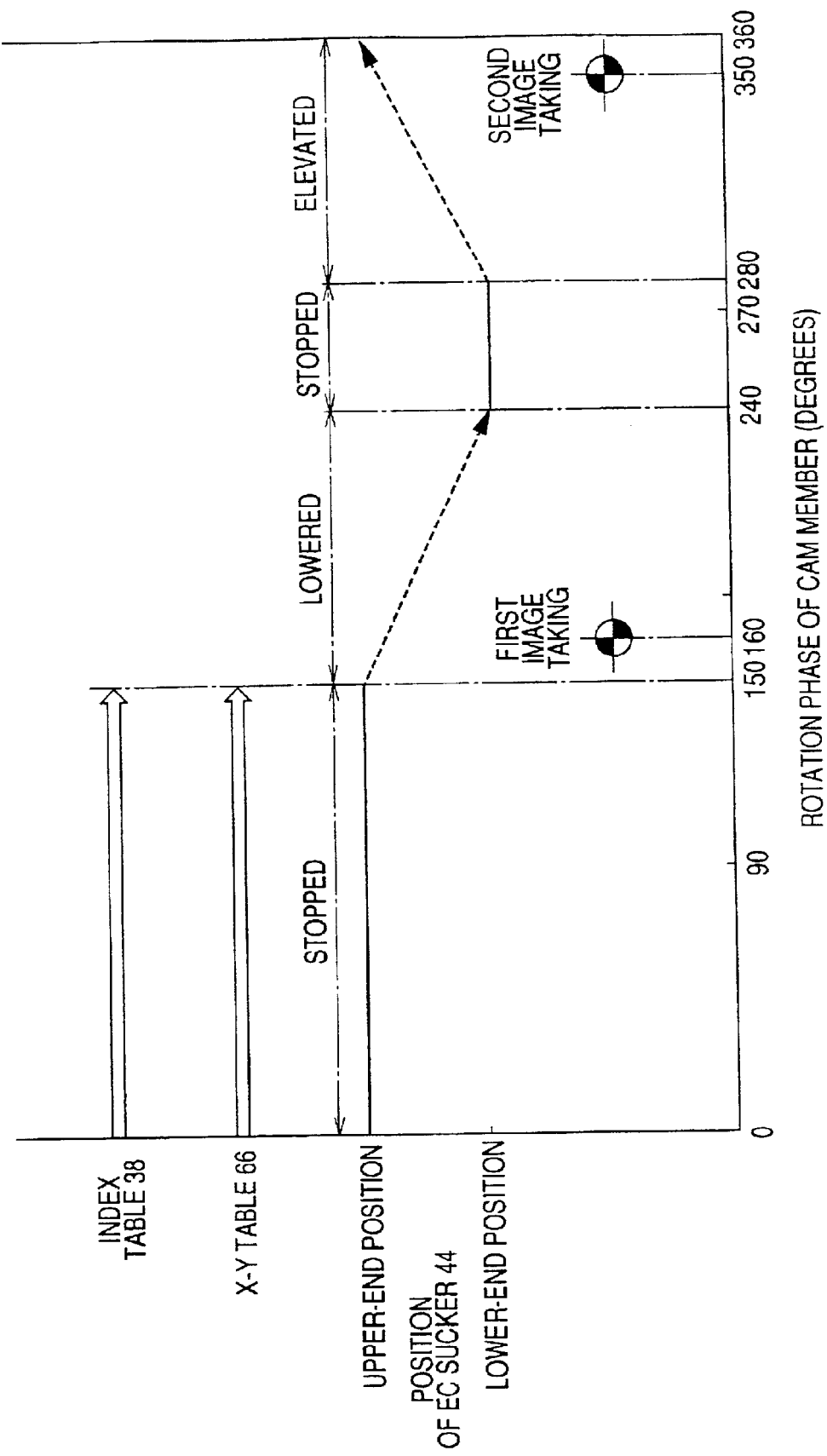
FIG. 6 is a timing chart indicating respective timings at which the CCD camera takes images.

FIG. 6 is a timing chart indicating respective timings at which the CCD camera 194 takes two images immediately before, and immediately after, each EC 22 is mounted on a PCB 20. The chart of FIG. 6 also indicates a relationship between respective timings at which the index table 38, the X-Y table 66 including the X table 106 and the Y table 104, and each EC sucker 44 are moved. Each time the index table 38 is intermittently rotated by 18 degrees by the above-mentioned cam mechanism (not shown), one EC 22 is mounted on a PCB 20. The horizontal axis of the timing chart of FIG. 6 is indicative of the rotation angle of a cam member of the cam mechanism (hereinafter, referred to as the "cam rotation angle"). The one full rotation (i.e., 360 degrees) of the cam member corresponds to the 18-degree rotation of the index table 38. Thus, each time the cam member is fully rotated, one EC 22 is mounted on a PCB 20. FIG. 6 shows that the index table 38 and the X-Y table 66 are moved during a time duration-when the cam rotation angle changes from 360 (i.e., 0) degrees to 150 degrees.

In addition, the elevating and lowering member 46 associated with the EC mounting position, and accordingly the EC sucker 44 of one EC mounting unit 40 being positioned at the EC mounting position, is lowered during a time duration when the cam rotation angle changes from 150 degrees to 240 degrees, and is elevated during a time duration when the cam rotation angle changes from 280 degrees to 360 degrees. In FIG. 6, the changes of the Z-direction position of each EC sucker 44 are indicated at broken straight lines. However, in fact, each EC sucker 44 is lowered and elevated at not a constant speed but smoothly accelerated and decelerated speeds. When the cam rotation angle takes 160 degrees and 350 degrees, the CCD camera 194 takes two images, that is, immediately before, and immediately after, each EC 22 is mounted on a PCB 20.

Figure 7A:
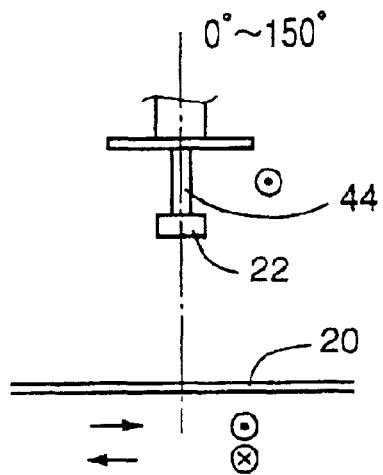
FIGS. 7A to 7D are views for illustrating sequential steps at which an EC held by an EC sucker is mounted on a PCB as an index table shown in FIG. 1 is rotated by a cam mechanism (not shown)
Figure 7B:
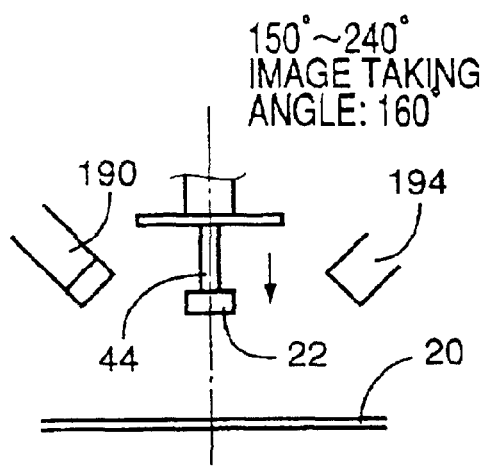
Figure 7C:
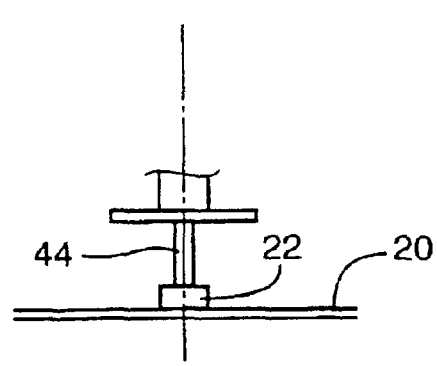
Figure 7D:
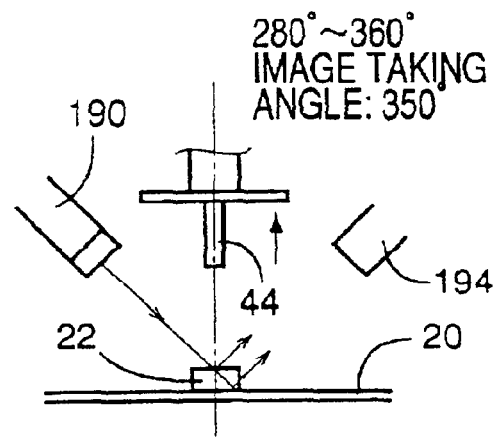

FIGS. 7A to 7D show a relationship between four ranges of the cam rotation angle and corresponding four relative positions of each EC sucker 44 and the PCB 20. FIGS. 7A to 7D correspond to the range of 0 to 150 degrees, the range of 150 to 240 degrees, the range of 240 to 280 degrees, and the range of 280 to 360 degrees, respectively, of the cam rotation angle. FIG. 7B shows that the CCD camera 194 takes an image at a timing corresponding to the cam rotation angle of 160 degrees, and FIG. 7D shows that the CCD camera 194 takes an image at a timing corresponding to the cam rotation angle of 350 degrees.

Figure 8A:
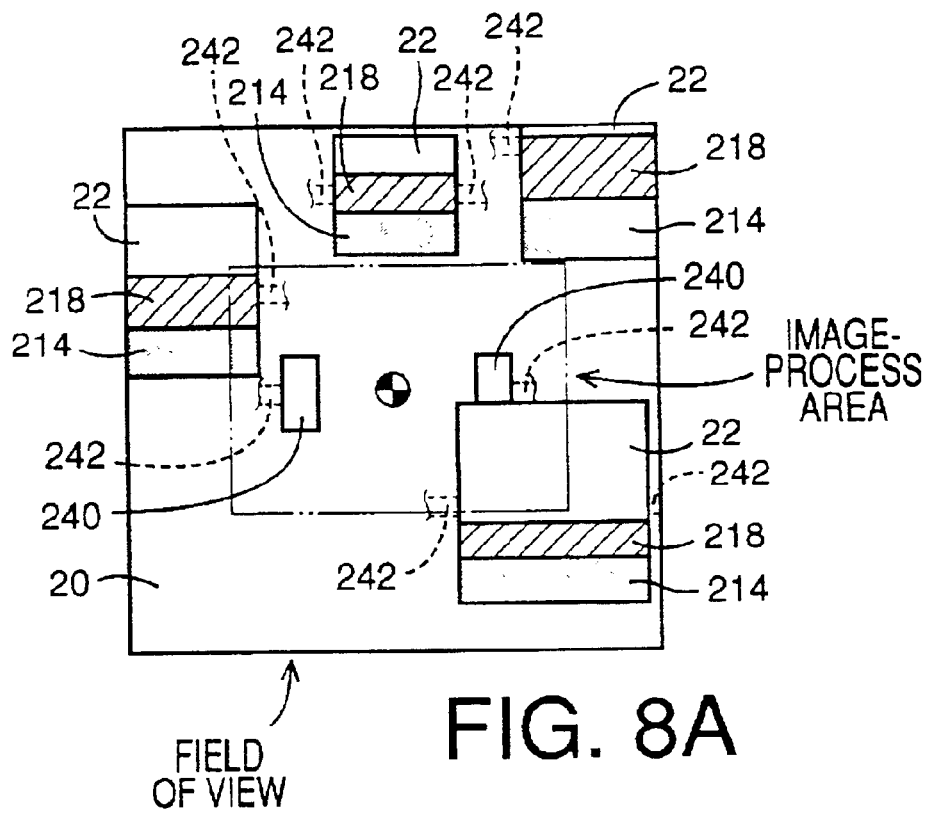
FIG. 8A is a view for illustrating an image present in a field of view of the CCD camera immediately before the EC is mounted on the PCB.

FIG. 8A shows an image taken by the CCD camera 194 at the timing corresponding to the cam rotation angle of 160 degrees. The taken image includes an EC-mount portion of the PCB 20, and its vicinity. Conductive pads 240 which are to be electrically connected to the EC 22 is provided in the EC-mount portion. Reference numeral 242 designates a lead which is completely hidden and whose image cannot be taken. At the timing corresponding to the cam rotation angle of 160 degrees, each EC sucker 44 is being lowered yet in the vicinity of its upper-end position. Therefore, neither the image of each EC sucker 44 nor the image of the EC 22 held thereby can be taken. The square image-take surface 216 of the CCD camera 194, indicated at solid line in FIG. 8A, corresponds to the field of view of the camera 194. The camera 194 can take the image of all portions present in the field of view thereof. However, what is needed for the EC-mounting inspection is only the image of each EC-mount portion (or each EC 22 mounted on the each EC-mount portion) and its vicinity. Therefore, the image processing device 196 processes only an image present in a predetermined rectangular area (indicated at two-dot chain line in FIG. 8A) of the field of view of the camera 194. This area will be referred to as the "image-process area". The image-processing operation of the processing device 196 includes producing a batch of image data representing the image present in the image-process area, and judging whether each EC 22 has been safely mounted on each EC-mount portion. The center of the image-process area coincides with the center of the field of view of the camera 196, and the size of the image-process area is so predetermined as to fully contain each EC 22, its shadow 214, and its vicinity, whichever size the each EC 22 may have, or even though the each EC 22 may have been mounted, on the PCB 20, out of position by more than a permissible amount. At the timing corresponding to the cam rotation angle of 160 degrees, neither the image of each EC sucker 44 nor the image of the EC 22 held thereby is present in the image-process area.

Figure 8B:
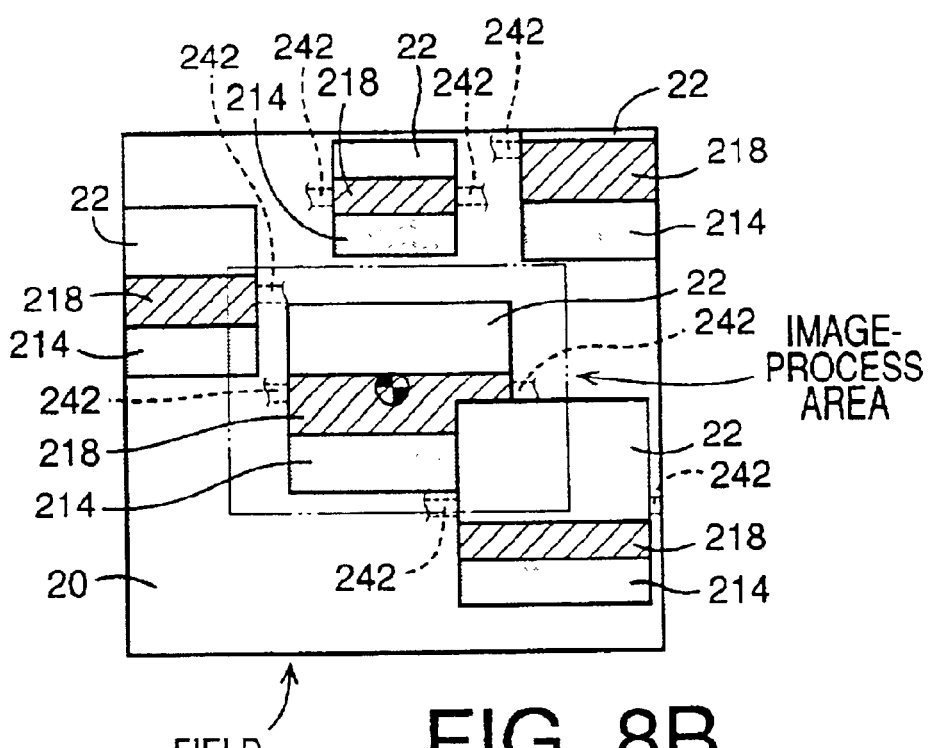
FIG. 8B is a view for illustrating an image present in the field of view of the CCD camera immediately after the EC is mounted on the PCB.

FIG. 8B shows an image taken by the CCD camera 194 at the timing corresponding to the cam rotation angle of 350 degrees. The taken image includes each EC 20 mounted on the PCB 20, and its vicinity. That is, immediately after each EC 22 is mounted on the PCB 20, the camera 194 takes an image of each EC 22 and its vicinity. At this timing, each EC sucker 44 is being elevated in the vicinity of its upper-end position. Thus, the image of each EC sucker 44 cannot be taken.

An input interface of the computer of the image processing device 196 selects, from all the analog signals corresponding to all the picture elements of the image-take surface 216 (i.e., field of view) of the CCD camera 194, the analog signals corresponding to the picture elements of the image-process area, converts the selected analog signals into sets of digital multilevel image data, and further converts the sets of multilevel image data into sets of bi-level or binary image data by comparing a value represented by each set of multilevel image data, with a threshold value. In the present embodiment, it is assumed that the input interface produces a set of binary image data representing the value of "1", for a picture element corresponding to a light image or a light object (i.e., object which reflects a large amount of light), and produces a set of binary image data representing the value of "0", for a picture element corresponding to a dark image or a dark object (i.e., object which reflects a small amount of light). Since the upper surface of the PCB 20 and the upper surface of the EC 22 are light (i.e., reflect a large amount of light), the input interface produces sets of binary image data each representing the value of "1". On the other hand, the input interface produces sets of binary image data each representing the value of "0", for picture elements corresponding to the shadow 214 of the EC 22 formed on the PCB 20 and the side surface 218 of the EC 22 not illuminated by the CPL emitter 190. The input interface employs the same threshold value in producing sets of binary image data based on the image taken before each EC 22 is mounted on the PCB 20 and in producing sets of binary image data based on the image taken after the each EC 22 is mounted on the PCB 20. The sets of binary image data produced based on the image taken at the timing corresponding to the cam rotation angle of 160 degrees are stored in the first image memory 220 in such a manner that each of the sets of binary image data is associated with the position of a corresponding one of the picture elements in the image-process area, and the sets of binary image data produced based on the image taken at the timing corresponding to the cam rotation angle of 350 degrees are stored in the second image memory 222 in such a manner that each of the sets of binary image data is associated with the position of a corresponding one of the picture elements in the image-process area.

Figure 11:
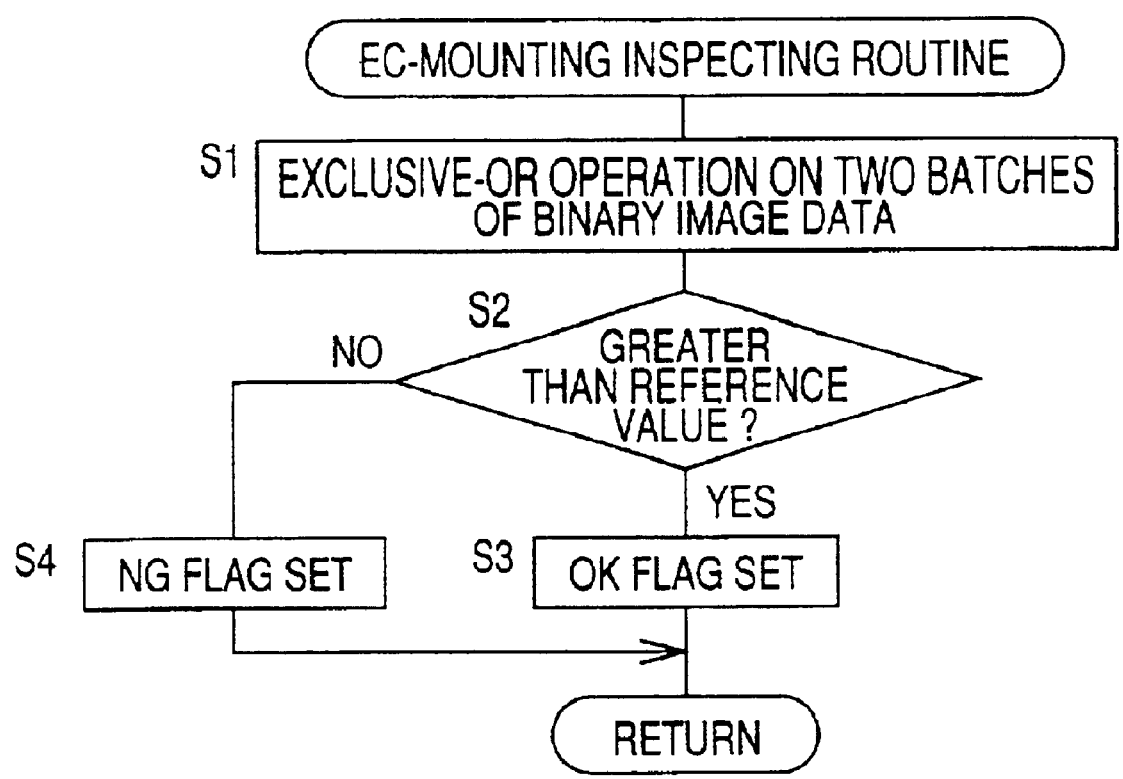
FIG. 11 is a flow chart representing an EC-mounting inspecting routine which is stored in a read only memory ("ROM") of the computer.

The computer of the image processing device 196 judges whether each EC 22 has been safely mounted on the PCB 20, based on the sets of binary image data stored in the first image memory 220 and the sets of binary image data stored in the second image memory 222, according to the EC-mounting inspecting routine of FIG. 11. First, at Step S1, the computer performs an exclusive-OR operation on the sets of binary image data stored in the first image memory 220 and the sets of binary image data stored in the second image memory 222.

In other words, two images of the same portion of the PCB 20 are taken at different times, two sets of binary image data are obtained for each of the picture elements, and an exclusive-OR operation is performed on the two sets of binary image data for the each picture element. In the case where two values represented by two sets of binary image data obtained for one picture element are equal to each other, the computer produces a set of binary data representing the value of "0" indicating that an image or a color corresponding to that picture element did not change. However, in the case where two values represented by two sets of binary image data obtained for another picture element differ from each other, the computer produces a set of binary data representing the value of "1" indicating that an image or a color corresponding to that picture element changed.

In the case where the EC 22 has been safely mounted on the PCB 20, the computer produces, by the exclusive-OR operation at Step S1, some sets of binary data each representing the value of "1". For the picture elements corresponding to the respective images of the shadow 214 and the side surface 218 formed by the EC 22 mounted on the PCB 20, the sets of binary image data stored in the first image memory 220 represent the value of "1", but the sets of binary image data stored in the second image memory 222 represent the value of "0". Thus, for those picture elements, the computer produces, at Step S1, sets of binary data each representing the value of "1". Therefore, if the ratio (or percentage) of the number of the sets of binary data each representing the value of "1" to the total number of all the picture elements of the image-process area is greater than a reference value, the computer can judge that the EC 22 has been safely mounted on the PCB 20 and, if not, the computer can judge that the EC 22 was not mounted on the PCB 20. Alternatively, the computer may be modified such that if the ratio (or percentage) of the number of the sets of binary data each representing the value of "0" to the total number of all the picture elements of the image-process area is smaller than a reference value, the computer judges that the EC 22 has safely been mounted on the PCB 20. The first judging manner is based on the number of the "changed" sets of binary image data, and the second judging manner is based on the number of the "unchanged" sets of binary image data. In the present embodiment, the computer uses the single, common reference value effective for all sizes of ECs 22 including the largest and smallest sizes of ECs 22. This reference value is stored in the RAM of the computer. An operator can change the stored reference value by operating an input device (e.g., a keyboard or a mouse).

At Step S2, the computer judges whether a value obtained by dividing the number of the sets of binary data each representing the value of "1" by the total number of all the picture elements of the image-process area is greater than a reference value. If a positive judgment is made at Step S2, the control of the computer goes to Step S3 to set the OK flag 224. On the other hand, if a negative judgment is made at Step S3, the control of the computer goes to Step S4 to set the NG flag 226. The OK flag 224 set at Step S3 or the NG flag 226 set at Step S4 is utilized by the control device 34. For example, unless the EC 22 has been safely mounted on the PCB 20, the control device 34 stops the EC mounting device 24, the PCB supporting device 28, and the EC supplying device 30, and calls an operator by operating a buzzer or an alarm lamp. In addition, the control device 34 may operate the EC mounting device 24 to mount another EC 22 on the EC-mount portion in question of the PCB 20. In the latter case, if the second EC has not been safely mounted, the control device 34 may stop the entire operation of the EC mounting system 10 and call the operator.

As is apparent from the foregoing description, the image processing device 196 provides a judging means for judging whether each EC 22 has been safely mounted on a PCB 20.

In the above-described embodiment, it has been assumed that light images are formed for the PCB 20 and those portions of each EC 22 that receive the CPL emitted by the CPL emitter 190. However, a dark image may be formed for the PCB 20, and light images may be formed for only those portions of each EC 22 that receive the CPL. In the latter case, if each EC 22 has been safely mounted on the PCB 20, the computer produces, at Step S1, sets of binary data each representing the value of "1" for the picture elements corresponding to the images of those portions of each EC 22 that receive the CPL. Thus, the computer can judge whether the EC 22 has been mounted on the PCB 20. Otherwise, a light image may be formed for the PCB 20, and a dark image may be formed for each EC 22. In the last case, if each EC 22 has been safely mounted on the PCB 20, the computer produces, at Step S1, sets of binary data each representing the value of "1" for the picture elements corresponding to the images of each EC 22, the side surface 218 thereof, and the shadow 214, and accordingly can judge whether the EC 22 has been safely mounted on the PCB 20.

Various sizes of image-process areas may be employed for various sizes of ECs 22, respectively. For example, each size of image-process area may be used for a corresponding size of ECs 22. Alternatively, all sizes of ECs 22 may be divided into a plurality of size groups each of which includes one or more sizes of ECs 22. In the latter case, each size of image-process area may be used for a corresponding one of the size groups.

In the above-described embodiment, the computer uses, for different sizes of ECs 22, the common reference value in judging whether each EC 22 has been safely mounted on a PCB 20. Thus, the RAM has only to store the least amount of data representing the single reference value. However, the reference value may be changed depending upon the sizes of ECs 22. In the latter case, the computer can judge, with higher reliability, whether each EC 22 has been safely mounted on a PCB 20.

Figure 13A:
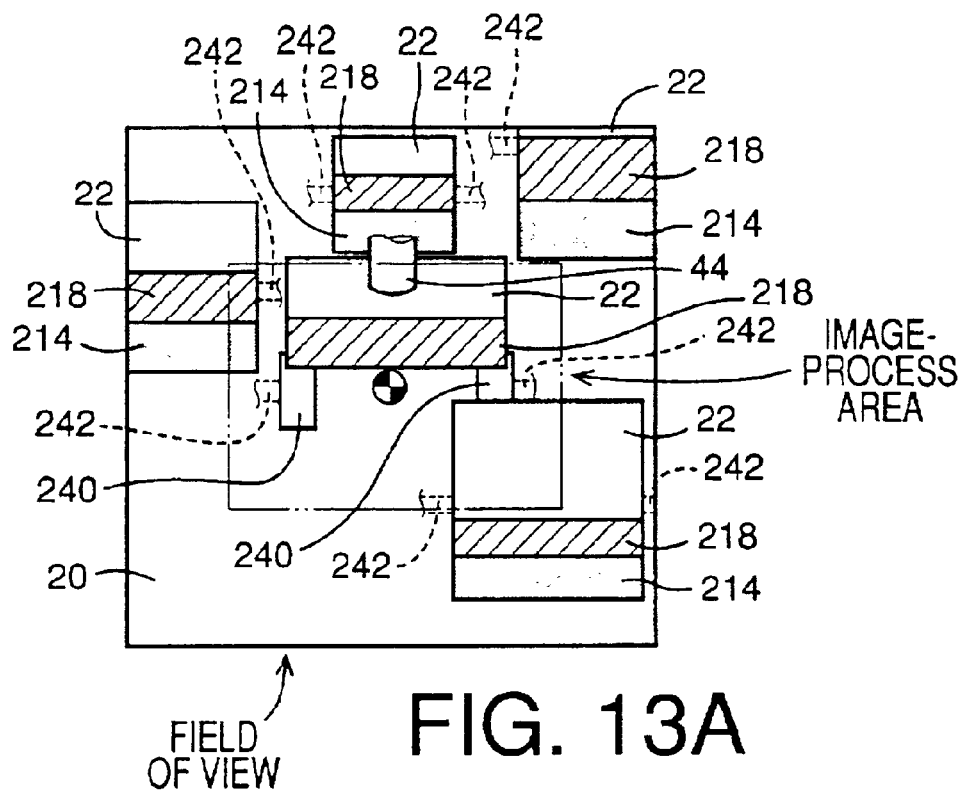
FIG. 13A is a view for illustrating an image present in a field of view of the CCD camera immediately before an EC is mounted on a PCB according to the timing chart of FIG. 12.
Figure 13B:
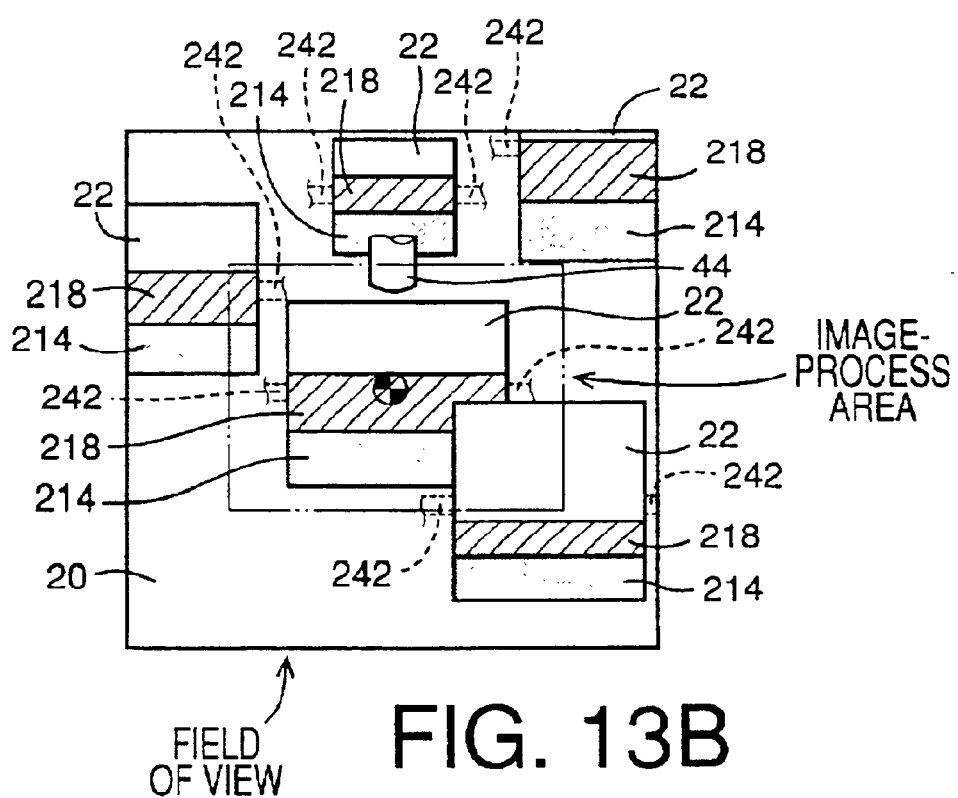
FIG. 13B is a view for illustrating an image present in the field of view of the CCD camera immediately after the EC is mounted on the PCB according to the timing chart of FIG. 12.

In the above-described embodiment, the CCD camera 194 is prevented from taking the image of each EC sucker 44 before or after each EC 22 is mounted on a PCB 20 by the each EC sucker 44. However, the CCD camera 194 may be so modified as to take the image of each EC sucker 44. In the latter case, for example, as indicated in a timing chart of FIG. 12, the CCD camera 194 takes two images at respective timings corresponding to the cam rotation angles of 190 and 330 degrees. At the two timings, each EC sucker 44 are moving in opposite directions, respectively, but are taking substantially the same height position. Thus, as shown in FIGS. 13A and 13B, the two images taken at the two timings include substantially the same image of each EC sucker 44.

Like the first embodiment shown in FIGS. 1 to 11, the second embodiment shown in FIGS. 12 and 13, the computer produces sets of binary image data based on the image taken immediately before each EC 22 is mounted on a PCB 20, and sets of binary image data based on the image taken immediately after the each EC 22 is mounted on the PCB 20, performs an exclusive-OR operation on two sets of binary image data for each of the picture elements, and judges whether the each EC 22 has been safely mounted on the PCB 20. The two images taken before and after the mounting of each EC 22 include substantially the same image of each EC sucker 44. More specifically described, before and after the mounting of each EC 22, the image of each EC sucker 44 is formed on substantially the same picture elements of the image-process area. Therefore, the computer produces, by the exclusive-OR operation, sets of binary data each representing the value of "0", for the picture elements corresponding to the image of each EC sucker 44. Thus, the image of each EC sucker 44 does not influence the result of the judgement about whether each EC 22 has been safely mounted on the PCB 20.

Before the mounting of each EC 22, the CCD camera 194 takes the image of the EC 22 held by each EC sucker 44; and after the mounting of the EC 22, the camera 194 takes the image of the EC 22 released from the EC sucker 44. Each of the two images includes the side surface 218 of the EC 22 not illuminated by the CPL and/or the shadow 214 of the EC 22. However, in the two images, the respective images of the side surface 218 and/or the shadow 214 take different positions, i.e., are formed on different picture elements. In addition, generally, the shadow 214 has different sizes in the two images, respectively. Therefore, if each EC 22 has been safely mounted on a PCB 20, a positive judgment is made at Step S2 of FIG. 11. Thus, the computer can judge whether each EC 22 has been safely mounted on a PCB 20.

In the case where one EC sucker 44 carries the sucked EC 22 to the EC mounting position but fails to mount the EC 22 on the PCB 20 for some reason, both the image taken at the timing corresponding to the cam rotation angle of 190 degrees and the image taken at the timing corresponding to the cam rotation angle of 330 degrees include the image of the one EC sucker 44 carrying the EC 22. Therefore, the two images are substantially identical with each other. Thus, a negative judgment is made at Step S2 of FIG. 11, and the computer recognizes that the EC 22 was not mounted on the PCB 20.

In addition, in the case where one EC sucker 44 fails to receive a certain EC 22 from the EC supplying device 30 and cannot mount the EC 22 on a PCB 20, two substantially identical images are taken at the two timings. Thus, the computer recognizes that the EC 22 has not been safely mounted on the PCB 20.

As compared with the first embodiment shown in FIGS. 1 to 11, the second embodiment shown in FIGS. 12 and 13 stops the index table 38 and the X-Y table 66 (or the PCB 20) at a later timing, and starts the members 38, 66 at an earlier timing, so that each EC 44 is lowered and elevated concurrently with the movements of the members 38, 66 for certain periods of time. When the cam follower 50 of each EC sucker 44 transfers from the main cam groove of the cylindrical cam 42 into the secondary cam groove 52 of the elevating and lowering member 46 provided at the EC mounting position, the member 46 starts lowering the EC sucker 44 concurrently with the rotation of the index table 38. The rotation of the index table 38 stops and each EC sucker 44 reaches the EC mounting position, before the member 46 reaches its lower-end position. Thus, the EC sucker 44 mounts the EC 22 on the PCB 20 after the rotation of the sucker 44 stops. After the EC 22 is mounted on the PCB 20, the elevating and lowering member 46 is elevated. Before the member 46 reaches its upper-end position, the rotation of the index table 38 starts. Immediately after the member 46 reaches its upper-end position, the cam follower 50 immediately transfers from the secondary cam groove 52 into the main cam groove of the cylindrical cam 42.

Figure 15:
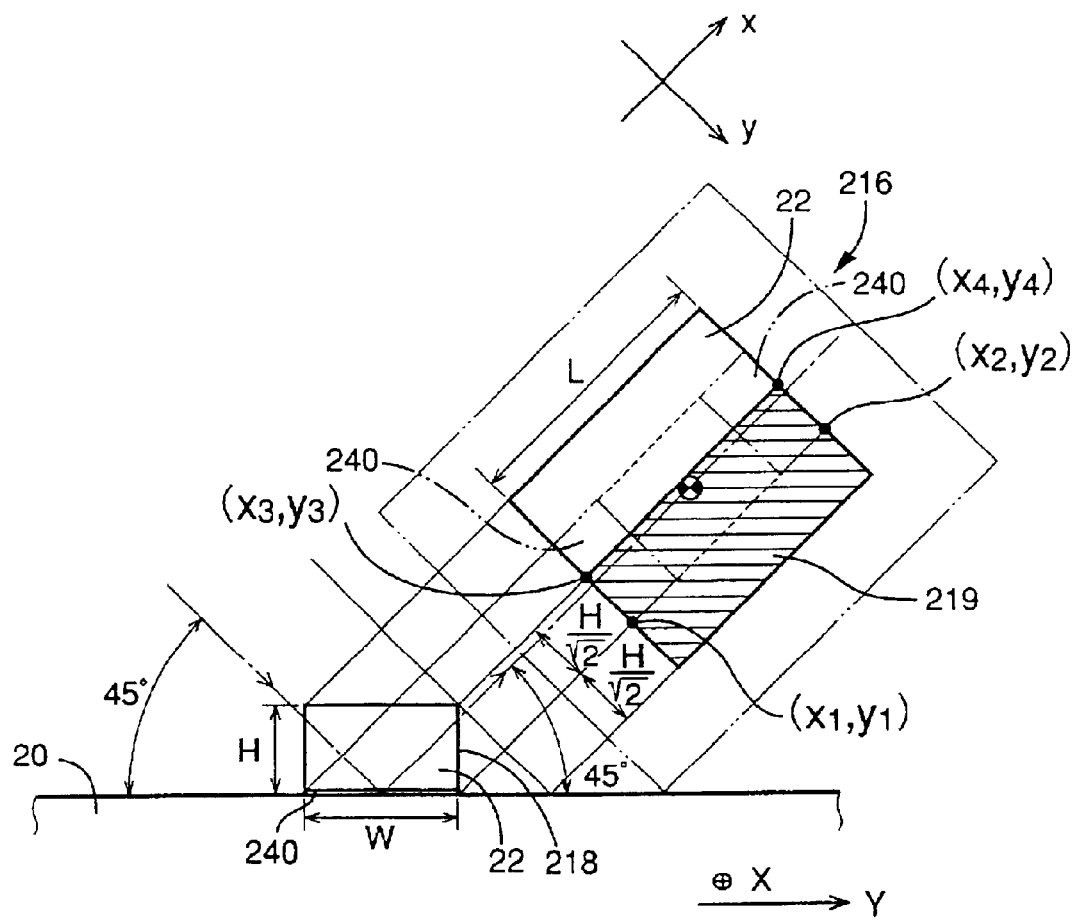
FIG. 15 is a view of the EC and the pads shown in FIG. 14 and an image formed on an image-take surface of a CCD camera of the inspecting device.

Although in each of the first embodiment shown in FIGS. 1 to 11 and the second embodiment shown in FIGS. 12 and 13 the EC-mounting inspecting device 32 judges whether each EC 22 has been safely mounted on a PCB 20, it is possible to additionally judge whether each EC 22 has been accurately mounted on an EC-mount portion of a PCB 20. The latter or second judgement is made by reference to conductive pads 240 provided on the PCB 20. It is assumed here, for easier understanding purposes only, that the vertices of each EC 22 are not chipped or rounded, i.e., are rectangular and that each EC 22 does not have any lead wires and has a rectangular parallelopiped shape. Additionally it is assumed that each EC 22 is closely attached to a PCB 20 with no space being left therebetween and that the angles contained by the lengthwise and widthwise directions of each EC 22 and the X and Y directions are very small and can be neglected. If those angles are great, the shape of the dark image 219 will be complex and it will be difficult to understand how the second judgment is made. It is further noted that FIG. 15 shows, for easier understanding purposes only, the pads 240 each with an exaggerated thickness. In fact, each pad 240 has a very small thickness which can be neglected.

Figure 14:
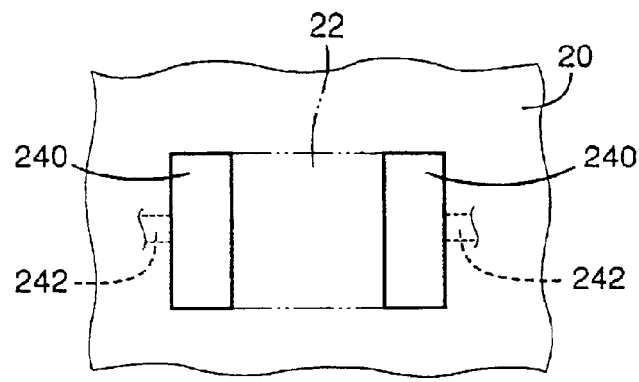
FIG. 14 is a plan view of an EC inspected by an inspecting device of another EC mounting system as a third embodiment of the present invention, and conductive pads provided on a PCB.
Figure 17:
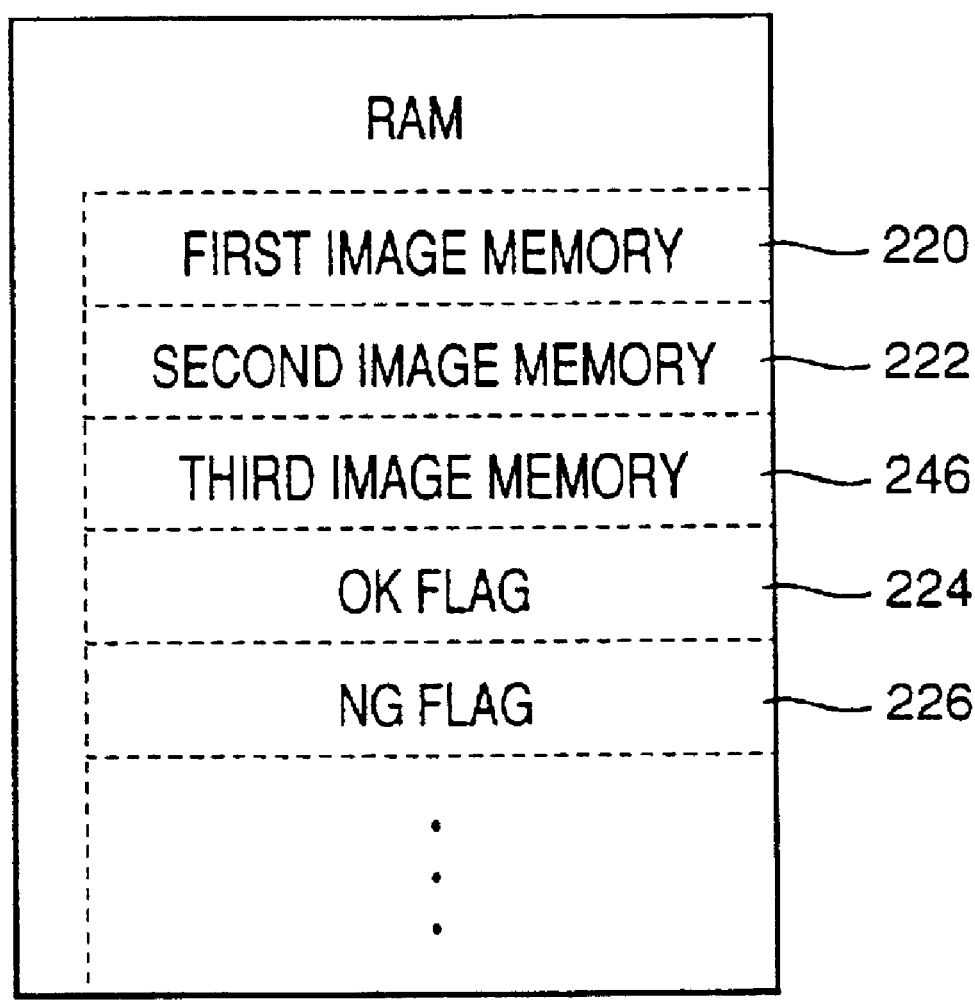
FIG. 17 is a view of a relevant portion of a RAM of a computer of an image processing device of the inspecting device.

Like the first embodiment shown in FIGS. 1 to 11, the present, third embodiment takes two images immediately before, and immediately after, each EC 22 is mounted on a PCB 20. Immediately before the mounting of the EC 22, an image of the pads 240 provided on the EC-mount portion of the PCB 20 and its vicinity is taken, as shown in FIG. 14. Immediately after the mounting of the EC 22, an image of the EC 22 mounted on the pads 240 and its vicinity is taken, as shown in FIG. 15. A batch of binary image data is produced based on each of the two images. More specifically described, the first image taken immediately before the mounting of the EC 22 includes the pads 240 and the PCB 20, and a value indicated by each of the sets of picture-element data included in a batch of multi-level image data obtained from the first image is compared with each of two different threshold values. Thus, two sets of binary image data are obtained for each of the picture elements of the image-process area. A first one of the two threshold values has the same function as that of the threshold value employed in the first embodiment shown in FIGS. 1 to 11, that is, is used for distinguishing light images such as the upper surface of the PCB 20 and the surfaces of the EC 22 that receive the CPL from the dark image 219 formed by the shadow 214 and the side surface 218 of the EC 22 that does not receive the CPL. A first batch of binary image data obtained by using the first threshold value is stored in the first image memory 220. The other or second threshold value has the function of distinguishing the image of the pads 240 from the image of the PCB 20, because the image of the pads 240 is needed for judging whether the EC 22 has been accurately mounted on the EC-mount portion of the PCB 20. A single threshold value would not be effective in completing the above-indicated two distinguishing operations. For example, in the case where the portions of the EC 22 that receive the CPL are darker than the PCB 20, the above-indicated second threshold value would not be able to distinguish the image of the portions of the EC 22 that receive the CPL, from the dark image 219 formed by the shadow 214 and the side surface 218 of the EC 22. Meanwhile, each pad 240 has the solder paste which has been applied thereto within the outline or profile thereof. A second batch of binary image data obtained by using the second threshold value represents the outlines of the pads 240, and is stored in a third image memory 246 (FIG. 17) which is provided in addition to the first and second image memories 220, 222.

The second image taken after the mounting of the EC 22 includes the image of the EC 22 mounted on the PCB 20 and its vicinity. A batch of multi-level image data obtained from the second image is converted into a batch of bi-level or binary image data, by using the same threshold value as that employed in the first embodiment shown in FIGS. 1 to 11. Thus, a third batch of binary image data distinguishing the dark image 219 formed by the shadow 214 and the side surface 218 of the EC 22 that does not receive the CPL, from the image of the other light portions that receive the CPL, is obtained and stored in the second image memory 222.

Figure 16:
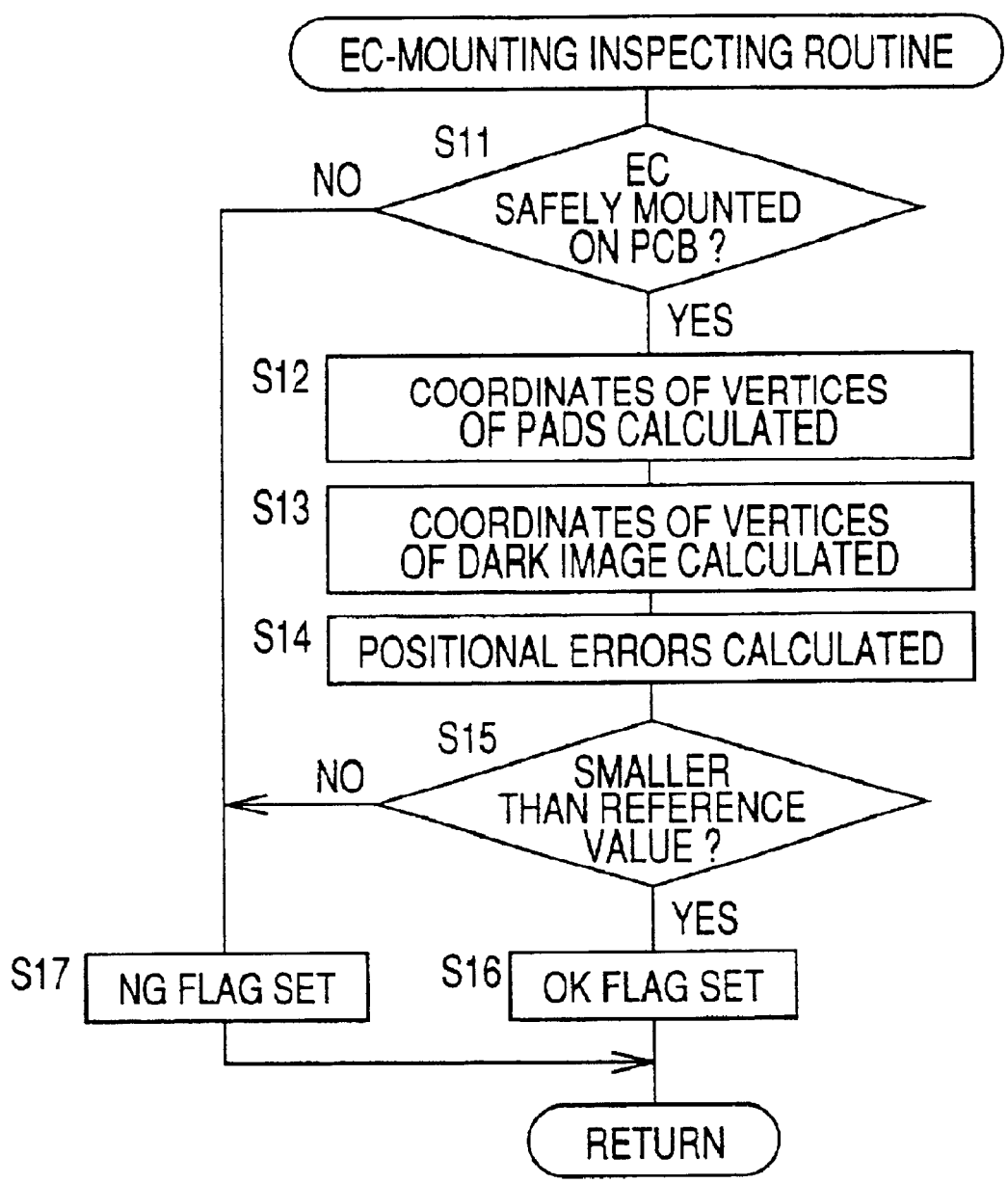
FIG. 16 is a flow chart representing an EC-mounting inspecting routine according to which whether an EC has been accurately mounted on a PCB is judged by the inspecting device.

After the three batches of binary image data are thus produced, the image processing device 196 or the computer thereof makes judgements about the state in which each EC 22 is mounted on a PCB 20, according to an EC-mounting inspecting routine represented by the flow chart of FIG. 16. First, the computer performs Step S11 identical with Steps S1 and S2 of the EC-mounting inspecting routine of FIG. 11, based on the first and third batches of binary image data stored in the first and second image memories 220, 222. That is, the computer judges whether the EC 22 has been safely mounted on the PCB 20. If a positive judgment is made at Step S11, the control of the computer goes to Step S12 to calculate, based on the second batch of binary image data stored in the third image memory 246, respective coordinates, $(x_1, y_1)$, $(x_2, y_2)$, of two vertices of the two pads 240 in the x-y coordinate plane provided on the image-take surface 216. The thus calculated x and y coordinates of the two vertices are used in judging whether the EC 22 has been accurately mounted on the EC-mount portion of the PCB 20.

In FIG. 15, the first image taken before the mounting of the EC 22 and the second image taken after the mounting of the EC 22 are superposed on each other. The rectangular image-process area included in the image-take surface 216 (i.e., the field of view of the CCD camera 194) is enclosed by the two-dot chain line. Although not the EC 22 and the pads 240 themselves but the respective images of the EC 22 and the pads 240 are formed on the image-take surface 216, the same reference numerals as used to designate the EC 22 and the pads 240 themselves are used, for easier understanding purposes only, to designate the respective images of the EC 22 and the pads 240, in FIG. 15. In addition, FIG. 15 shows the state in which the EC 22 has been accurately mounted on the EC-mount portion of the PCB 20.

Next, the control of the computer goes to Step S13 to calculate, based on the second batch of binary image data stored in the third image memory 246, respective coordinates, $(x_3, y_3)$, $(x_4, y_4)$, of two vertices of the dark image 219 that are shared by the image of the upper surface of the EC 22. Step S13 is followed by Step S14 to calculate the amounts of positional errors of the EC 22 relative to the pads 240. More specifically described, the amounts of positional errors of the EC 22 relative to the pads 240 are calculated based on the above-indicated two vertices $(x_1, y_1)$, $(x_2, y_2)$ of the two pads 240 and corresponding two vertices of the bottom surface of the EC 22. Since the EC 22 is mounted on the pads 240, whether the EC 22 has been accurately mounted on the EC-mount portion of the PCB 20 can be judged by judging whether the vertices of the bottom surface of the EC 22 have positional errors with respect to the vertices of the pads 240. In the case where an image is taken at a position right above the PCB 20, i.e., in a direction perpendicular to the PCB 20, the vertices of the image of the upper surface of the EC 22 completely coincide with those of the image of the bottom surface of the EC 22, on the image-take surface 216. In this case, therefore, the respective positions of the vertices of the image of the upper surface of the EC 22 can be compared with those of the vertices of the image of the pads 240. However, in the present embodiment, the CCD camera 194 takes images in a direction inclined by 45 degrees with respect to a straight line perpendicular to the upper surface of the PCB 20, and accordingly the vertices of the image of the upper surface of the EC 22 do not coincide, as shown in FIG. 15, with those of the image of the bottom surface of the EC 22 (indicated at broken line), on the image-take surface 216. Thus, the respective positions of the vertices of the image of the upper surface of the EC 22 cannot be compared with those of the vertices of the image of the pads 240. Hence, at Step S14, the computer calculates the positions (i.e., x and y coordinates) of the vertices of the image of the bottom surface of the EC 22, and calculates the amounts of positional errors of the thus calculated positions from the respective positions of the vertices $(x_1, y_1)$, $(x_2, y_2)$ of the image of the two pads 240.

FIG. 15 shows that two of four vertices defining the image of the bottom surface of the EC 22 are spaced, on the x-y coordinate plane, from the corresponding two vertices $(x_3, y_3)$, $(x_4, y_4)$ of the dark image 219, in a positive direction along the y axis of the x-y coordinate plane, by respective amounts or distances proportional to the height, H, of the EC 22. The respective x coordinates of the two vertices of the image of the bottom surface of the EC 22 are equal to the respective x coordinates of the corresponding two vertices of the image of the upper surface of the EC 22, and the respective y coordinates thereof can be obtained by calculation. Since the image of the height H of the EC 22 formed in the x-y coordinate plane on the image-take surface 216 has a length, $H/\sqrt{2}$, the respective y coordinates of the two vertices of the image of the bottom surface of the EC 22 can be calculated in a manner described below.

Here, it is assumed that on the X-Y coordinate plane parallel to the plane of the PCB 20 the amounts of positional errors of the two vertices of the bottom surface of the EC 22 from the corresponding two vertices $(x_1, y_1)$, $(x_2, y_2)$ of the pads 240 are calculated. That is, the x and y coordinates of each of the vertices of the image of the upper surface of the EC 22, the vertices of the image of the bottom surface of the EC 22, and the vertices of the image of the pads 240, formed on the x-y coordinate plane, are transferred onto the X-Y coordinate plane, and then the amounts of positional errors are calculated. Although the upper and bottom surfaces of the EC 22 have different height positions, the vertices of the upper surface and the vertices of the bottom surface are placed on the common X-Y coordinate plane, and the X and Y coordinates of each of the vertices of the bottom surface are calculated based on the X and Y coordinates of a corresponding one of the vertices of the upper surface. The X coordinate of each of the vertices of the bottom surface is equal to that of a corresponding one of the vertices of the upper surface, but the Y coordinate of each of the vertices of the bottom surface is greater than that of a corresponding one of the vertices of the upper surface, by a distance equal to the length of the projection, onto the X-Y coordinate plane, of the positional error $H/\sqrt{2}$ obtained on the x-y coordinate plane, i.e., equal to the height H of the EC 22. Therefore, assuming that the respective X and Y coordinates of the two vertices of the upper surface of the EC 22 on the X-Y coordinate plane are $(X_3, Y_3)$ and $(X_4, Y_4)$, those of the corresponding two vertices of the bottom surface of the EC 22 are $(X_3, Y_3+H)$ and $(X_4, Y_4+H)$. The X and Y coordinates, $x_3$, $x_4$, $y_3$, $y_4$, of the two vertices can be calculated from the x and y coordinates, $x_3$, $x_4$, $y_3$, $y_4$, of the same on the x-y coordinate plane, as follows: $X_3=x_3$, $X_4=x_4$, $Y_3=\sqrt{2}\cdot y_3$, and $Y_4=\sqrt{2}\cdot y_4$.

In addition, assuming that the respective X and Y coordinates of the two vertices of the two pads 240 on the X-Y coordinate plane are $(X_1, Y_1)$ and $(X_2, Y_2)$, the following equations are obtained: $X_1=x_1$, $X_2=x_2$, $Y_1=\sqrt{2}\cdot y_1$, and $Y_2=\sqrt{2}\cdot y_2$. Therefore, the respective amounts of X-direction positional error of the two vertices of the bottom surface of the EC 22 from the corresponding two vertices of the two pads 240, and the respective amounts of Y-direction positional error of the two vertices of the bottom surface of the EC 22 from the corresponding two vertices of the two pads 240 are obtained according to the first to fourth expressions (1) to (4), respectively:

$$\text{(first amount of X-direction positional error)}=X_3-X_1 \quad (1)$$

$$\text{(first amount of Y-direction positional error)}=(Y_3+H)-Y_1 \quad (2)$$

$$\text{(second amount of X-direction positional error)}=X_4-X_2 \quad (3)$$

$$\text{(second amount of Y-direction positional error)}=(Y_4+H)-Y_2 \quad (4)$$

Step S14 is followed by Step S15 to compare the absolute value of each of the four amounts of positional error with a reference value. If each amount of positional error is smaller than the reference value, the computer judges that there is substantially no (harmful) positional error. More specifically described, if the computer finds for one of the two vertices that each of the respective absolute values of the X-direction and Y-direction positional error amounts is smaller than the reference value, the computer compares, for the other vertex, each of the respective absolute values of the X-direction and Y-direction positional error amounts with the reference value. If the computer judges for both of the two vertices that there are substantially no positional errors, it makes a positive judgment at Step S15. Then, the control of the computer goes to Step S16 to set the OK flag 224. On the other hand, if the computer judges for one of the two vertices that there is a positional error, it does not compare for the other vertex and makes a negative judgment at Step S15. Then, the control of the computer goes to Step S17 to set the NG flag 226. In the case where the computer judges for one of the two vertices that there are substantially no positional errors but judges for the other vertex that there is a positional error, it makes a negative judgment at Step S15 and the control thereof goes to Step S17.

The respective amounts of X-direction and Y-direction positional errors of the two vertices of the bottom surface of the EC 22 from the corresponding two vertices of the two pads 240 are calculated by subtracting the X and Y coordinates of each of the latter vertices from those of a corresponding one of the former vertices. A positive or negative sign of each of the thus calculated amounts of positional errors is indicative of a positive or a negative direction in which the EC 22 has the each amount of positional error along the X or Y axis of the X-Y coordinate plane. The thus calculated amounts of positional errors of the two vertices of the bottom surface of the EC 22 from the corresponding two vertices of the two pads 240 can be removed by moving at least one of the EC 22 and the PCB 20 relative to the other so that the two vertices of the bottom surface of the EC 22 coincide with the corresponding two vertices of the two pads 240.

In the above-described third embodiment, it has been assumed that each EC 22 is closely or tightly attached to the upper surface of a PCB 20, with no space being left therebetween. However, it is possible that an EC 22 be unfixed on the upper surface of a PCB 20, with a substantial space being left therebetween. Thus, in a fourth embodiment of the present invention, the image processing device 196 or the computer thereof judges whether each EC 22 is unfixed on the upper surface of a PCB 20, according to an EC-mounting inspecting routine represented by the flow chart of FIG. 18. Here, it is assumed that each EC 22 is precisely produced and accordingly has a precise height which is sufficiently greater than a predetermined value.

First, the computer performs Step S21 identical with Steps S1 and S2 of the EC-mounting inspecting routine of FIG. 11. If the EC 22 has not been safely mounted on the PCB 20, that is, if a negative judgment is made at Step S21, the control of the computer goes to Step S29 to set the NG flag 226, and then the computer terminates the present control cycle according to the routine of FIG. 18. On the other hand, if a positive judgement is made at Step S21, the control of the computer goes to Steps S22 to S26 to judge whether the EC 22 is unfixed on the PCB 20.

Steps S22 and S23 are identical with Steps S12 and S13 of the EC-mounting inspecting routine of FIG. 16. Step S23 is followed by Step S24 to calculate, in the y direction, the length of the dark image 219, i.e., the combined image of the shadow 214 and the side surface 218 of the EC 22, and then by Step S25 to calculate the amount of spacing of the bottom surface of the EC 22 from the upper surface of the PCB 20. The amount of spacing can be calculated by subtracting the above-indicated predetermined value from the y-direction length of the dark image 219, i.e., the combined image of the shadow 214 and the side surface 218 of the EC 22. The predetermined value is predetermined based on the height H of the EC 22. As shown in FIG. 15, if there is no amount of spacing of the EC 22 from the PCB 20, the y-direction length of the dark image 219, i.e., the combined image of the shadow 214 and the side surface 218 of the EC 22 is equal to √2·H. Accordingly, the predetermined value is predetermined to be equal to √2·H. Hence, the height H of each sort of EC 22 is stored in the RAM of the computer by the operator.

Step S25 is followed by Step S26 to judge whether there is a practically harmful amount of spacing of the EC 22 from the PCB 20, by judging whether the calculated amount of spacing is smaller than a reference value. If the calculated amount of spacing is smaller than the reference value, that is, if there is no harmful amount of spacing, the computer makes a positive judgment at Step S26, and then goes to Step S27 identical with Steps S14 and S15 of the EC-mounting inspecting routine of FIG. 16, that is, judges whether the EC 22 has been accurately mounted on the EC-mount portion of the PCB 20.

Figure 18:
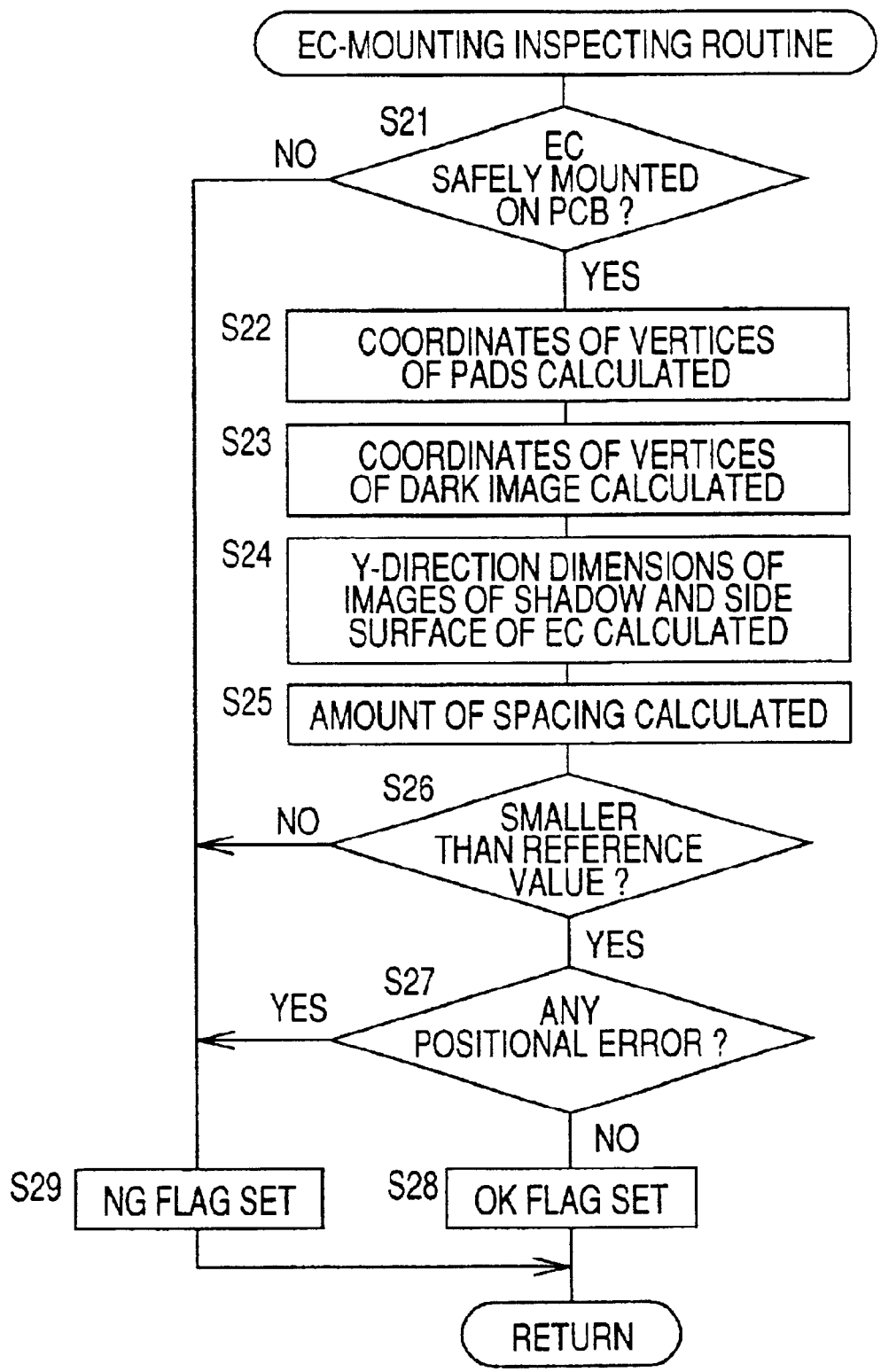
FIG. 18 is a flow chart representing an EC-mounting inspecting routine according to which whether an EC has been safely mounted on a PCB, whether the EC is unfixed on the PCB, and whether the EC has been accurately mounted on the PCB are judged by an inspecting device of another EC mounting system as a fourth embodiment of the present invention.

If the calculated amount of spacing is not smaller than the predetermined value, i.e., if a negative judgment is made at Step S26, then the control of the computer goes to Step S29 to set the NG flag 226 and terminates the current control cycle according to the routine of FIG. 18. That is, if it is judged that there is a harmful amount of spacing of the EC 22 from the PCB 20, the computer does not judge, at Step S27, whether the EC 22 has been accurately mounted on the EC-mount portion of the PCB 20.

As described previously in connection with the first embodiment shown in FIGS. 1 to 11, the height position of the PCB 20 can be adjusted by the height-position adjusting device 64. Therefore, when the CCD camera 194 takes a first image immediately before, and a second image immediately after, each EC 22 is mounted on a PCB 20, the height position of the PCB 20 may be adjusted so that the height position of the upper surface of the EC 22 when the second image is taken is equal to that of the upper surface of the PCB 20 (or the pads 240) when the first image is taken. In the latter case, whether the EC 22 has been accurately mounted on the EC-mount portion of the PCB 20 can be judged without determining the coordinates of the vertices of the bottom surface of the EC 22 based on those of the vertices of the dark image 219 (i.e., the upper surface of the EC 22). Since the image of the upper surface of the EC 22 should coincide with that of the pads 240, as shown in FIG. 19, whether there is any positional error can be judged by comparing the coordinates of the vertices of the upper surface of the EC 22 with those of the vertices of the pads 240.

Figure 19:
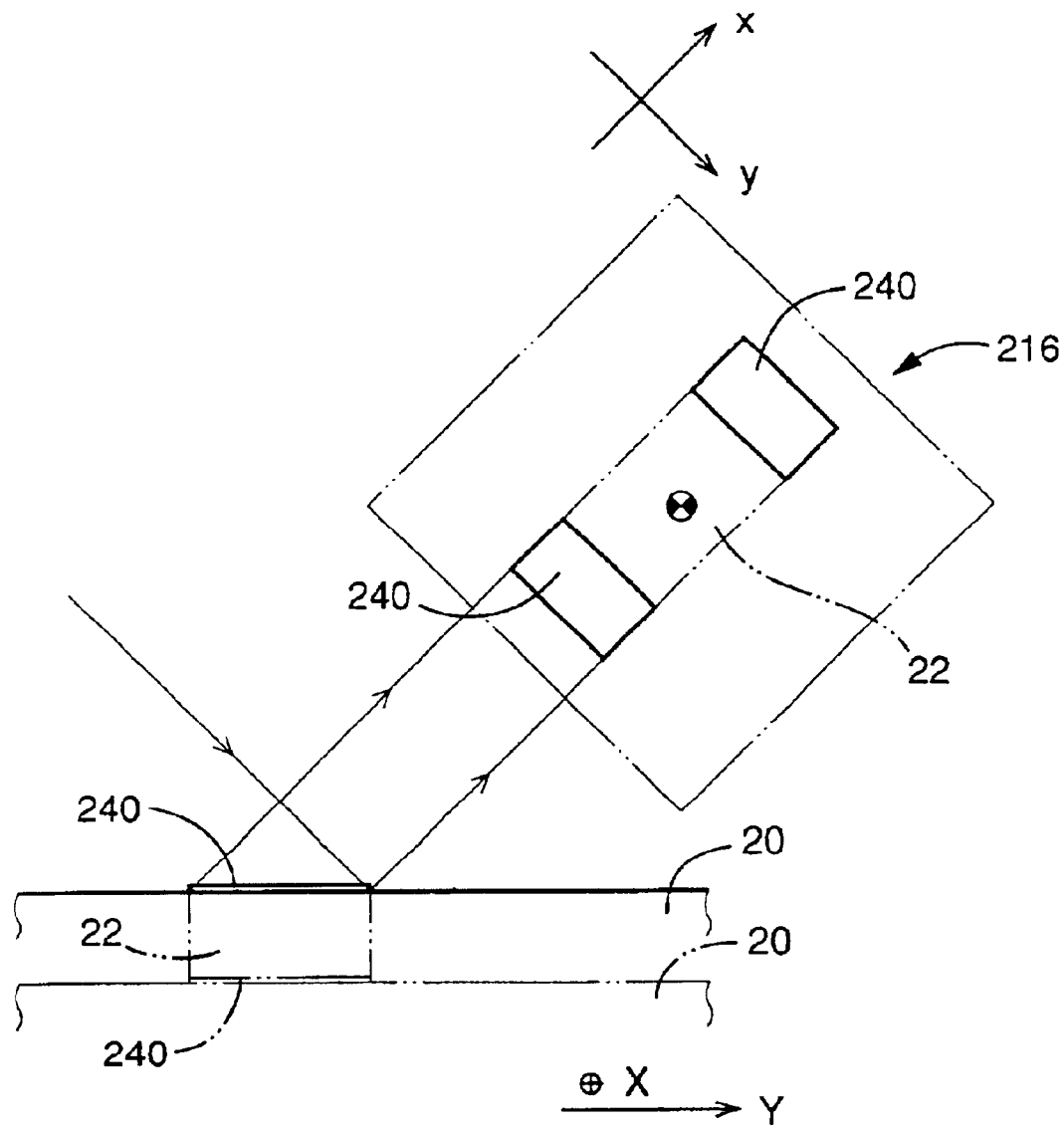
FIG. 19 is a view of an EC and conductive pads and respective images of the EC and the pads that are taken in the case where the EC is mounted on a PCB which can be elevated and lowered.

In the above-indicated case, before the EC 22 is mounted on the PCB 20, the PCB 20 may be positioned at its lower-end position by the height-position adjusting device 64, as indicated at two-dot chain line in FIG. 19; before an image is taken before the EC 22 is mounted on the PCB 20, the PCB 20 may be elevated by a distance equal to the height H of the EC 22, as indicated at solid line, and then an image before the mounting of the EC may be taken; in this state the EC 22 may be mounted on the PCB 20; and then the PCB 20 may be lowered by the same distance, and an image after the mounting of the EC 22 may be taken. Alternatively, before the EC 22 is mounted on the PCB 20, the PCB 20 may be positioned at its lower-end position; before an image is taken before the EC 22 is mounted on the PCB 20, the PCB 20 may be elevated by a distance equal to the height H of the EC 22, and then an image before the mounting of the EC may be taken; the PCB 20 may be lowered by the same distance, and in this state the EC 22 may be mounted on the PCB 20; and then an image after the mounting of the EC 22 may be taken. Since the height H of each EC 22 is stored in the ROM of the computer, the height-position adjusting device 64 elevates and lowers the PCB 20 according to the height H of the each EC 22.

Figure 20:
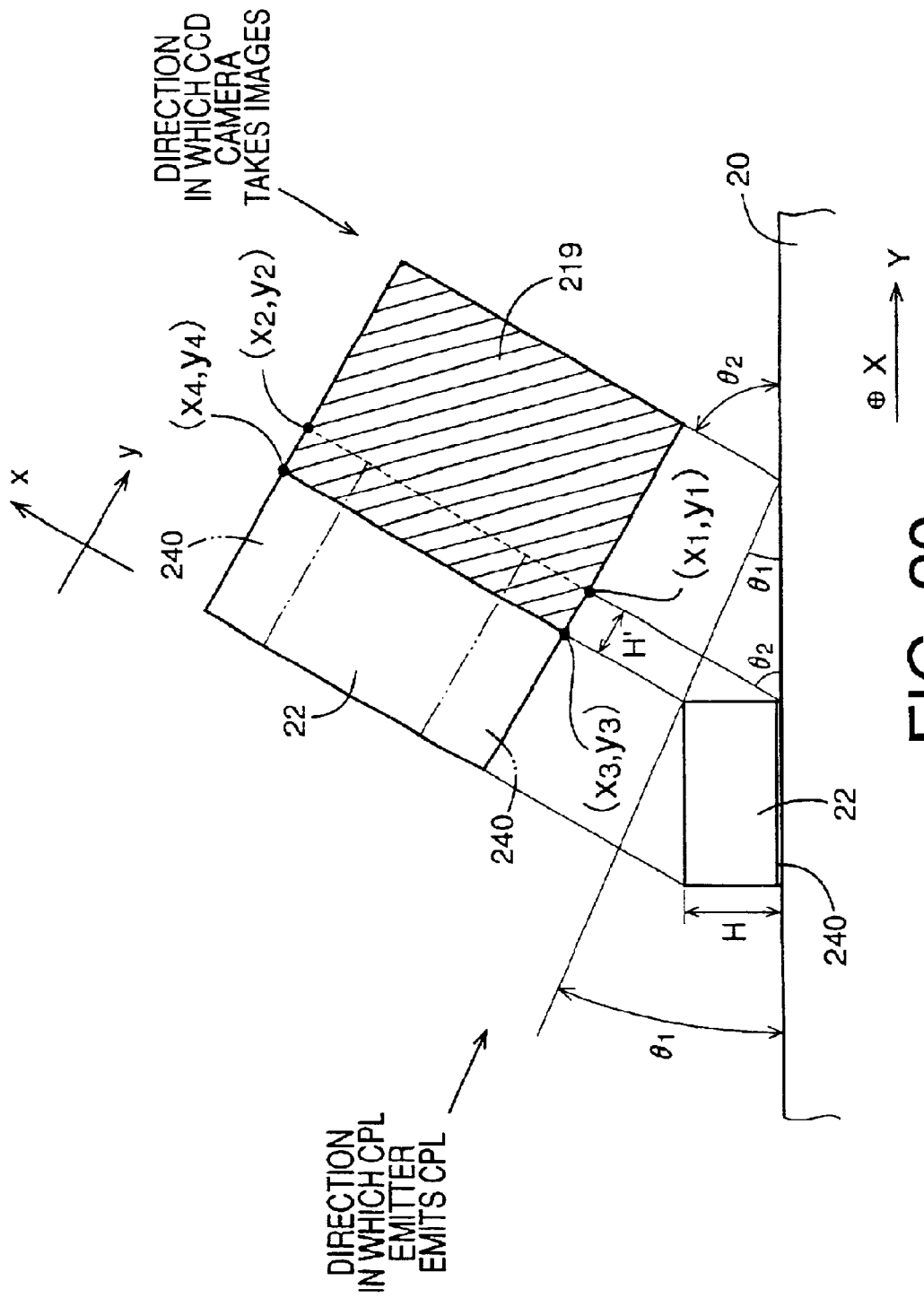
FIG. 20 is a view of an EC and conductive pads and respective images of the EC and the pads that are taken in the case where a CPL emitting device of an inspecting device of another EC mounting system as a fifth embodiment of the present invention emits a CPL at an arbitrary angle with respect to a straight line perpendicular to a PCB and a CCD camera of the inspecting device takes the images at an arbitrary angle with respect to the straight line.

In each of the first to fourth embodiments of the present invention, the angle at which the CPL emitter 190 emits the CPL and the angle at which the CCD camera 194 takes images are each inclined by 45 degrees with respect to a straight line perpendicular to the upper surface of the PCB 20. However, this is not essentially required. It is possible to select any other desired inclination angle, as shown in FIG. 20. In this fifth embodiment, whether each EC 22 has been accurately mounted on an EC-mount portion of a PCB 20 is judged like in the third embodiment shown in FIGS. 14 to 17, that is, by first calculating the coordinates of the vertices of the bottom surface of the EC 22 and then comparing the calculated coordinates with those of the vertices of the pads 240. More specifically described, assuming that the CPL emitter 190 emits the CPL at an angle, 61, with respect to the straight line perpendicular to the upper surface of the PCB 20, the CCD camera 194 takes images at an angle, $\theta_2$, with respect to the straight line, and the EC 22 has a height, H, the computer calculates a distance, H', between the vertices of the upper surface of the EC 22 and the corresponding vertices of the bottom surface of the EC 22 and calculates, based on the calculated distance H', the coordinates of each of the vertices of the bottom surface of the EC 22.

Figure 21:
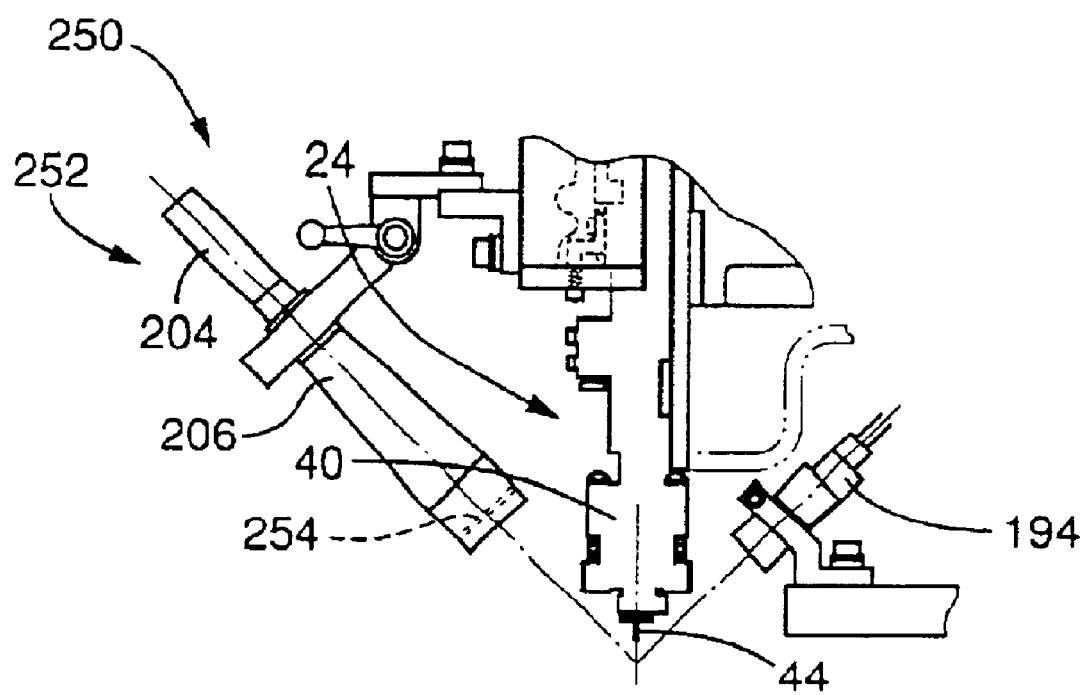
FIG. 21 is a front elevation view of a slit-light emitting device as a lighting device of an inspecting device of another EC mounting system as a sixth embodiment of the present invention.

In each of the first to fifth embodiments, the CPL emitter 190 is employed as the lighting device. However, the CPL emitter 190 as the lighting device may be replaced with a device which emits one or more slit lights. For example, the EC-mounting inspecting device 32 may be replaced with an EC-mounting inspecting device 250, shown in FIG. 21, which includes a slit-light emitting device 252 including a semiconductor laser device 204, a beam expander 206, and a slit plate 254 which converts the parallel rays outputted from the expander 206, into one or more slit lights. It is possible to prepare various sorts of slit plates 254 having different slit widths and/or different numbers of slits, and select an appropriate one of those slit plates 254. In addition, it is possible to employ a different sort of slit-light emitting device which emits one or more slit lights, such as one which includes a single cylindrical or aspherical lens, or a combination of a plurality of cylindrical or aspherical lenses.

Figure 22A:
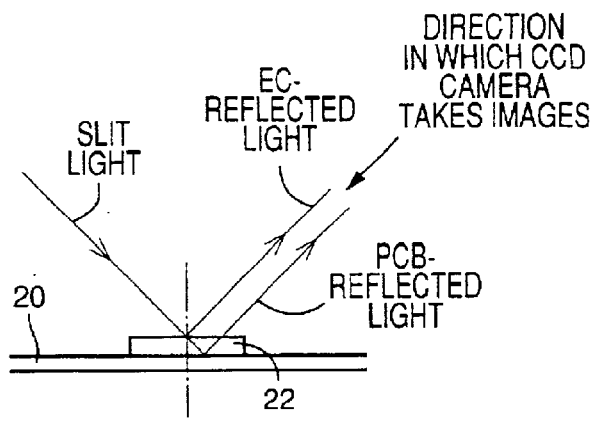
FIG. 22A is a view showing a geometric relationship between a slit light emitted by the slit-light emitting device of FIG. 21 and a reflected slit light.
Figure 22B:
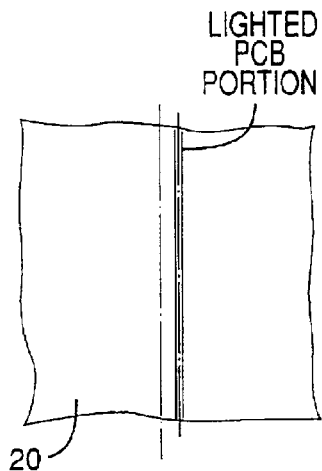
FIG. 22B is a view of the slit light incident to a PCB.
Figure 22C:
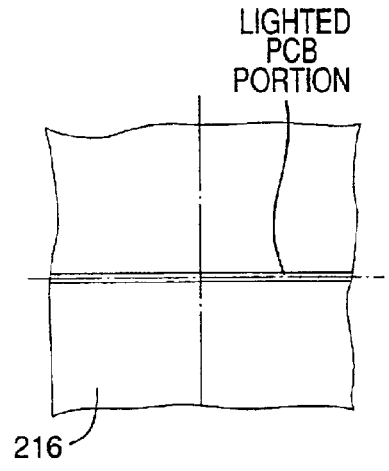
FIG. 22C is a view of an image formed on an image-take surface of a CCD camera of the inspecting device before an EC is mounted on the PCB.

The slit-light emitter 252 is provided so as to emit the slit light toward the center of the upper surface of the EC 22 mounted on the EC-mount portion of the PCB 20. FIG. 22A shows a geometric relationship among the slit light, a reflected light from the upper surface of the EC 22 (i.e., EC-reflected light), and a reflected light from the upper surface of the PCB 20 (i.e., PCB-reflected light). FIG. 22B shows a straight slit light incident to the upper surface of the PCB 20, in the state in which the EC 22 has not been mounted on the PCB 20. Hereinafter, a portion of the upper surface of the PCB 20 to which the slit light is incident will be referred to as the "lighted PCB portion". FIG. 22C shows a straight light image which is formed by the PCB-reflected light from the lighted PCB portion, on the image-take surface 216.

Figure 22D:
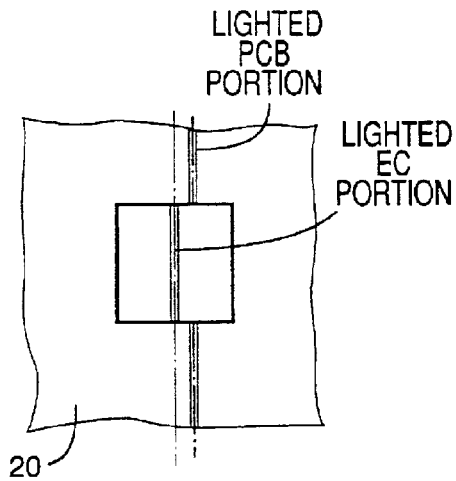
FIG. 22D is a view of the slit light incident to the PCB and the EC mounted on the PCB.
Figure 22E:
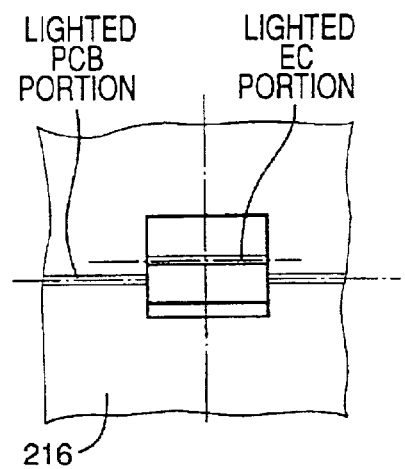
FIG. 22E is a view of an image formed on the image-take surface of the CCD camera of the inspecting device.

FIG. 22D shows a slit light which is, after the EC 22 is mounted on the PCB 20, incident to the EC 22 and the PCB 20. Hereinafter, a portion of the upper surface of the EC 22 to which the slit light is incident will be referred to as the "lighted EC portion". Since the slit-light emitter 252 and the CCD camera 194 are inclined or oriented at different angles with respect to the PCB 20, the lighted PCB portion and the lighted EC portion are present on different straight lines. Accordingly, FIG. 22E shows a light image formed by the EC-reflected light from the lighted EC portion and a light image formed by the PCB-reflected light from the lighted PCB portion, such that the two light images are present on different straight lines. Therefore, if each of the two images taken before and after the mounting of the EC 22 includes a straight light image formed by the reflected slit light, the computer judges that the EC 22 has not been safely mounted on the PCB 20. On the other hand, if the image taken before the mounting of the EC 22 includes a straight light image formed by the reflected slit light and the image taken after the mounting of the EC 22 includes a discontinuous light image formed by the reflected slit light, the computer judges that the EC 22 has been safely mounted on the PCB 20.

In the present embodiment, it is not essentially required that the angle at which the slit-light emitter 252 emits the slit light and the angle at which the CCD camera 194 takes the two images be each inclined by 45 degrees with respect to a straight line perpendicular to the upper surface of the PCB 20. In fact, it is possible to select any other inclination angle for each of the two devices 252, 194.

In each of the first to sixth embodiments of the present invention, the EC mounting device 24 includes the plurality of EC suckers 44 which are revolved around the common axis line while being sequentially stopped at the EC sucking position and the EC mounting position. However, the EC mounting device 24 may be replaced with a device which includes an EC sucker and linearly moves the EC sucker so that the EC sucker takes an EC from an EC supplying device and mounts the EC on a PCB. For example, the EC mounting system 10 shown in FIG. 1 may be replaced with an EC mounting system 400 including an EC mounting device 402 which includes an EC sucker 404 and linearly moves the EC sucker 404 in each of an X direction and Y direction which are perpendicular to each other on a horizontal plane so that the EC sucker 404 is moved to an arbitrary position on the horizontal plane.

Figure 23:
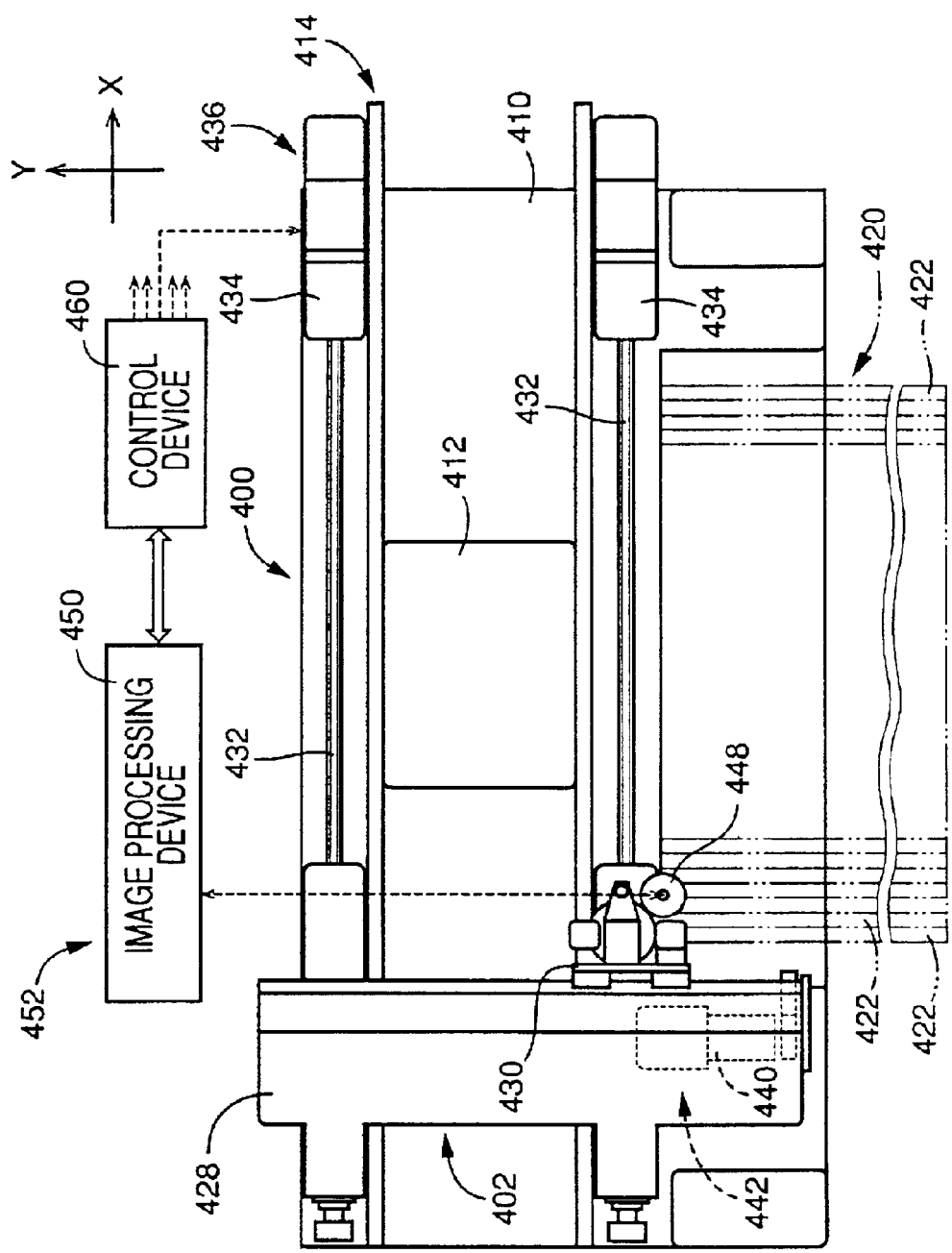
FIG. 23 is a plan view of another EC mounting system as a seventh embodiment of the present invention.
Figure 24:
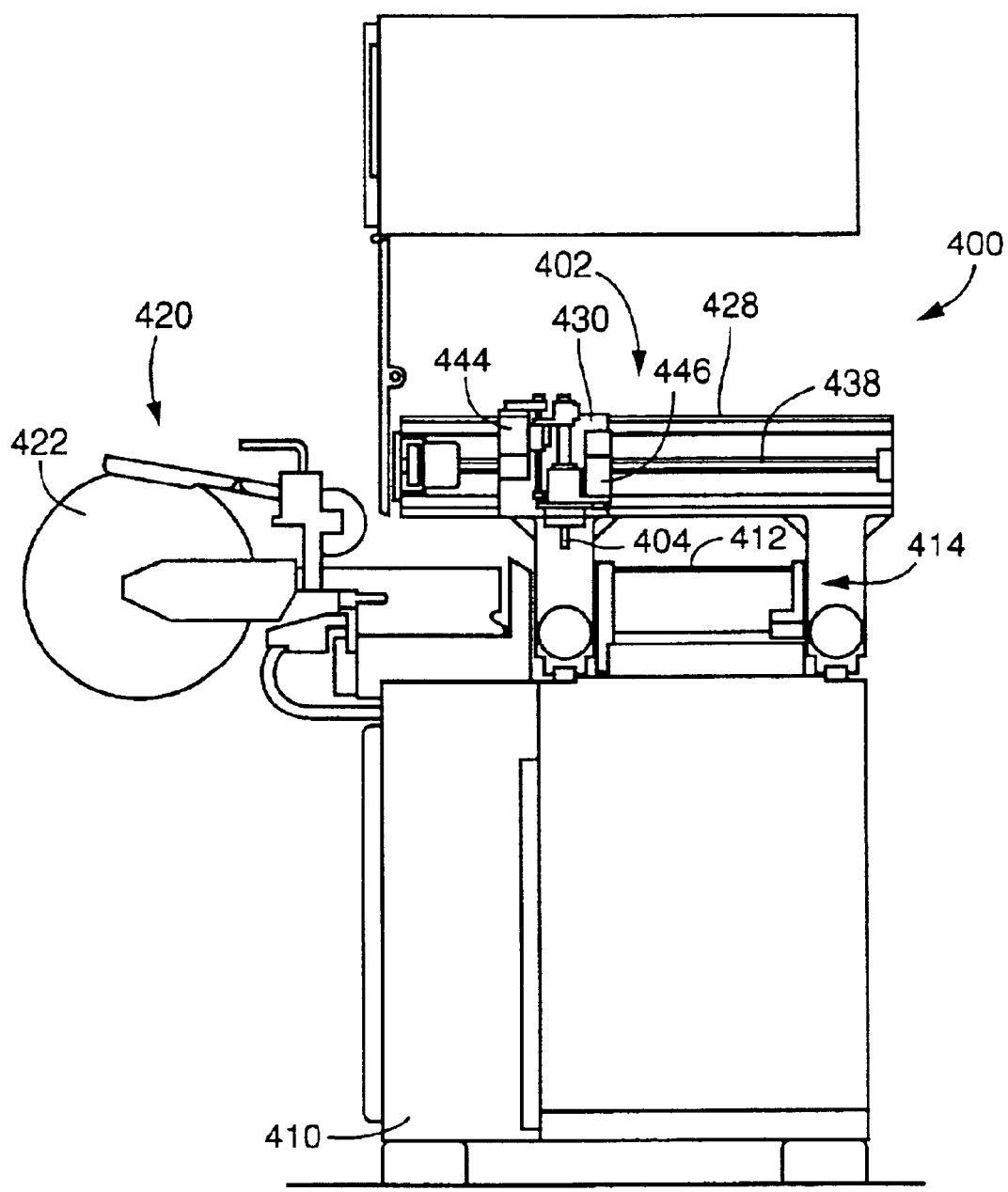
FIG. 24 is a side elevation view of the EC mounting system of FIG. 23.

The EC mounting system 400 includes a base 410, and a PCB conveying device 414 which is provided on the base 410 and which conveys a PCB 412 in the X direction (i.e., in the right-left direction in FIG. 23). The PCB 412 which is conveyed by the PCB conveying device 414 is positioned, and held, at a predetermined position by a PCB holding device (not shown).

The EC mounting system 400 further includes an EC supplying device 420 which is provided on one of opposite end portions of the base 410 that are opposite to each other in the Y direction perpendicular to the X direction in FIG. 23. The EC supplying device 420 includes a plurality of EC supplying units 422 which are provided on a stationary unit-support table (not shown) such that respective EC-supply portions of the EC supplying units 422 are arranged along a straight line parallel to the X direction.

The EC mounting device 402 includes an X-direction slide 428 and a Y-direction slide 430. The X-direction slide 428 is moved in the X direction by an X-direction drive device 436 which includes a nut (not shown) fixed to the X-direction slide 428; a pair of ball screws 432 as a pair of feed screws which are provided on the base 410 and which are threadedly engaged with the nut; and a pair of X-direction-slide moving servomotors 434 which drive or rotate the two ball screws 432, respectively. The Y-direction slide 430 is provided on the X-direction slide 428 such that the Y-direction slide 430 is movable in the Y direction, and is moved in the Y direction by a Y-direction drive device 442 which includes a nut (not shown) fixed to the Y-direction slide 430; a ball screw 438 as a feed screw which is provided on the X-direction slide 428 and which is threadedly engaged with the nut; and a Y-direction-slide moving servomotor 440 which drives or rotates the ball screw 438.

The Y-direction slide 430 supports the EC sucker 404 such that the EC sucker 404 is vertically movable and is rotatable about an axis line thereof; an elevating and lowering device 444 which vertically elevates and lowers the EC sucker 404; a rotating device 446 which rotates the EC sucker 404 and thereby rotates an EC held by the sucker 404 about a center line of the EC; a first CCD camera 448 which takes the image of reference marks provided on the PCB 412; and a second CCD camera (not shown) which takes the image of the EC held by the EC sucker 404. The first CCD camera 448 is oriented in vertically downward direction in which the camera 448 takes images, and cooperates with an image processing device 450 to provide an EC-mounting inspecting device 452. The image processing device 450 is essentially provided by a computer including a RAM and a ROM. The RAM of the computer includes a first image memory, a second image memory, an OK flag, and an NG flag, in addition to a working memory, like the RAM shown in FIG. 10, and the ROM of the computer stores an EC-mounting inspecting routine represented by the flow chart of FIG. 27.

The EC mounting system 400 further includes a control device 460 which controls the EC mounting device 402, the PCB conveying device 414, and the EC supplying device 420, so that the EC mounting device 402 mounts ECs 470 (FIG. 25) on a PCB 412. The image processing device 450 is connected to the control device 460.

Figure 25:
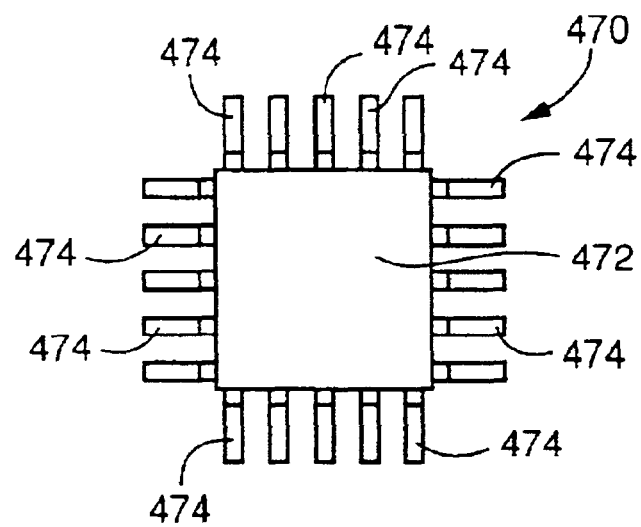
FIG. 25 is a plan view of an EC which is mounted on a PCB by the EC mounting system of FIG. 23.
Figure 26:
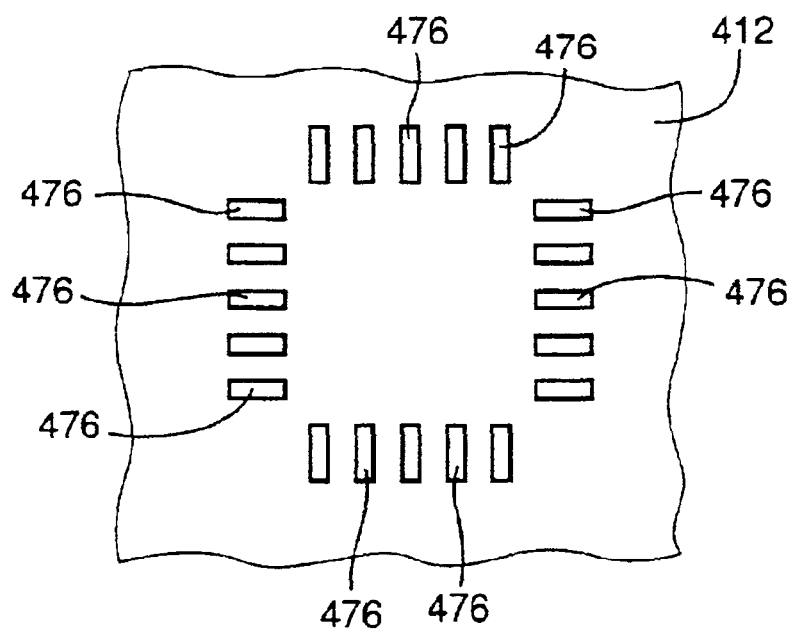
FIG. 26 is a plan view of conductive pads provided on a PCB on which ECs are mounted by the EC mounting system of FIG. 23.

The X-direction and Y-direction slides 428, 430 of the EC mounting device 402 moves the EC sucker 404 to desired positions on a horizontal plane so that the EC sucker 404 takes one EC 470 from one of the EC supplying units 422 and mounts the EC 470 on an EC-mount portion of a PCB 412. FIG. 25 shows a flat-package-type EC 470 which is mounted on a PCB 412 by the EC mounting device 402. The EC 470 includes a square main portion 472 and a plurality of lead wires 474 which extend from the four sides of the main 5 portion 472. FIG. 26 shows a plurality of conductive pads 476 which are to be electrically connected to the lead wires 474 of the EC 470.

Before the EC sucker 404 mounts, on the PCB 412, one EC 470 which has been taken from one EC supplying unit 422, the first CCD camera 448 is moved to a position right above an EC-mount portion of the PCB 412 on which the EC 470 is to be mounted, so that at that position the camera 448 takes an image of the pads 476 and its vicinity. After the camera 448 takes the image, the EC sucker 404 is moved to the position right above the EC-mount portion of the PCB 412, and then is lowered so as to mount the EC 470 on the PCB 412. After the mounting of the EC 470, the CCD camera 448 is moved to the position right above the EC-mount portion of the PCB 412, so as to take an image of the EC 470 mounted on the PCB 412 and its vicinity. Since the CCD camera 448 is oriented vertically downward, it takes the images of the EC 470 and the pads 476 at the position right above the EC-mount portion of the PCB 412. After the camera 448 takes the images, the EC sucker 404 is moved toward the EC supplying device 420 so as to take another EC 470 to be mounted on the PCB 412.

Figure 28:
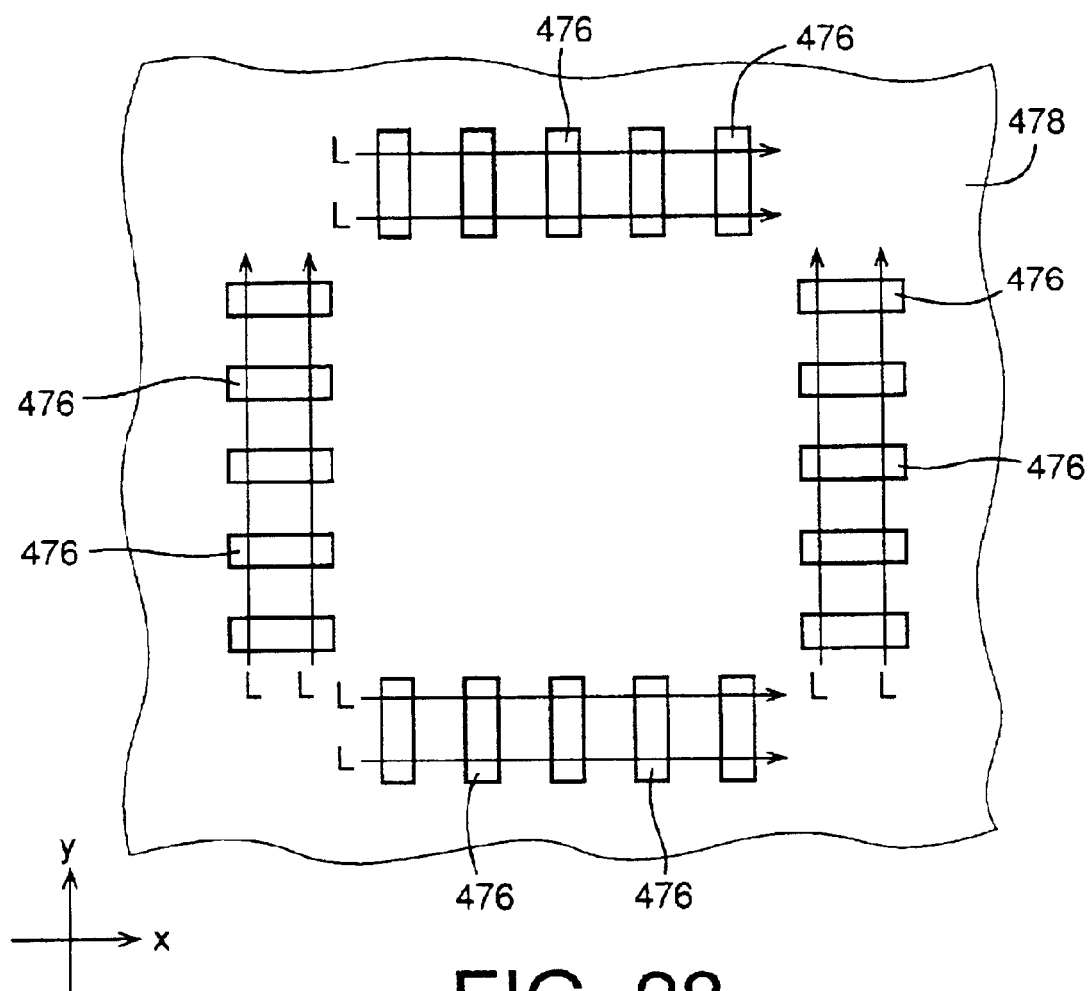
FIG. 28 is a view of images of conductive pads and seek lines employed for determining, according to the routine of FIG. 27, respective positions of the images of the pads on an image-take surface of a CCD camera of the inspecting device.

FIG. 28 shows an image of the pads 476 which is taken immediately before the EC 470 is mounted on the PCB 412, and an image (not shown) taken immediately after the mounting of the EC 470 includes an image of the EC 470 including the lead wires 474. In FIGS. 28 and 29, the same reference numerals 474, 476 as used to designate the lead wires and the conductive pads, respectively, in FIGS. 25 and 26 are used to designate the respective images of the wires and the pads. In FIG. 28, reference numeral 478 designates an image-take surface of the first CCD camera 448.

An input interface of the computer of the image processing device 450 selects, from all the analog signals corresponding to all the picture elements of the image-take surface 478 (i.e., field of view) of the CCD camera 448, the analog signals corresponding to the picture elements of an image-process area, and converts the selected analog signals into sets of digital multilevel image data. That is, sets of digital multilevel image data obtained from the image taken before the mounting of the EC 470 are stored in the first image memory, and sets of digital multilevel image data obtained from the image taken after the mounting of the EC 470 are stored in the second image memory. Each set of digital multilevel image data corresponding to each picture element of the image-process area can indicate one of values from 1 to 256 corresponding to 256 degrees of lightness of an image. The lighter the image is, the greater the set of multilevel image data indicates.

Figure 27:
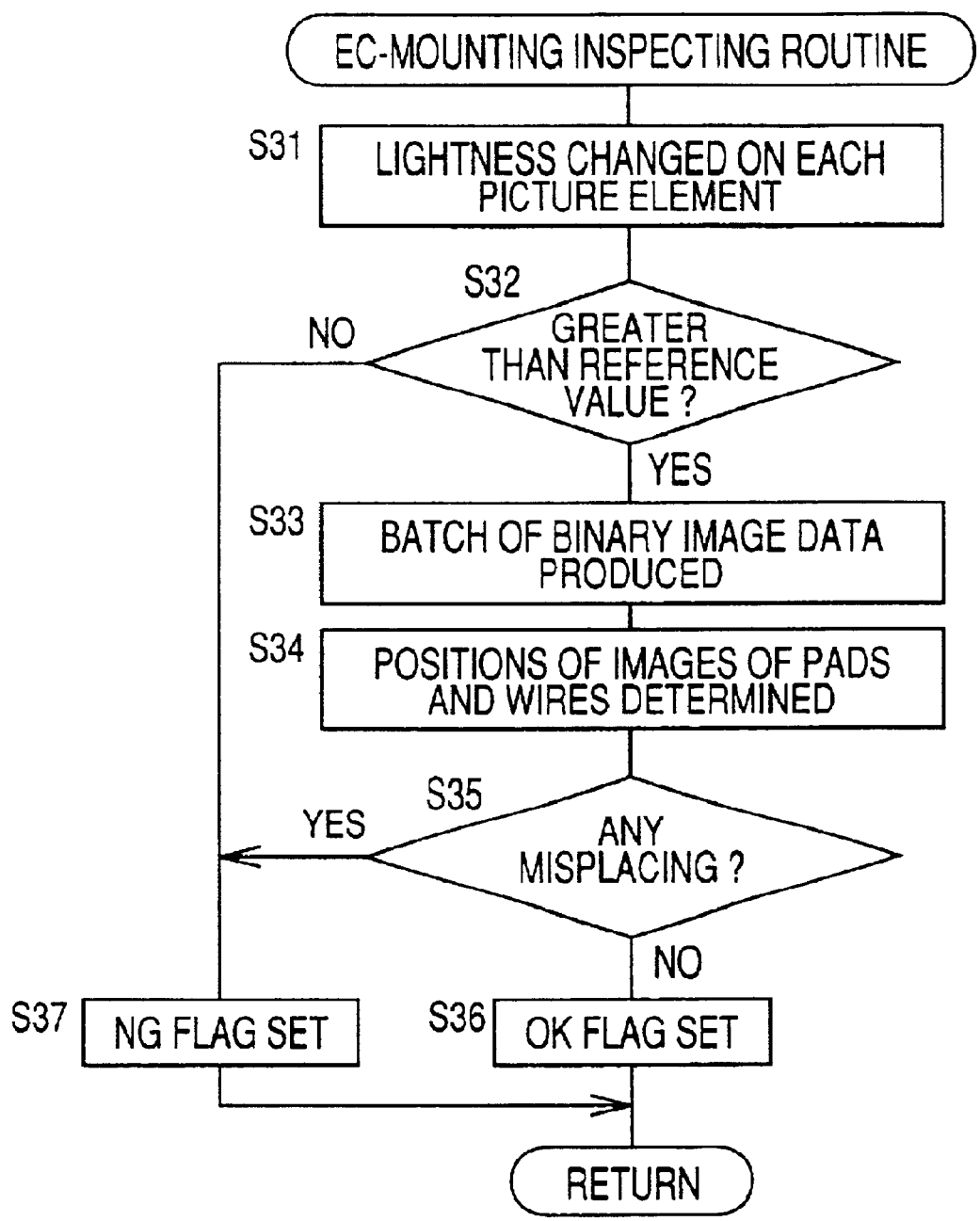
FIG. 27 is a flow chart representing an EC-mounting inspecting routine which is stored in a ROM of a computer of an image processing device as an element of an inspecting device of the EC mounting system of FIG. 23.

Then, the computer of the image processing device 450 judges whether each EC 470 has been safely mounted on the PCB 20, and judges whether the each EC 470 has been accurately mounted on an EC-mount portion of the PCB 412, based on the sets of multilevel image data stored in the first image memory and the sets of multilevel image data stored in the second image memory, according to the EC-mounting inspecting routine of FIG. 27. First, at Step S31, the computer judges whether a multilevel value, i.e., a degree of lightness indicated by a set of multilevel image data corresponding to each of the picture elements of the image-process area and obtained from the image taken after the mounting of the EC 470, has changed from a multilevel value indicated by a set of multilevel image data corresponding to the each picture element and obtained from the image taken before the mounting of the EC 470. More specifically described, the computer subtracts the latter multilevel value from the former multilevel value and, if the absolute value of the thus obtained value is greater than a reference value, it judges that the former multilevel value has changed from the latter multilevel value. That a multilevel value has changed indicates that a degree of lightness of an image formed on a picture element has changed, that is, indicates that a certain change has occurred to the object whose images are taken by the CCD camera 448.

Here it is assumed that the image of the main portion 472 of the EC 470 is the darkest and the sets of multilevel image data corresponding to the picture elements of that image indicate the value of 25 as the 25th degree of lightness, that the sets of multilevel image data corresponding to the picture elements of the image of the PCB 412 indicate the value of 100, and that the sets of multilevel image data corresponding to the picture elements of the images of the lead wires 474 and the conductive pads 476 indicate the value of 220. Therefore, in the case where an EC 470 is mounted on a PCB 412, a multilevel value, i.e., a degree of lightness indicated by a set of multilevel image data corresponding to each of the picture elements of the image of the main portion 472 of the EC 470 taken after the mounting of the EC 470, changes from a multilevel value indicated by a set of multilevel image data corresponding to the each picture element of the image of the main portion 472 taken before the mounting of the EC 470.

After the computer judges, for each of the picture elements of the image-process area, whether a multilevel value, i.e., a degree of lightness has changed, the control of the computer goes to Step S32 to judge whether the ratio of the picture elements for each of which a degree of lightness has changed, to all the picture elements of the image-process area, is greater than a reference value. If a negative judgement is made at Step S32, the computer judges that the EC 470 has not been safely mounted on the PCB 412 and the control thereof goes to Step S37 to set the NG flag. The computer uses this reference value commonly for each of different sorts of ECs 470 having different sizes. That is, the reference value can be used for judging whether the EC 470 having the smallest size has been safely mounted on the PCB 412.

On the other hand, if a positive judgment is made at Step S32, the computer judges that the EC 470 has been safely mounted on the PCB 412 and the control thereof goes to Steps S33 to S35 to judge whether the EC 470 has been accurately mounted on the EC-mount portion of the PCB 412. At Step S33, the computer converts the sets of multilevel image data stored in each of the first and second image memories, into sets of bi-level or binary image data, by comparing a value indicated by each set of multilevel image data, with a threshold value. In the present embodiment, the computer produces, if a value indicated by each set of multilevel image data is greater than the reference value, a set of binary image data indicating the value of "1", and produces, if a value indicated by each set of multilevel image data is not greater than the reference value, a set of binary image data representing the value of "0". This reference value is predetermined so that the computer produces a set of binary image data indicating the value of "1", for each of the picture elements of the images of the wires 474 and the pads 476, and produces a set of binary image data indicating the value of "0", for each of the picture elements of the images of the PCB 412 and the main portion 472.

After a batch of binary image data is produced at Step S33, the control of the computer goes to Step S34 to inspect the respective positions of the images of the conductive pads 476 and the lead wires 474 formed on the x-y coordinate plane provided on the image-take surface 478 of the CCD camera 448. Each EC 470 has the lead wires 474 projecting from the four sides of the main portion 472, and the pads 476 are arranged in two arrays parallel to the X direction and two arrays parallel to the Y direction on the PCB 412. Thus, the images of the wires 474 consist of two arrays parallel to the x direction and two arrays parallel to the y direction, and the images of the pads 476 consist of two arrays parallel to the x direction and two arrays parallel to the y direction, too. As shown in FIG. 28, the computer superposes, on each of the two pad-image arrays parallel to the x direction, two seek lines, L, which are parallel to the x direction and which are distant from each other by a distance shorter than the length of the pads 476 in the y direction, and superposes, on each of the other, two pad-image arrays parallel to the y direction, two seek lines, L, which are parallel to the y direction and which are distant from each other by a distance shorter than the length of the pads 476 in the x direction. Similarly, though not shown, the computer superposes, on each of the two wire-image arrays parallel to the x direction, two seek lines, L, which are parallel to the x direction and which are distant from each other by a distance shorter than the length of the pads 476 in the y direction, and superposes, on each of the other, two wire-image arrays parallel to the y direction, two seek lines, L, which are parallel to the y direction and which are distant from each other by a distance shorter than the length of the pads 476 in the x direction.

Figure 29A:
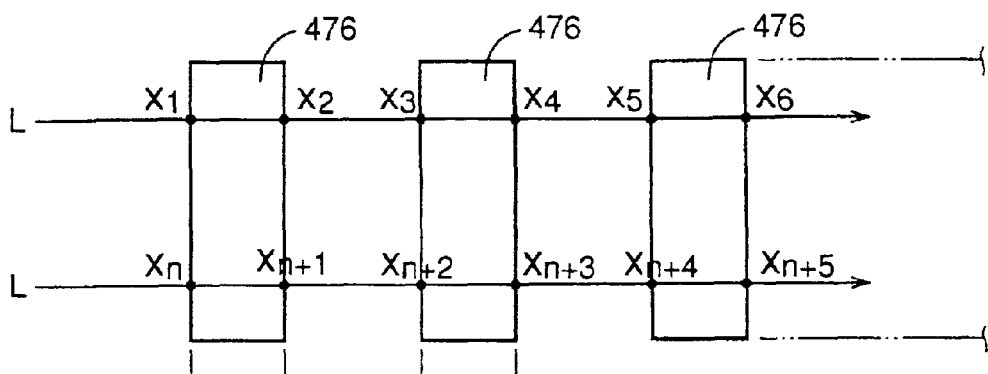
FIGS. 29A to 29D are views for illustrating the manner in which whether an EC has been accurately mounted on a PCB is judged according to the routine of FIG. 27.

Regarding one pad-image array parallel to the x direction, for example, the computer seeks the position of each of the images of the pads 476, on each of the two seek lines L applied to the one pad-image array. More specifically described, first, for each of the picture elements of the images of the pads 476 that have the same y coordinate of the picture elements of one of the two seek lines L parallel to the x direction, the computer judges whether, in an order starting with the picture element having the smallest x coordinate value, a value indicated by a set of binary image data corresponding to the each picture element has changed from that indicated by a set of binary image data corresponding to a picture element having an x coordinate value smaller by one than that of the each picture element. As described above, a set of binary image data indicating the value of 0 is given to a picture element on which no image of the pads 476 is formed, i.e., on which the image of the PCB 412 is formed, and a set of binary image data indicating the value of 1 is given to a picture element on which the image of any pad 476 is formed. Therefore, if the image of the PCB 412 is formed on one of two picture elements adjacent to each other on the one seek line L and the image of any pad 476 is formed on the other picture element, and simultaneously if the x coordinate value of the former picture element is smaller by one than that of the latter picture element, the computer judges for the latter picture element that the value, 1, indicated by the set of binary image data corresponding to the latter picture element has changed from the value, 0, indicated by the set of binary image data corresponding to the former picture element. In the above-indicated case, if the x coordinate value of the latter picture element is smaller by one than that of the former picture element, the computer judges for the former picture element that the value, 0, indicated by the set of binary image data corresponding to the former picture element has changed from the value, 1, indicated by the set of binary image data corresponding to the latter picture element. The above-indicated first change from the value of 0 to the value of 1 indicates the point of starting of the image of one pad 476, and the second change from the value of 1 to the value of 0 indicates the point of ending of the image of the same pad 476 or another pad 476 on the one seek line L. Irrespective of whether the value of 0 may be changed to the value of 1 or the value of 1 may be changed to the value of 0, the computer selects the x coordinate value of only one of each pair of picture elements which are adjacent to each other and which correspond two sets of binary image data one of which indicates the value of 1 and the other of which indicates the value of 0, in such a manner that the computer stores, in the RAM in an order starting with the smallest x coordinate value, the selected x coordinate values of the picture elements that correspond the sets of binary image data each indicating the value of 1. That is, the computer does not store the respective x coordinate values of the picture elements that correspond to the sets of binary image data each indicating the value of 0. Thus, the computer stores the respective x coordinate values of the starting and ending points of each of the images of the pads 476 as seen in the x direction. On the other seek line L, the computer seeks each pair of picture elements which are adjacent to each other and which correspond two sets of binary image data one of which indicates the value of 1 and the other of which indicates the value of 0, and stores, in the RAM in the order starting with the smallest x coordinate value, the respective x coordinate values of the picture elements that correspond the sets of binary image data each indicating the value of 1. For example, regarding one pad-image array parallel to the x direction, the computer obtains, on one seek line L parallel to the x direction, the respective x coordinate values, $x_1, x_2, x_3, x_4, \ldots$, indicative of the respective positions of the pads 476, and obtains, on the other seek line L parallel to the x direction, the respective x coordinate values, $x_{n+1}, x_{n+2}, x_{n+3}, x_{n+4}, \ldots$, indicative of the respective positions of the pads 476, as shown in FIG. 29A.

Figure 29B:
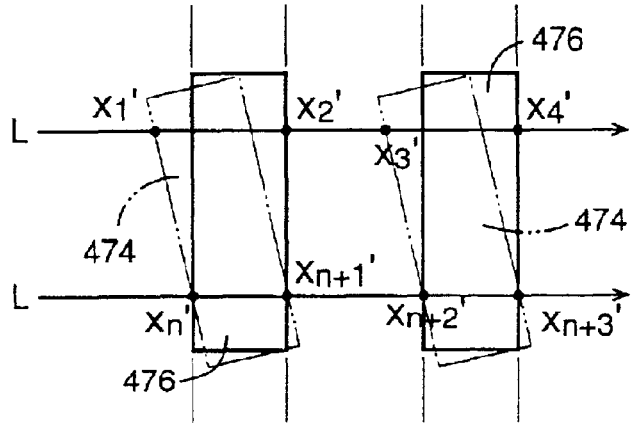

Thus, based on the batch of binary image data obtained from the first image taken immediately before the mounting of each EC 470, the computer determines the positions of the images of the four arrays of conductive pads 476. Then, similarly, based on the batch of binary image data obtained from the second image taken immediately after the mounting of each EC 470, the computer determines the positions of the images of the four arrays of lead wires 474. For example, regarding one of the two arrays of lead wires 474 parallel to the x direction, the computer determines, on one of the two seek lines L, the respective x coordinates, $x_1', x_2', x_3', x_4', \ldots$, of the picture elements where degrees of lightness change and determines, on the other seek line L, the respective x coordinate values, $x_{n+1}', x_{n+2}', x_{n+3}', x_{n+4}', \ldots$, of the picture elements where degrees of lightness change, as shown in FIG. 29B. However, the images of the lead wires 474 may not coincide with those of the corresponding conductive pads 476, and not all the picture elements where degrees of lightness change may indicate the starting and ending points of the images of the lead wires 474.

After the computer determines the positions of the images of all the lead wires 474, the control of the computer goes to Step S35 to judge whether the EC 470 has been accurately mounted on the EC-mount portion of the PCB 412, by judging whether the images of the lead wires 474 accurately coincide with the images of the corresponding pads 476. More specifically described, the computer compares each of the ordered and stored x or y coordinate values obtained from the images of each array of lead wires 474 on each seek line L, with a corresponding one of the ordered and stored x or y coordinate values obtained from the images of a corresponding array of pads 476 on the same seek line L, respectively, in the order of storage of the x or y coordinate values in the RAM, i.e., in the order starting with the smallest x or y coordinate value. If the absolute value of the difference of each pair of coordinate values compared with each other is not greater than a reference value, the computer judges that a corresponding lead wire 474 has been accurately mounted on the EC-mount portion of the PCB 412; but if it is, it judges that the corresponding lead wire 474, and therefore the EC 470 itself, has been mounted out of position relative to the EC-mount portion of the PCB 412.

More specifically described, regarding one array of images of lead wires 474 parallel to the x direction, shown in FIG. 29B, the computer compares each of the x coordinate values $x_1'$, $x_2'$, $x_3'$, $x_4'$, ... obtained on one of the two seek lines L applied to the one array, with a corresponding one of the x coordinate values $x_1$, $x_2$, $x_3$, $x_4$, ... obtained from a corresponding array of images of pads 476 on one of the two seek lines L that has the same y-direction position as that of the above-indicated one seek line L applied to the one array.

Figure 29C:
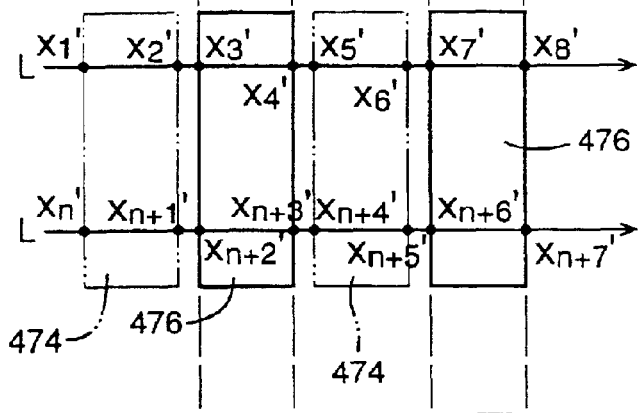
Figure 29D:
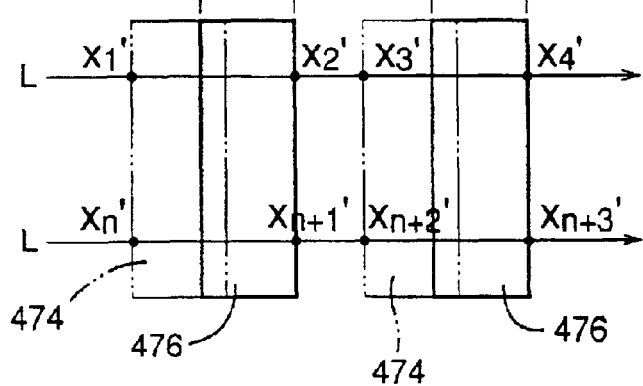

If the EC 470 is mounted out of position relative to the EC-mount portion of the PCB 412, the lead wires 474 may be misplaced relative to the conductive pads 476, in various ways. For example, in the case where the EC 470 mounted on the PCB 412 has a rotation-position error, i.e., an angular error about an axis line, the images of the wires 474 may be inclined relative to the images of the pads 476, as shown in FIG. 29B. In the case where the EC 470 is misplaced in the X direction on the PCB 412, the images of the wires 474 may be alternate with the images of the pads 476, as shown in FIG. 29C, or the images of the wires 474 may partly overlap the images of the pads 476, as shown in FIG. 29D. In each case, for at least one pair of x coordinate values one of which belongs to the x coordinate values obtained from each array of images of the wires 474 and the other of which belongs to the x coordinate values obtained from a corresponding array of images of the pads 476, the computer judges that the absolute value of the difference of the one pair of x coordinate values is greater than the reference value, i.e., that the corresponding lead wire 474 has been misplaced relative to the corresponding pad 476.

If the computer compares the coordinate values obtained from one array of images of lead wires 474 on one of the two seek lines L with the corresponding coordinate values obtained from one array of images of conductive pads 476 on the same seek line L, and judges that all the wires 474 have accurately been mounted on the PCB 412, then the computer compares the coordinate values obtained from the same array of images of wires 474 on the other seek line L with the corresponding coordinate values obtained from the same array of images of 476 on the same, other seek line L. The computer may be modified to determine the respective positions (i.e., coordinate values) of each array of images of wires 474, or each array of images of pads 476, by applying, in place of the two seek lines L, a single seek line L to each of the two arrays. However, the computer can more accurately judge whether the wires 474 have been misplaced relative to the corresponding pads 476, by employing the two seek lines L than the single seek line L. For example, FIG. 29B shows that the absolute values of the differences between the x coordinate values obtained from the images of the pads 476 on one of the two seek lines L and the corresponding x coordinate values obtained from the images of the pads 476 on the same seek line are very small but the absolute values of the differences between the x coordinate values obtained from the images of the pads 476 on the other seek line L and the corresponding x coordinate values obtained from the images of the pads 476 on the same, other seek line are very large. In this case, the computer can judge that the wires 474 have been misplaced relative to the pads 476.

If the computer judges that at least one lead wire 474 has been misplaced relative to the corresponding conductive pad 476, it makes a positive judgment at Step S35. Then, the control of the computer proceeds with Step S37 to set the NG flag. On the other hand, if the computer finds no misplacement of the wires 474 relative to the pads 476, for all the images of wires 474 and all the images of pads 476 on all the eight seek lines L, it makes a negative judgment at Step S35. Then, the control of the computer goes to Step S36 to set the OK flag.

In each of the first to sixth embodiments shown in FIGS. 1 to 22, the CPL emitter 190 or the slit-light emitter 252 is provided outside the locus of revolution of the EC suckers 44, and the CCD camera 194 is provided inside the locus. However, they may be provided vice versa.

In each of the first to sixth embodiments shown in FIGS. 1 to 22, it is assumed that the dimensional errors of the images taken by the CCD camera 194 because of the distance between the camera 194 and an object are very small and can be neglected. However, in the case where those dimensional errors are considerably large and cannot be neglected, or in the case where those dimensional errors cannot be neglected because so high accuracy of mounting of ECs is required, the computer may be modified to compensate for those dimensional errors or changes by correcting, by calculation, the dimensions of the images taken by the camera 194. Alternatively, for example, a telecentric optical system (i.e., lens system) may be employed so that images free from dimensional errors because of distance may be formed on the image-take surface of the CCD camera 194.

In the third embodiment shown in FIGS. 14 to 16, it is assumed that the vertices of the ECs 22 or the pads 240 are not rounded or chipped, i.e., are rectangular and accordingly the positions of the vertices can be determined. However, there are some cases where the vertices of ECs or pads 240 are rounded or chipped. In those cases, the computer may apply, as taught in U.S. Pat. No. 5,754,677, a measure template including a plurality of seek lines L, to the images of an EC and a pad, so as to determine edge points of the EC and the pad and determine, based on the determined edge points, the outline or profile of each of the EC and the pad. In this case, the computer can determine, based on the determined outline of each of the EC and the pad, the positions of the vertices of each of the EC and the pad, and can judge, based on the determined positions, whether the EC has been accurately mounted on the EC-mount portion of the PCB.

In each of the first to sixth embodiments shown in FIGS. 1 to 22, the computer converts the electric signals supplied from the CCD camera 194, into sets of binary image data, and processes the thus obtained sets of binary image data. However, the computer may be modified to convert those electric signals into sets of multilevel (e.g., 256-level) image data, and processes the thus obtained sets of multilevel image data. For example, the computer can use the sets of multilevel image data in judging whether an EC has been safely mounted on an EC-mount portion of a PCB, as explained in the seventh embodiment shown in FIGS. 23 to 29.

In each of the first to sixth embodiments shown in FIGS. 1 to 22, the optical axis of the CPL emitter 190 or the slit-light emitter 252 and the optical axis of the CCD camera 194 are, as seen in the Z direction, parallel to the Y direction, i.e., one of two side surfaces of each EC 22 that are adjacent to each other and are perpendicular to each other. However, those optical axes may be parallel to the X direction, or may be inclined with respect to both the X and Y directions. This is true with all the cases, irrespective of whether the lighting device is provided by the CPL emitter 190, the slit-light emitter 252, or a device which includes a point light source and emits, toward an object, a light radiated from the point light source.

In each of the illustrated embodiments shown in FIGS. 1 to 29, a solder paste is applied to an inner portion of the upper surface of each of the conductive pads 240, 476, and the images of the pads 240, 476 are taken by the CCD camera 194 or 448. However, in some cases, a solder paste is applied to just the entire upper surface of each pad, without overflowing the edge lines of the upper surface. In those cases, the image of the solder paste applied to each pad may be taken as the image of the each pad.

In other cases, the main or base portion of each EC is temporarily fixed to a PCB with an adhesive. In those cases, the images of conductive pads are taken. More specifically described, in those cases, the electrodes or lead wires of the each EC and/or the conductive pads are coated with solder in advance, and no solder paste is applied to the pads. The solder used for the coating does not influence the taken images of the pads. Thus, the images of the pads can be easily taken.

In the seventh embodiment shown in FIGS. 23 to 29, the EC-mounting inspecting device 452 judges whether each EC 470 having lead wires 474 has been safely mounted on a PCB 412, and whether the each EC 470 has accurately mounted on an EC-mount portion of the PCB 412. However, the inspecting device 452 can perform those judging operations on an EC of a type which has no lead wires. In each of the first to sixth embodiments shown in FIGS. 1 to 22, the EC-mounting inspecting device 32, 250 judges whether each EC 22 of a type which has no lead wires has been safely mounted on a PCB 20, and/or whether the each EC 22 has accurately mounted on an EC-mount portion of the PCB 20. However, the inspecting device 320, 250 can perform those judging operations on an EC of a type which has lead wires.

In the seventh embodiment shown in FIGS. 23 to 29, the EC mounting device 402 linearly moves the EC sucker 404. In this embodiment, the EC-mounting inspecting device 452 may employ a lighting device and an image taking device whose optical axes are inclined with respect to a straight line perpendicular to the upper surface of the PCB 412. In this case, the image taking device takes images in the state in which the EC sucker 404 is positioned right above each EC-mount portion of the PCB 412.

In the case where the previously-described movable-member moving device moves the movable member which supports the holder moving device including the rotary members and the rotary-motion applying device, or the different holder moving device including the intermittent-rotation body or the rotatable body and the rotating device, the movable member may additionally support an image taking device. In this case, the image taking device may take images in the state in which it is positioned right above each EC-mount portion of a PCB. Alternatively, the image taking device and a lighting device may be provided such that the respective optical axes thereof are inclined with respect to a straight line perpendicular to the upper surface of a PCB. In the latter case, the image taking device may take images in the inclined direction, in the state in which each EC holder is positioned right above each EC-mount portion of the PCB.

In each of the illustrated embodiments shown in FIGS. 1 to 29, the single lighting device 190, 252 and the single image taking device 194, 448, i.e., a single pair of lighting device and image taking device are employed. The lighting device lights the EC 22, 470 and the PCB 22, 412 in one direction parallel to the Y direction, and the image taking device 194, 448 takes images in one direction parallel to the Y direction. However, it is possible to employ a plurality of pairs of lighting device and image taking device which emit a light and take images in a plurality of directions, e.g., two directions perpendicular to each other. Alternatively, it is possible to employ a single pair of lighting device and image taking device which are movable so that the lighting device and the image taking device may emit a light and take images in a plurality of directions.

It is to be understood that the present invention may be embodied with other changes, improvements, and modifications that may occur to one having skill in the art without departing from the scope and spirit of the invention.

What is claimed is:

1. An electric-component mounting system comprising:
   a circuit-substrate supporting device (28) which supports a circuit substrate (20);
   an electric-component mounting device (24) which mounts a plurality of electric components (22) on the circuit substrate supported by the circuit-substrate supporting device;
   an image taking device (194) which takes, immediately before each of the electric components is mounted on the circuit substrate, a first image of (a) a first portion of the circuit substrate on which said each electric component is to be mounted and (b) a second portion of the circuit substrate that is adjacent to the first portion, the image taking device taking, immediately after said each electric component is mounted on the circuit substrate, a second image of the mounted electric component; and
   a judging device (196) which judges (S21), by comparing the first and second images with each other, whether said each electric component has been mounted on the circuit substrate.

2. The system according to claim 1, further comprising a lighting device (190) which emits a light toward the circuit substrate (20) in a first direction inclined with respect to a straight line perpendicular to a surface of the circuit substrate, wherein the image taking device (194) is oriented toward the circuit substrate such that the image taking device takes the first and second images in a second direction inclined with respect to the straight line.

3. The system according to claim 1, wherein the electric-component mounting device (24) comprises a plurality of component holders (44) which hold respective electric components (22) and which are moved about a common axis line while being sequentially stopped a component mounting position where each of the component holders mounts the electric component held thereby, on the circuit substrate supported by the circuit-substrate supporting device (28), and wherein the circuit-substrate supporting device comprises a circuit-substrate positioning device (66) which positions the first portion of the circuit substrate at a position corresponding to the component mounting position, and wherein the image taking device (194) comprises a stationary image taking device (194) which is provided in vicinity of the component mounting position.

4. The system according to claim 1, wherein the judging device (196) comprises means for judging (S27) whether said each electric component has been accurately mounted on the first portion of the circuit substrate.

5. An electric-component mounting system (10), comprising:
   a circuit-substrate supporting device (28) which supports a circuit substrate (20);
   an electric-component mounting device (24) which mounts a plurality of electric components (22) on the circuit substrate supported by the circuit-substrate supporting device;
   an image taking device (194) which takes, immediately before each of the electric components is mounted on the circuit substrate, a first image of (a) a first portion of the circuit substrate on which said each electric component is to be mounted and (b) a second portion of the circuit substrate that is adjacent to the first portion, the image taking device taking, immediately after said each electric component is mounted on the circuit substrate, a second image of the mounted electric component; and a judging device (196) which judges (S27), by comparing the first and second images with each other, whether said each electric component has been accurately mounted on the first portion of the circuit substrate.

6. The system according to claim 5, wherein the judging device (196) judges (S27) whether a positional error of said each electric component mounted on the first portion of the circuit substrate in at least one of two directions which are parallel to the circuit substrate and are perpendicular to each other, is smaller than a reference value.

7. The system according to claim 5, wherein the judging device (196) judges (S25, S26) whether a positional error of said each electric component mounted on the first portion of the circuit substrate in a direction perpendicular to the circuit substrate, is smaller than a reference value.

8. The system according to claim 5, further comprising a lighting device (190) which emits a light toward the circuit substrate (20) in a first direction inclined with respect to a straight line perpendicular to a surface of the circuit substrate, wherein the image taking device (194) is oriented toward the circuit substrate such that the image taking device takes the first and second images in a second direction inclined with respect to the straight line.

9. The system according to claim 5, wherein the electric-component mounting device (24) comprises a plurality of component holders (44) which hold respective electric components (22) and which are moved about a common axis line while being sequentially stopped at a component mounting position where each of the component holders mounts the electric component held thereby, on the circuit substrate (20) supported by the circuit-substrate supporting device (28), wherein the circuit-substrate supporting device comprises a circuit-substrate positioning device (66) which positions the first portion of the circuit substrate at a position corresponding to the component mounting position, and wherein the image taking device (194) comprises a stationary image taking device (194) which is provided in vicinity of the component mounting position.

* * * * *